United States Patent
Uz et al.

(10) Patent No.: US 11,938,708 B1
(45) Date of Patent: *Mar. 26, 2024

(54) FABRICATION OF HIGH-RESOLUTION GRAPHENE-BASED FLEXIBLE ELECTRONICS VIA POLYMER CASTING

(71) Applicant: Iowa State University Research Foundation, Inc., Ames, IA (US)

(72) Inventors: Metin Uz, Ames, IA (US); Surya Mallapragada, Ames, IA (US)

(73) Assignee: Iowa State University Research Foundation, Inc., Ames, IA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/898,745

(22) Filed: Aug. 30, 2022

Related U.S. Application Data

(60) Division of application No. 16/687,347, filed on Nov. 18, 2019, now Pat. No. 11,465,397, which is a continuation-in-part of application No. 16/547,239, filed on Aug. 21, 2019, now Pat. No. 11,066,296.

(60) Provisional application No. 62/769,387, filed on Nov. 19, 2018, provisional application No. 62/720,693, filed on Aug. 21, 2018.

(51) Int. Cl.
*B32B 37/00* (2006.01)
*H05K 1/02* (2006.01)
*H05K 1/09* (2006.01)
*H05K 3/02* (2006.01)

(52) U.S. Cl.
CPC ......... *B32B 37/025* (2013.01); *H05K 1/0277* (2013.01); *H05K 1/097* (2013.01); *H05K 3/025* (2013.01)

(58) Field of Classification Search
CPC .... B32B 37/025; H05K 1/0277; H05K 1/097; H05K 3/025
See application file for complete search history.

(56) References Cited

U.S. PATENT DOCUMENTS

| | | | |
|---|---|---|---|
| 9,986,638 B2 * | 5/2018 | Jeong | H05K 1/097 |
| 11,066,296 B1 * | 7/2021 | Uz | B81C 99/0025 |
| 11,465,397 B1 * | 10/2022 | Uz | H05K 3/207 |

(Continued)

OTHER PUBLICATIONS

Chen et al., "The selective transfer of patterned graphene", Scientific Reports, vol. 3, 6 pages, Nov. 14, 2013.

(Continued)

*Primary Examiner* — Monica D Harrison
*Assistant Examiner* — Andre C Stevenson
(74) *Attorney, Agent, or Firm* — McKee, Voorhees & Sease, PLC

(57) ABSTRACT

An economical, efficient, and effective formation of a high resolution pattern of conductive material on a variety of films by polymer casting. This allows, for example, quite small-scale patterns with sufficient resolution for such things as effective microelectronics without complex systems or steps and with substantial control over the characteristics of the film. A final end product that includes that high resolution functional pattern on any of a variety of substrates, including flexible, stretchable, porous, biodegradable, and/or biocompatible. This allows, for example, highly beneficial options in design of high resolution conductive patterns for a wide variety of applications.

11 Claims, 48 Drawing Sheets
(33 of 48 Drawing Sheet(s) Filed in Color)

(56) References Cited

U.S. PATENT DOCUMENTS

| | | | |
|---|---|---|---|
| 2006/0139406 | A1 | 6/2006 | Tsuchiya et al. |
| 2007/0097162 | A1 | 5/2007 | Iwashita et al. |
| 2008/0157235 | A1* | 7/2008 | Rogers ............... H01L 29/0657 |
| | | | 257/415 |
| 2009/0008142 | A1* | 1/2009 | Shimizu ............... H05K 1/036 |
| | | | 428/209 |
| 2016/0194759 | A1* | 7/2016 | Kim ...................... H05K 3/181 |
| | | | 174/250 |
| 2016/0366760 | A1 | 12/2016 | Lee et al. |
| 2019/0231267 | A1 | 8/2019 | Oren et al. |
| 2021/0083214 | A1* | 3/2021 | Sakii ...................... C08L 83/08 |

OTHER PUBLICATIONS

Cheng et al., "3D nanostructured inkjet printed graphene via UV-pulsed laser irradiation enables paper-based electronics and electrochemical devices", Nanoscale, vol. 8, No. 35, pp. 15825-16074, Sep. 21, 2016.

Choi, Jae-Young, "A stamp for all substrates", Nature Nanotechnology, vol. 8, pp. 311-312, May 2013.

Choi et al., "Roll-to-roll continuous patterning and transfer of graphene via dispersive adhesion", Nanoscale, vol. 7, pp. 7138-7142 Mar. 10, 2015.

Dong et al., "Transfer-free, lithography-free, and micrometer-precision patterning of CVD graphene on SiO2 toward all-carbon electronics", APL Materials, vol. 6, 9 pages, 2018.

Jung et al., "High-performance green flexible electronics based on biodegradable cellulose nanofibril paper", Nature Communications, 11 pages, May 26, 2015.

Najafabadi, Alireza Hassani, "Biodegradable nanofibrous polymeric substrates for generating elastic and flexible electronics", Adv. Mater., vol. 26(33), pp. 5823-5830, Sep. 3, 2014.

Tang et al., "Printable metal-polymer conductors for highly stretchable bio-devices", iScience, vol. 4, 27 pages, Jun. 29, 2018.

Oren et al., "High-resolution patterning and transferring of graphene-based nanomaterials onto tape toward roll-to-roll production of tape-based wearable sensors", Adv. Mater. Technol., vol. 2, 14 pages, 2017.

Uz et al., "Fabrication of high-resolution graphene-based flexible electronics via polymer casting", Scientific Reports, vol. 9, 11 pages, Jul. 8, 2019.

Yong et al., "Rapid stencil mask fabrication enabled one-step polymer-free graphene patterning and direct transfer for flexible graphene devices", Scientific Reports, vol. 6, 8 pages, Apr. 27, 2016.

\* cited by examiner

Figure 9A:
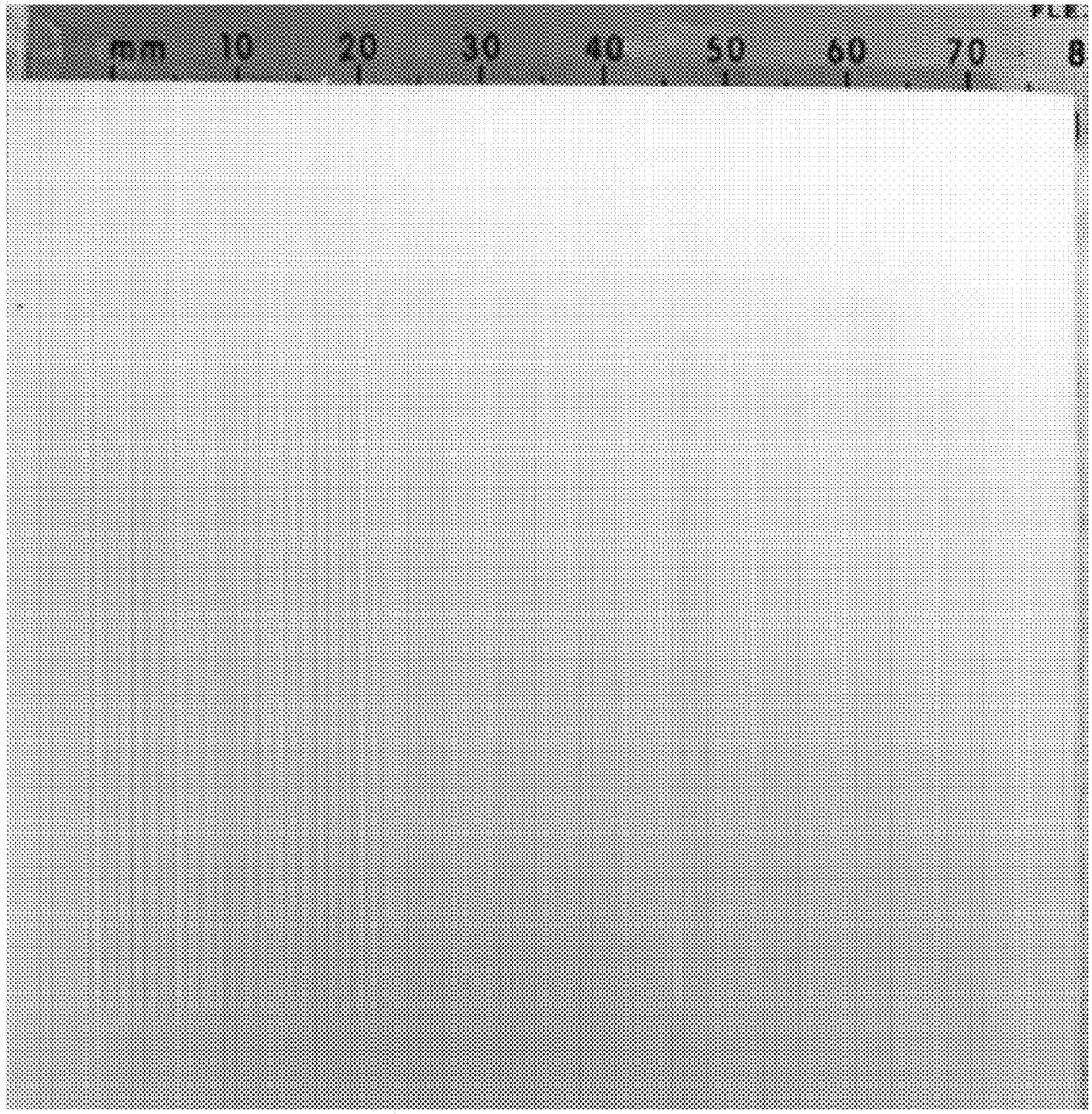
Figure 9B:
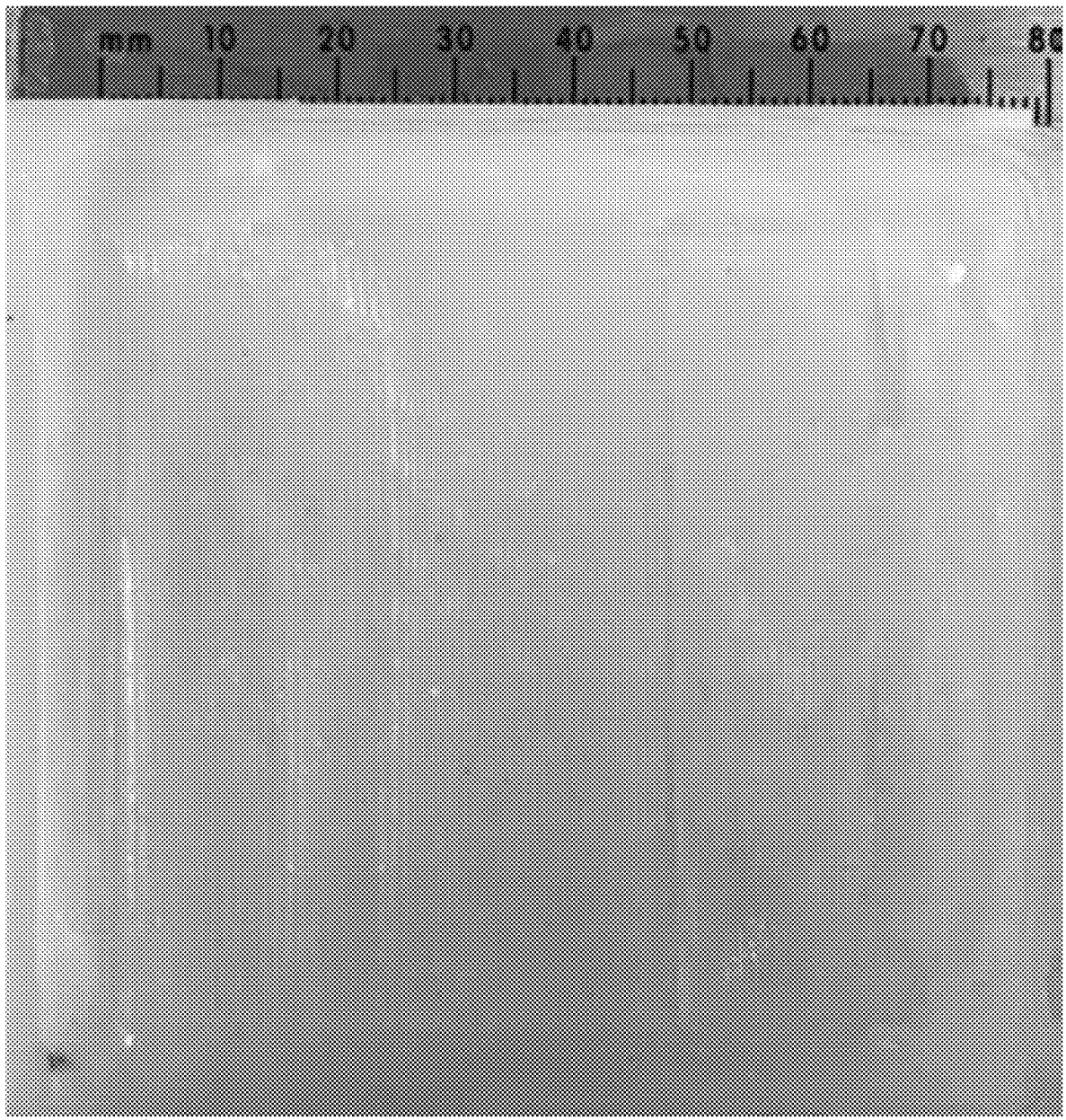
Figure 9C:
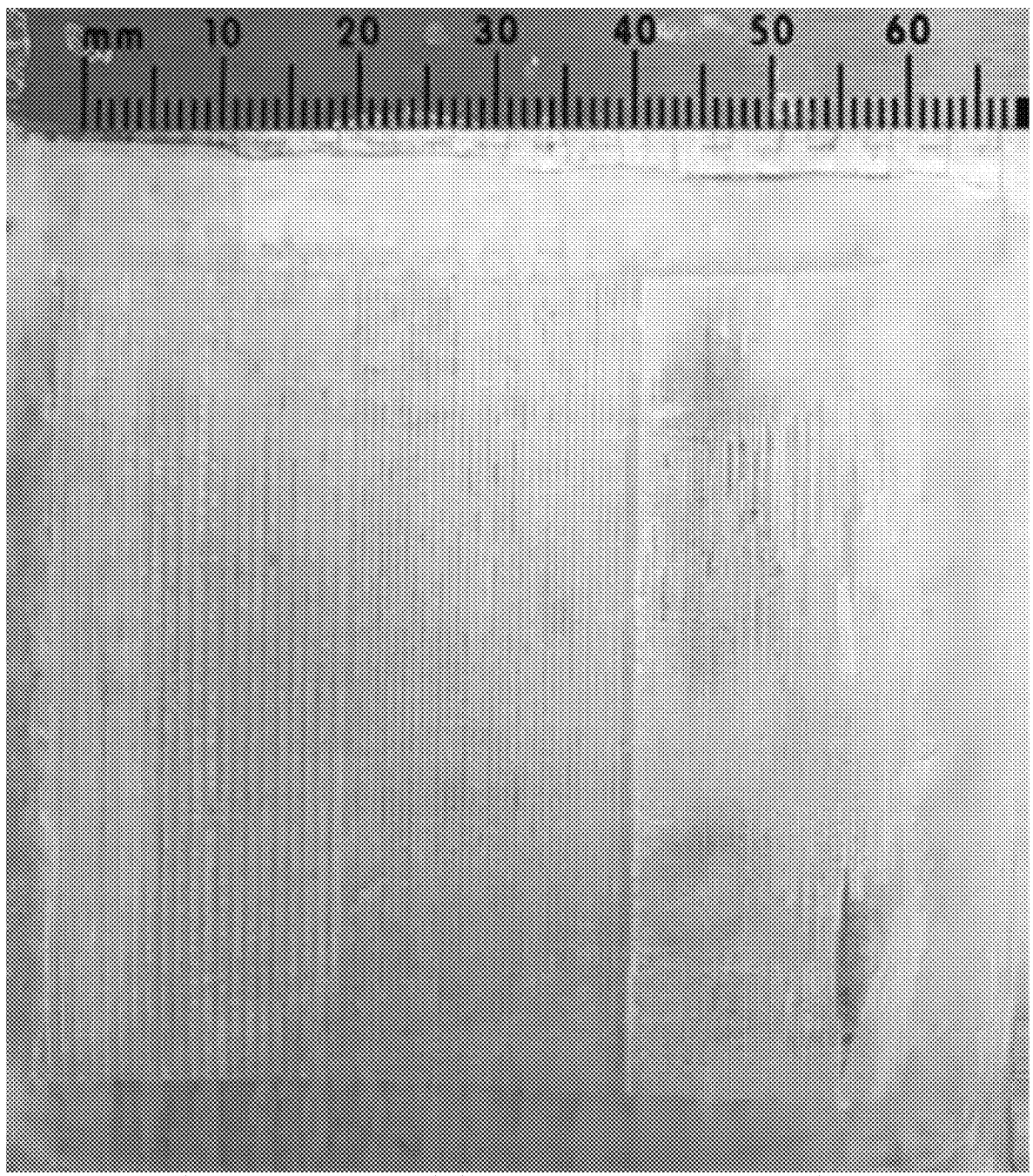

PLLA films with graphene patterns (patterns same as Figs. 9a-9c (but after application of graphene), only magnification is different)

Casting of Polymer solution on Teflon with graphene patterns and peeling off the film (at time of casting the cast polymer solution is transparent, which is reason can see underlying channels and graphene from this view)

Teflon patterns after film formation and peeling

Transfer of graphene pattern from ink-jet printed graphene electrode on polyimide to cellulose acetate film after solvent casting
(the polyimide is the yellow film that has inkjet printed graphene and is being peeled off, and the cellulose acetate film is the clear that has the transferred graphene circuit)
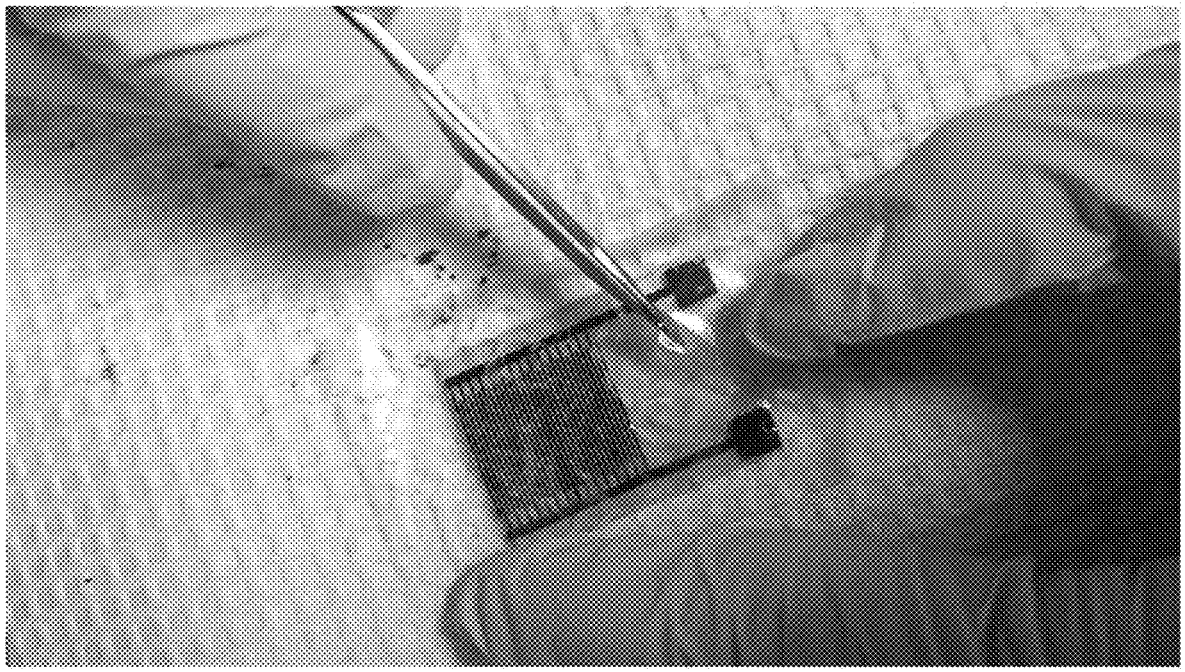
FIGURE 10d (Movie frame at time T1)

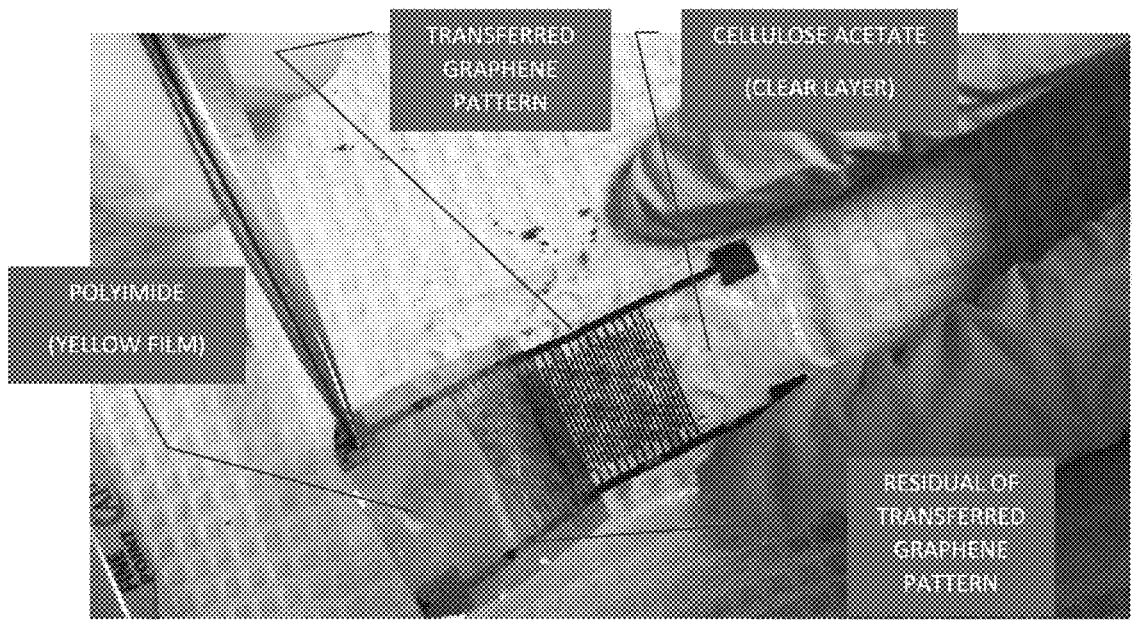
FIGURE 10e (Movie frame at time T2)
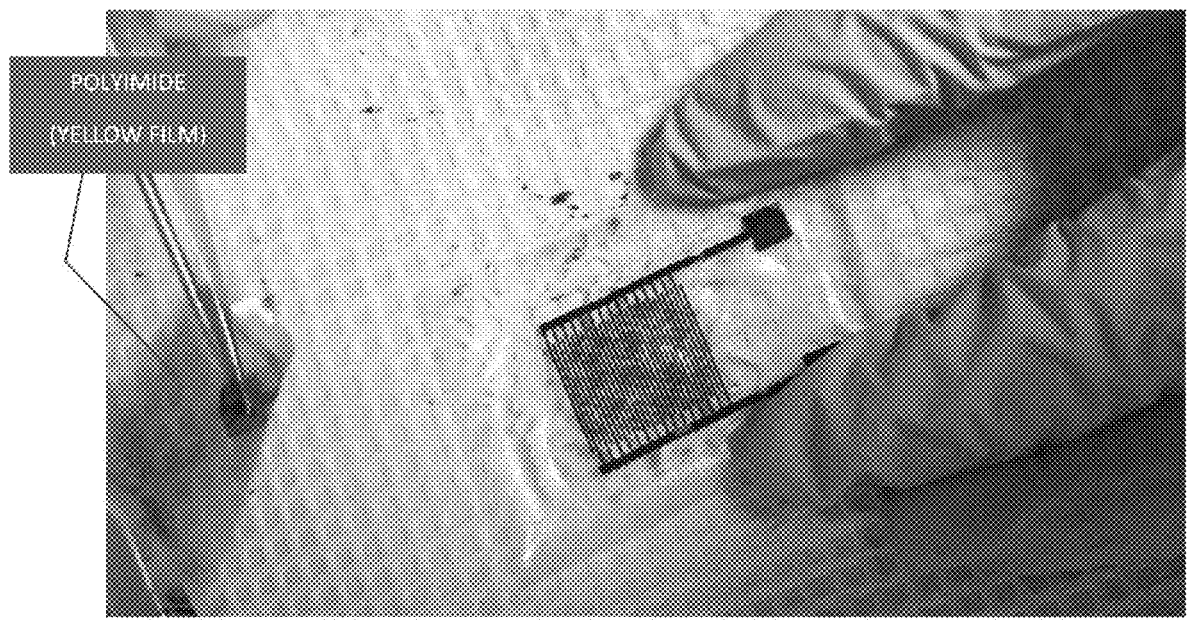
FIGURE 10f (Movie frame at time T3)

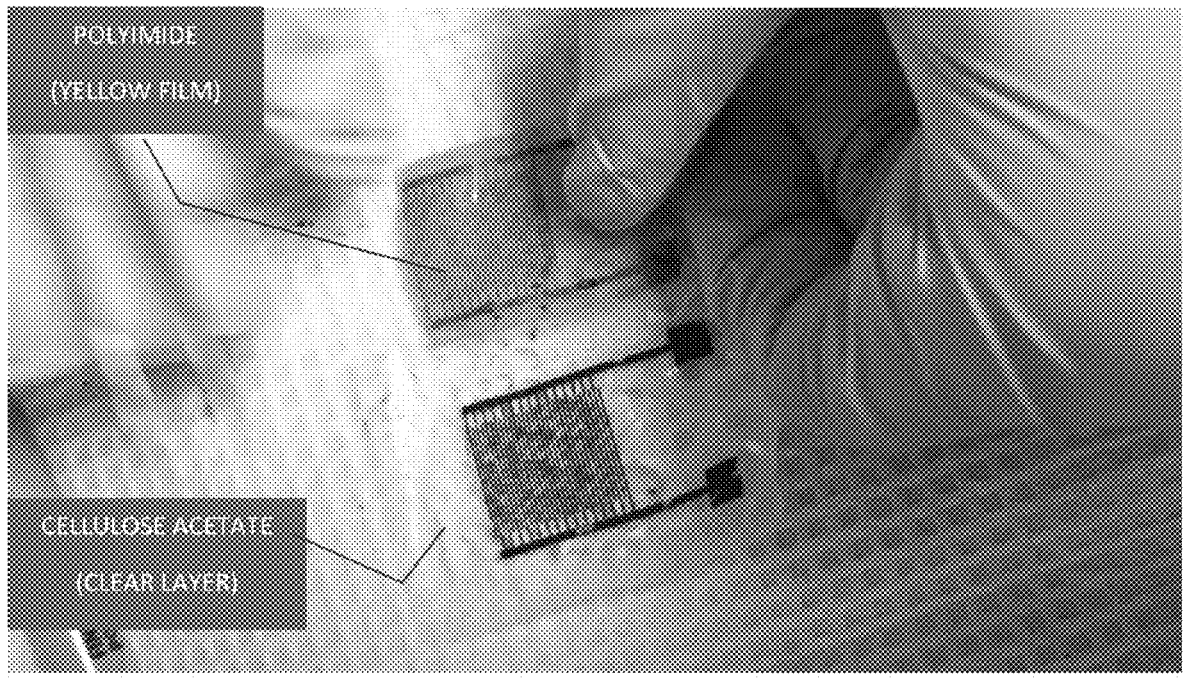
FIGURE 10g (Movie frame at time T4)
(Note: quite of bit of graphene remains on yellow film; transfer efficiency is around 80% for certain embodiments)
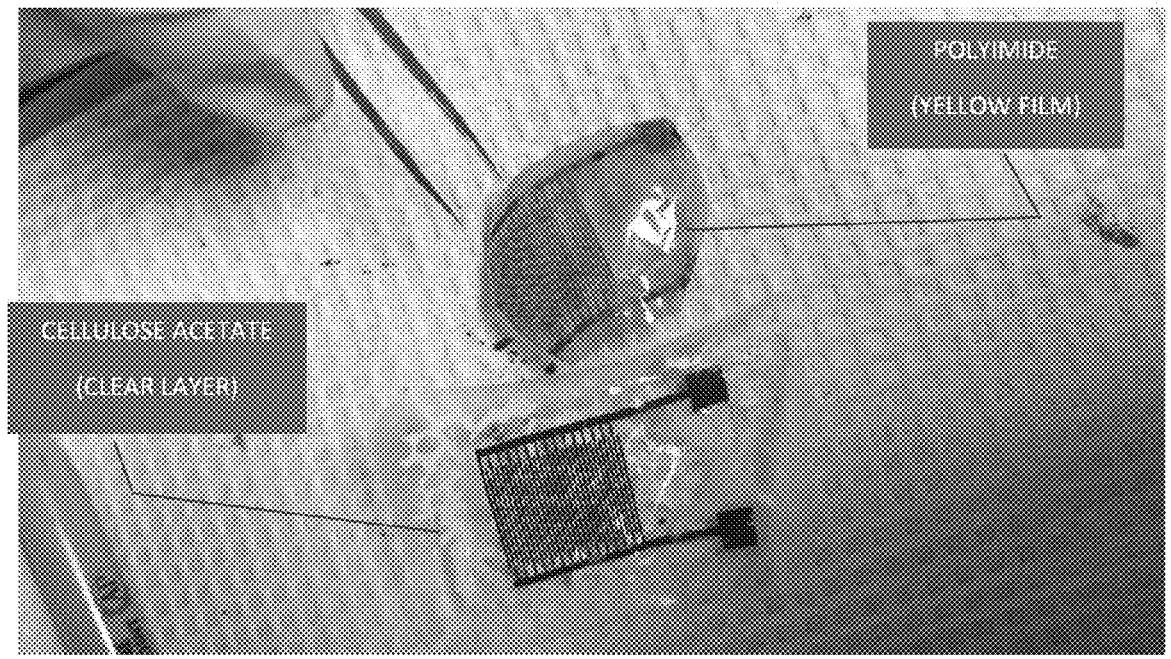
FIGURE 10h (Movie frame at time T5)

Circuit built using graphene patterns transferred on PLLA film to light a LED bulb

FABRICATION OF HIGH-RESOLUTION GRAPHENE-BASED FLEXIBLE ELECTRONICS VIA POLYMER CASTING

CROSS-REFERENCE TO RELATED APPLICATIONS

This application is a Divisional of U.S. Ser. No. 16/687,347, filed Nov. 18, 2019, which claims the benefit of Provisional Application U.S. Ser. No. 62/769,387, filed on Nov. 19, 2018, herein incorporated by reference in their entireties. This application also claims the benefit of U.S. Ser. No. 16/547,239 filed Aug. 21, 2019, now U.S. Pat. No. 11,066,296, issued Jul. 20, 2021, which claims the benefit of U.S. Ser. No. 62/720,693, filed Aug. 21, 2018, both of which are incorporated by reference herein in their entireties.

I. BACKGROUND OF THE INVENTION

A. Field of the Invention

This invention relates to fabrication of high-resolution flexible electronics and, in particular, to methods and systems to fabricate polymer-based 3D microstructured, flexible films with conductive-material-based micro-electronic circuits, including but not limited to fabrication on flexible substrates such as biodegradable polymer substrates and others.

B. Problems in the State of the Art

The field of flexible and stretchable electronics has garnered increasing interest due to versatility for unique on-body applications including but not limited to portable energy-harvesting devices, electronic skin, wearable electronic devices, and sensors[1]. [superscripted numbers are to the bibliography associated with specific example 1 of the invention infra]. Graphene has recently received a lot of interest as a promising conductive material for flexible electronics device fabrication due to its exceptional electrical, optical and mechanical properties[2-4]. Graphene has been used in combination with various flexible polymer substrates (e.g., polyethylene terephthalate (PET), polyimide (PI), and polydimethylsiloxane (PDMS))[5-10] as well as other non-conventional substrates (e.g., paper, tape, and cloth)[11-14] through different fabrication processes for the development of next-generation flexible electronics[15-21]. The flexible nature of these substrates enables protection of graphene electrodes from various deformations, and facilitates their installation onto irregular, curvilinear surfaces[4,22].

Conventional methods such as chemical vapor deposition (CVD) can fabricate low-cost and large-scale graphene films on metal substrates at high growth temperatures (300-1000° C.), and the graphene is subsequently transferred to the substrate of interest[23-27]. Polymer-based transfer methods, that serve as an intermediate step between the metal substrate and the final target substrate for the graphene, involve mostly poly(methyl meth-acrylate) (PMMA) and polydimethylsiloxane (PDMS) along with others such as PET, PI and polyvinyl alcohol (PVA), due to their surface energy and adhesion forces between polymer/graphene and polymer/target substrate interfaces[23,28]. A major challenge for polymer-assisted graphene transfer is protecting the graphene integrity and preventing the mechanical deformation and destruction during transfer. Moreover, polymer-assisted graphene transfer requires substantial processing, such as stamping, plasma etching, chemical etching, washing, and high temperature baking[28]. Despite the optimization and enhancements in transfer processes[28], there are still concerns regarding the remaining residues after the transfer, deteriorating the electronic properties of graphene[23]. Other than polymers, thermal release tape (TRT)-based graphene transfer has also been used for the roll-to-roll (R2R) technique; however, this method requires applied pressure, etching and high temperatures (~100° C.) to separate the tape from the graphene[23,28].

Graphene-based flexible electronics can also be fabricated through various printing techniques such as inkjet printing, gravure printing, screen printing, and offset printing, providing high throughput large-scale production with low raw material consumption and reduced cost[29,30]. However, these techniques typically require additional postprocessing, particularly high temperature sintering, which limits the substrate selection to thermally sensitive substrates, such as poly(ethylene naphthalate) (PEN), PI or PET possessing relatively low glass transition temperatures[29,30]. Graphene transfer after printing may be required for some cases, where mostly polymer-assisted transfer processes described earlier are used[29].

Transfer of graphene via sticky/adhesive tape peeling[31,32], transfer printing[33], or micro transfer molding[34] are other potential fabrication methods. Graphene transfer via patterned sticky/adhesive tape peeling has difficulties in controlling the graphene feature size and resolution[32]. Although recent studies demonstrated certain improvements in patterned graphene transfer via "Stick-and-Transfer" process, this method still requires use of high graphene amounts to coat PDMS negative pattern features, additional tape peeling for surface cleaning, and is only valid for adhesive tapes, limiting the use of polymer based substrates[22]. Transfer printing provides high-resolution patterning of graphene through transferring of graphene patterns from a patterned template or mold to a receiving substrate[33,35,36]. However, it requires etching, PDMS stamping and removal[37-39], or DMSO-based surface energy modification of PDMS molds[40]. In micro transfer molding, the patterned surface of a stamp is placed on the target substrate and the channels are filled with conductive graphene solution through capillary action. This process then requires vacuum drying and removing the stamp from the final substrate[34,41].

In summary, it is difficult to conduct the entire graphene-based flexible electronic device fabrication procedures such as CVD, printing and lithography, directly on the target flexible substrate due to the requirements of harsh chemical, physical or thermal treatments that can significantly deform the target polymeric substrates, particularly natural or synthetic biodegradable polymers possessing low thermal stability[42-4]. This situation not only limits the target substrate material selection but also the potential application areas, especially in the healthcare and biomedical fields[43,45]. Because of this, most polymer-based transfer methods are an intermediate step between the donor and receiver substrates and use sacrificial polymer carrier layers mostly limited by PMMA or PDMS stamping[46-48], etching[48,49], hot lamination/delamination[38,49,50], or electrochemical bubbling[51] to transfer the graphene patterns to the target substrate. Recent studies have demonstrated direct transfer of graphene on PET substrate based on selective dewetting; however, this method requires UV curable adhesive[35,52]. Similarly, CVD grown graphene was also transferred to PVA through drop casting and lamination[53] and to PDMS surface via drop casting and peeling approach with low transfer efficiency[54]. There are some other studies reporting the direct transfer of conductive silver using polymer casting[55]; however, transfer of graphene via simple polymer casting directly to the target polymeric substrate could be an alternative, simple, fast, green and cost-effective approach allowing the use of variety of flexible substrate materials and eliminating the aforementioned processing steps.

Therefore, most of state-of-the-art graphene-based flexible electronics device production methods are complex, require multiple steps and are not cost and time effective. For instance, multiple steps such as film deposition, lithography, and etching are used for photolithography-based microfabrication. Laser printing of graphene is promising but requires expensive and sophisticated lasers and the pattern size is limited. The alternative ink jet printing of graphene has poor resolution and needs additional post treatments, such as thermal or laser annealing, to improve electrical conductivity. Other pattern transfer methods require special care and functional materials. For example, the transfer printing needs stamping process, which requires multiple plasma treatment and etching steps; whereas, micro transfer molding methods require sequential pattern stamping and filling followed by vacuum drying and stamp removal. In addition, the mentioned transferring, stamping, printing and post-printing processing steps can thermally, chemically or physically degrade or damage most of the biodegradable polymer-based flexible substrates, limiting the flexible substrate material selection and increasing the problem of mounting electronic waste. Therefore, despite the significant progress in the field, there is still a need for an alternative, simple, fast, green, scalable and cost-effective graphene patterning method to fabricate high resolution, biodegradable flexible electronics devices.

Examples of some of the techniques used by others are set forth in the publications listed below, which are each incorporated by reference herein. Some of these references provide background information or details about other fabrication processes in the literature.

Das, S. R.; Nian, Q.; Cargill, A. A.; Hondred, J. A.; Ding, S.; Saei, M.; Cheng, G. J.; Claussen, J.C., 3D nanostructured inkjet printed graphene via UV-pulsed laser irradiation enables paper-based electronics and electrochemical devices. Nanoscale 2016, 8 (35), 15870-15879.

Oren, S.; Ceylan, H.; Schnable Patrick, S.; Dong, L., High-Resolution Patterning and Transferring of Graphene Based Nanomaterials onto Tape toward Roll-to-Roll Production of Tape-Based Wearable Sensors. Advanced Materials Technologies 2017, 2 (12), 1700223.

Jung, Y. H.; Chang, T.-H.; Zhang, H.; Yao, C.; Zheng, Q.; Yang, V. W.; Mi, H.; Kim, M.; Cho, S. J.; Park, D.-W.; Jiang, H.; Lee, J.; Qiu, Y.; Zhou, W.; Cai, Z.; Gong, S.; Ma, Z., High-performance green flexible electronics based on biodegradable cellulose nanofibril paper. Nature Communications 2015, 6, 7170.

Najafabadi Alireza, H.; Tamayol, A.; Annabi, N.; Ochoa, M.; Mostafalu, P.; Akbari, M.; Nikkhah, M.; Rahimi, R.; Dokmeci Mehmet, R.; Sonkusale, S.; Ziaie, B.; Khademhosseini, A., Biodegradable Nanofibrous Polymeric Substrates for Generating Elastic and Flexible Electronics. Advanced Materials 2014, 26 (33), 5823-5830.

Yibo Dong, Yiyang Xie1, Chen Xu1,a), Xuejian Li1, Jun Deng1, Xing Fan1, Guanzhong Pan1, Qiuhua Wang1, Fangzhu Xiong1, Yafei Fu1, and Jie Sun1,2,b) Transfer-free, lithography-free, and micrometer-precision patterning of CVD graphene on SiO$_2$ toward all-carbon electronics; APL Materials 6, 026802 (2018); https://doi.org/10.1063/1.4992077.

Xu-Dong Chen, Zhi-Bo Liu, Wen-Shuai Jiang, Xiao-Qing Yan, Fei Xing, Peng Wang, Yongsheng Chen & JianGuo Tian; The selective transfer of patterned graphene; Scientific Reports volume 3, Article number: 3216 (2013).

Keong Yong, Ali Ashraf, Pilgyu Kang & SungWoo Nam; Rapid Stencil Mask Fabrication Enabled One-Step Polymer-Free Graphene Patterning and Direct Transfer for Flexible Graphene Devices; Scientific Reports volume 6, Article number: 24890 (2016).

Taejun Choi, ab Sang Jin Kim, a Subeom Park, a Taek Yong Hwang, b Youngro Jeonb and Byung Hee Hong; Roll-to-roll continuous patterning and transfer of graphene via dispersive adhesion; Nanoscale 16, 2015.

Jae-Young Choi; Graphene transfer: A stamp for all substrates, Nature Nanotechnology volume 8, pages 311-312 (2013).

Tang et al., Printable Metal-Polymer Conductors for Highly Stretchable Bio-Devices iScience 4, 302-311, Jun. 29, 2018.

II. SUMMARY OF THE INVENTION

In one aspect of the invention, we propose a facile and versatile graphene transfer method at room temperature based on simple polymer casting that does not require thermal processing, etching, stamping or UV treatment. This process is simply based on the differences in the surface energies and adhesive forces between the graphene/mold and graphene/target polymer substrate created during the polymeric film formation[23,28]. With this approach, we are able to fabricate high-resolution, small feature sized (as small as 5 μm; 15 μm width and 5 μm depth) conductive graphene patterns/circuits (sheet resistance of ~0.21Ω/sq without the need for post-deposition annealing) on various flexible polymeric substrates. Briefly, our method consists of two main steps; (i) the formation of graphene patterns/films on substrates/molds via conventional methods such as CVD, channel filling or ink jet printing and (ii) direct casting of target substrate polymer solution on the graphene patterned substrates/molds and direct transfer of graphene patterns to the target substrate via peeling off upon drying and film formation. This makes our method versatile allowing the use of different polymers including natural/synthetic, biodegradable/non-biodegradable polymers (such as Poly-L-Lactic Acid (PLLA), Cellulose Acetate (CA), Gelatin (GEL), Poly Lactic-co-Glycolic Acid (PLGA) or Whey Protein Isolate (WPI)) with well-defined characteristics and provides precise control of 3D microstructural and mechanical properties (such as film porosity, pore size, elasticity etc.) of the target substrate material with high resolution graphene patterns (feature dimensions of ~5 μm width/depth). This process also enables graphene-based circuit design on biodegradable polymeric films which is not possible with chemically or thermally degrading, lithographic patterning techniques. Our method also requires the use of lithography only for the preparation of molds with high resolution and small feature sized patterns; however, it needs to be done only once. On a broader scale, the use of this new room-temperature facile method to fabricate biodegradable, biocompatible, flexible, and electrically-conductive graphene circuits could pave the way for various applications including tissue engineering, robotics, implantable heart sensors, brain-computer interfaces, or low-cost wearable sensors[56-58].

A. Objects, Features, and Advantages of the Invention

Objects, features, and advantages of the invention include methods, systems, and apparatus which improve over or solve problems or deficiencies in the state of the art.

Other objects, features and advantages include methods, systems, or apparatus that are:
a. simple;
b. fast;
c. environmentally friendly;
d. scalable;
e. cost-effective;
f. produce high resolution circuits;
g. can be implemented on biodegradable and/or flexible films;
h. can be implemented in a variety of electronics;
i. can be implemented with a variety of conductive materials, graphene, carbon nanotube, cvd graphene etc.
j. can be implemented in micro environments for material-cell interfaces;
k. can be implemented for surgical implantation;
l. can be implemented in microfluidic devices and applications.
m. can control the microstructure of polymer film with microcircuits.

These and other objects, features, and advantages of the invention will become apparent with reference to the accompanying specification.

B. Aspects of the Invention

In one aspect of the invention, a method of fabricating high resolution and small feature size conductive-material-based micropatterns effectively adhered to a polymeric thin film utilizes direct polymer casting. In one example, the conductive material is graphene-based. The method presents the conductive material on a first or starting substrate. A target polymeric solution is directly cast over the first substrate to cover and contact the conductive material at an interface. The target polymeric solution is formed into the target polymeric film in situ in a fashion that promotes adhesion between the target polymeric film and the conductive material. The target polymeric film is removed from the starting substrate with the adhered conductive material to effectively transfer the conductive material from the starting substrate to the target polymeric film. The conductive material can be patterned, deposited, or grown on the starting substrate, which can be rigid or flexible. The target polymeric film can have engineering characteristics or properties based on pre-selection of the components of the target polymeric solution. Non-limiting examples are elasticity, porosity, pore size, and electroactivity. If the conductive material is patterned, it can be controlled to high resolution with 3D features as small as on the order of approximately 5 μm. This method allows effectively transfer of high resolution patterns without substantial deformation or destruction onto a variety of target polymeric films, including those that are flexible or stretchable without substantial post-processing.

In another aspect of the invention, a system for fabrication of final end products by the above-method includes subsystems to accomplish each step in scalable and mass production fashion.

In another aspect of the invention, an end product made by the method or systems described above can be used in a wide variety of applications.

III. BRIEF DESCRIPTION OF THE DRAWINGS

Figure 1A:
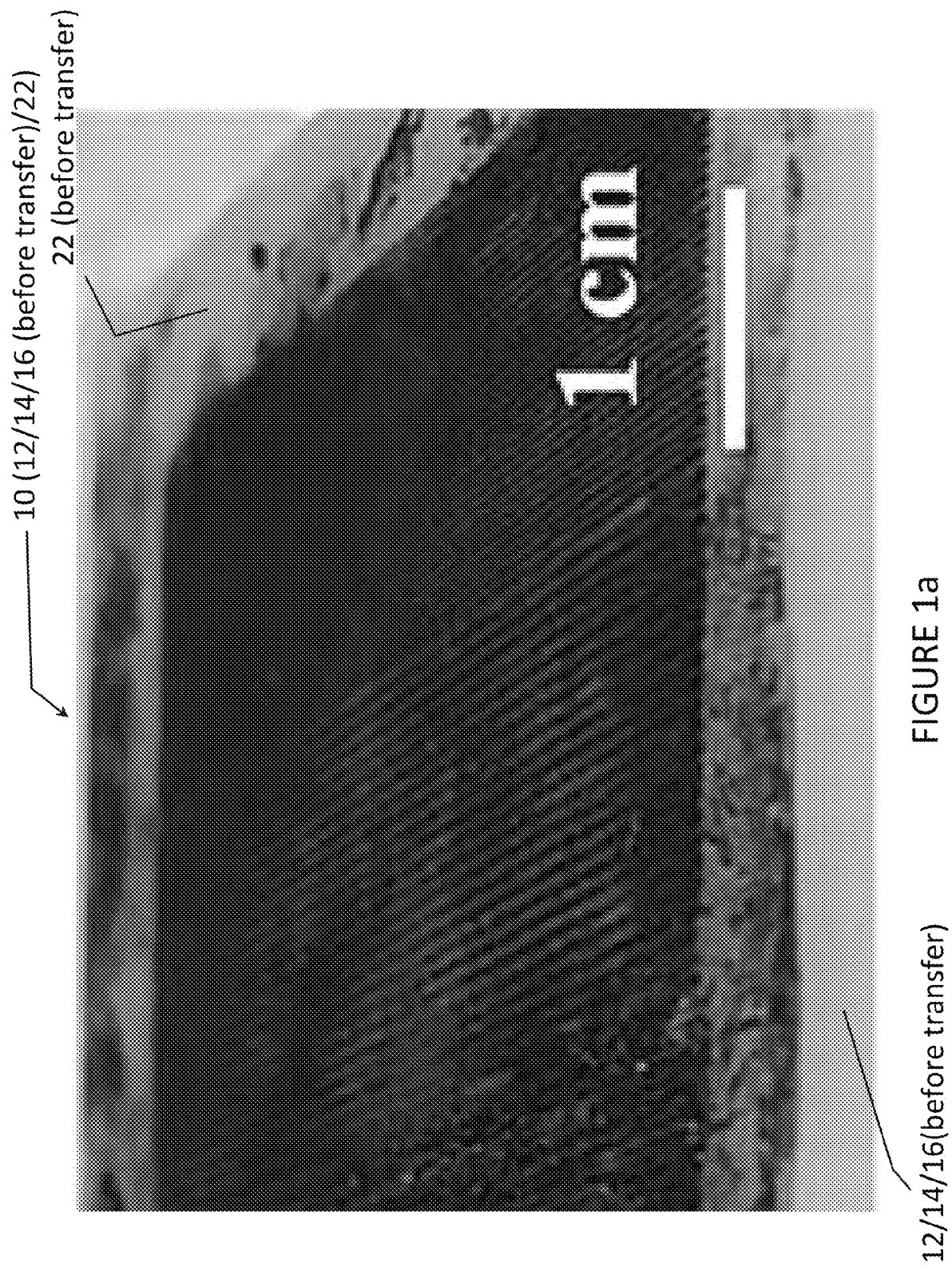
Figure 1B:
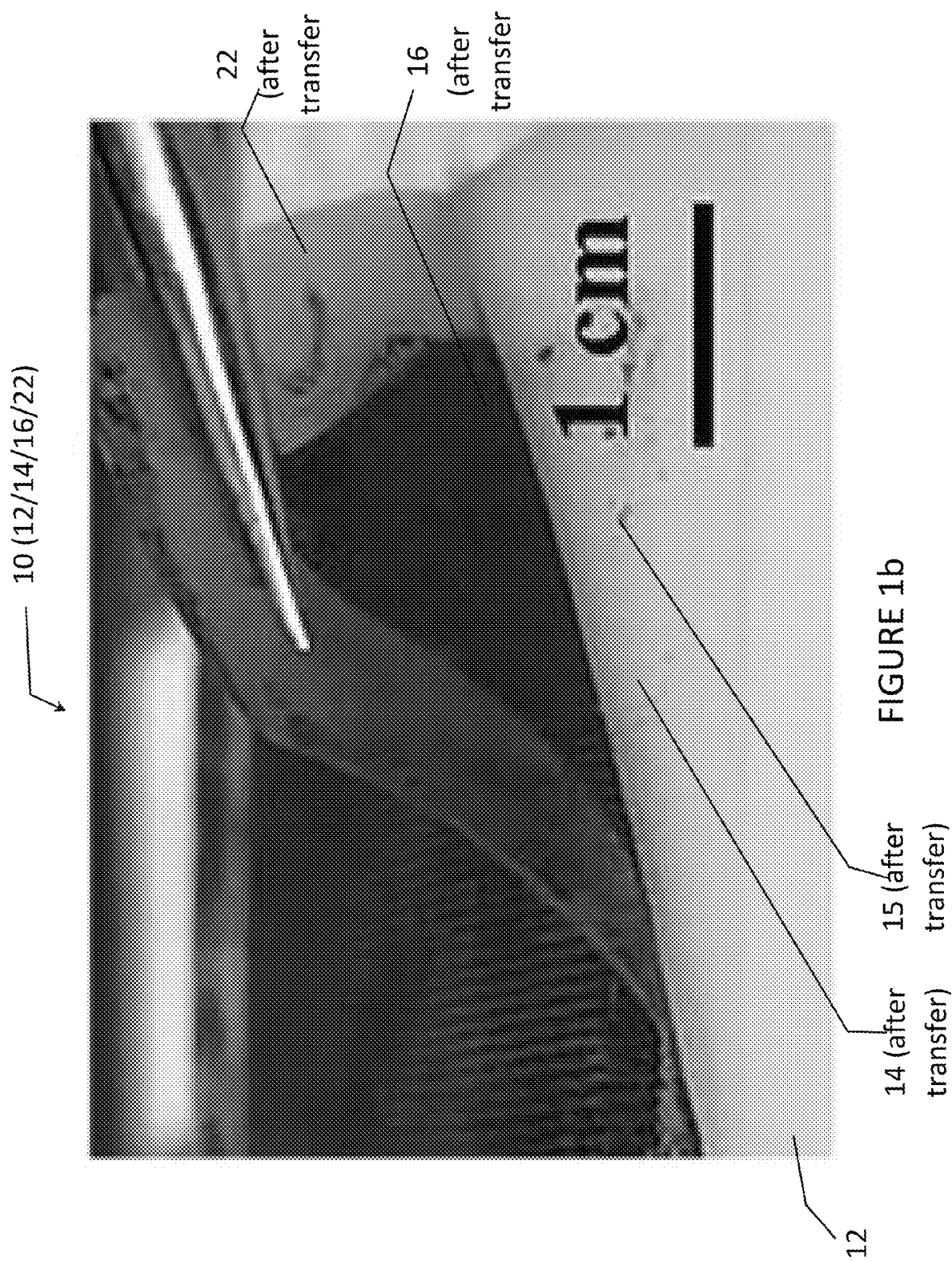
Figure 1C:
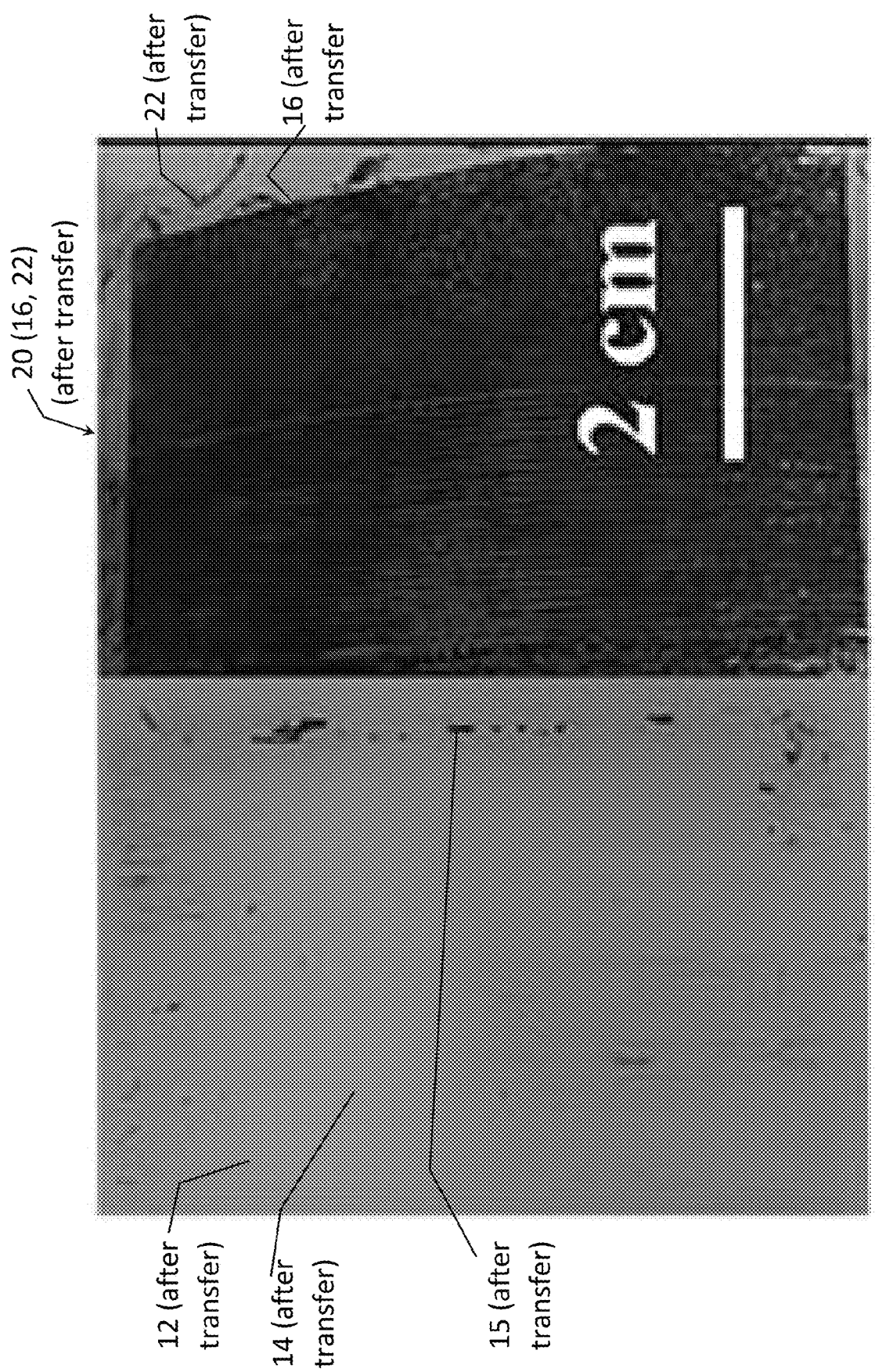
Figure 1D:
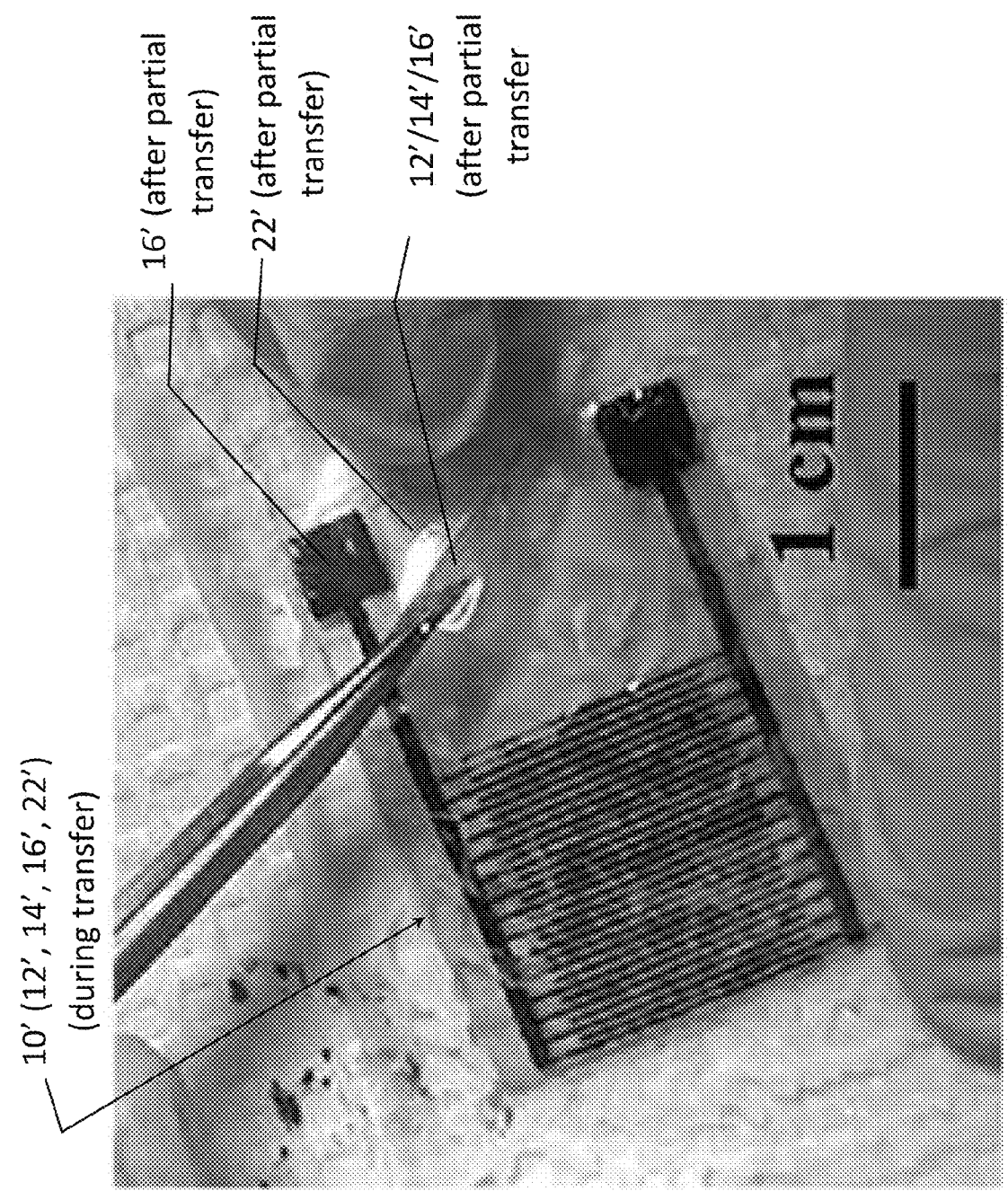
Figure 1E:
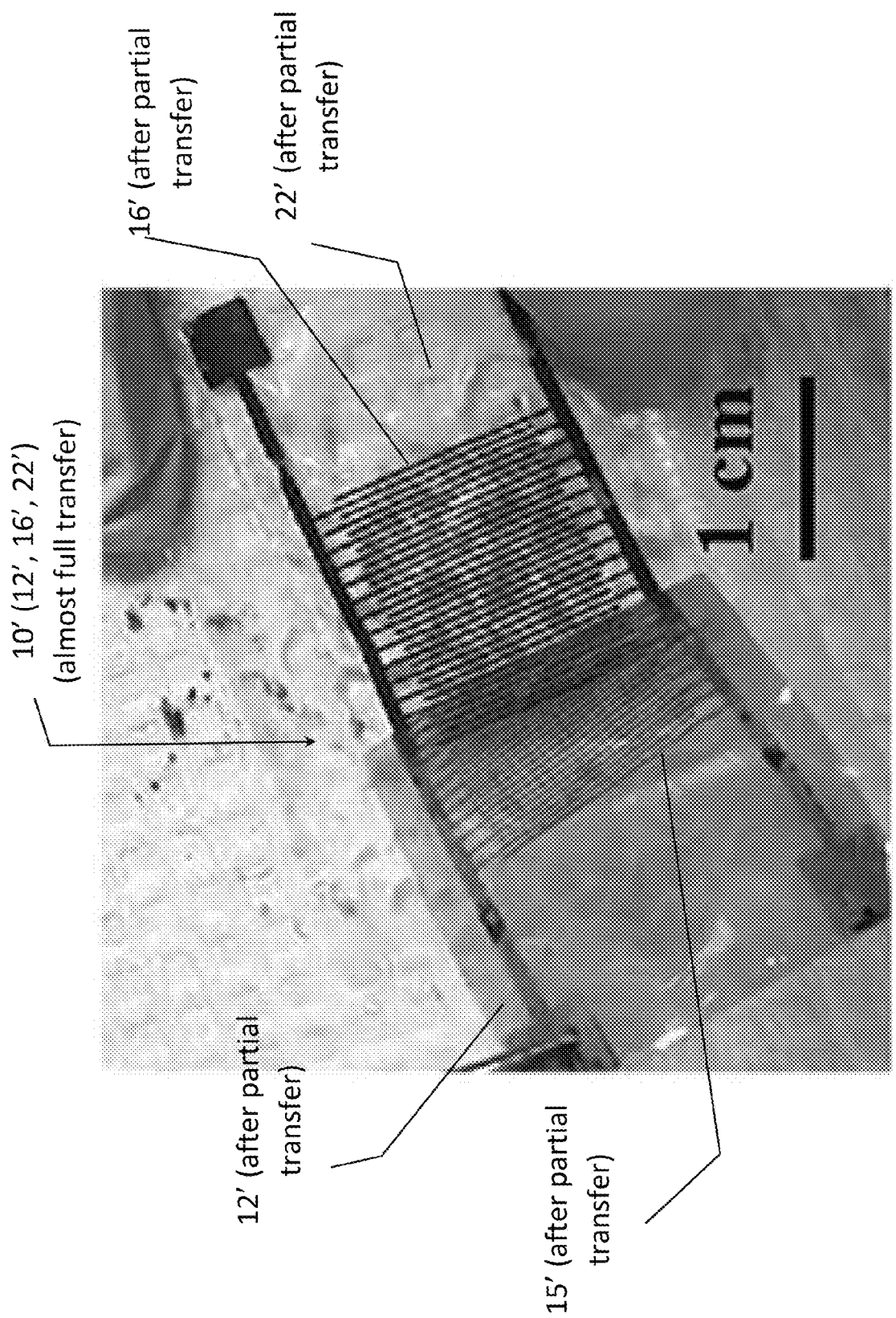
Figure 1F:
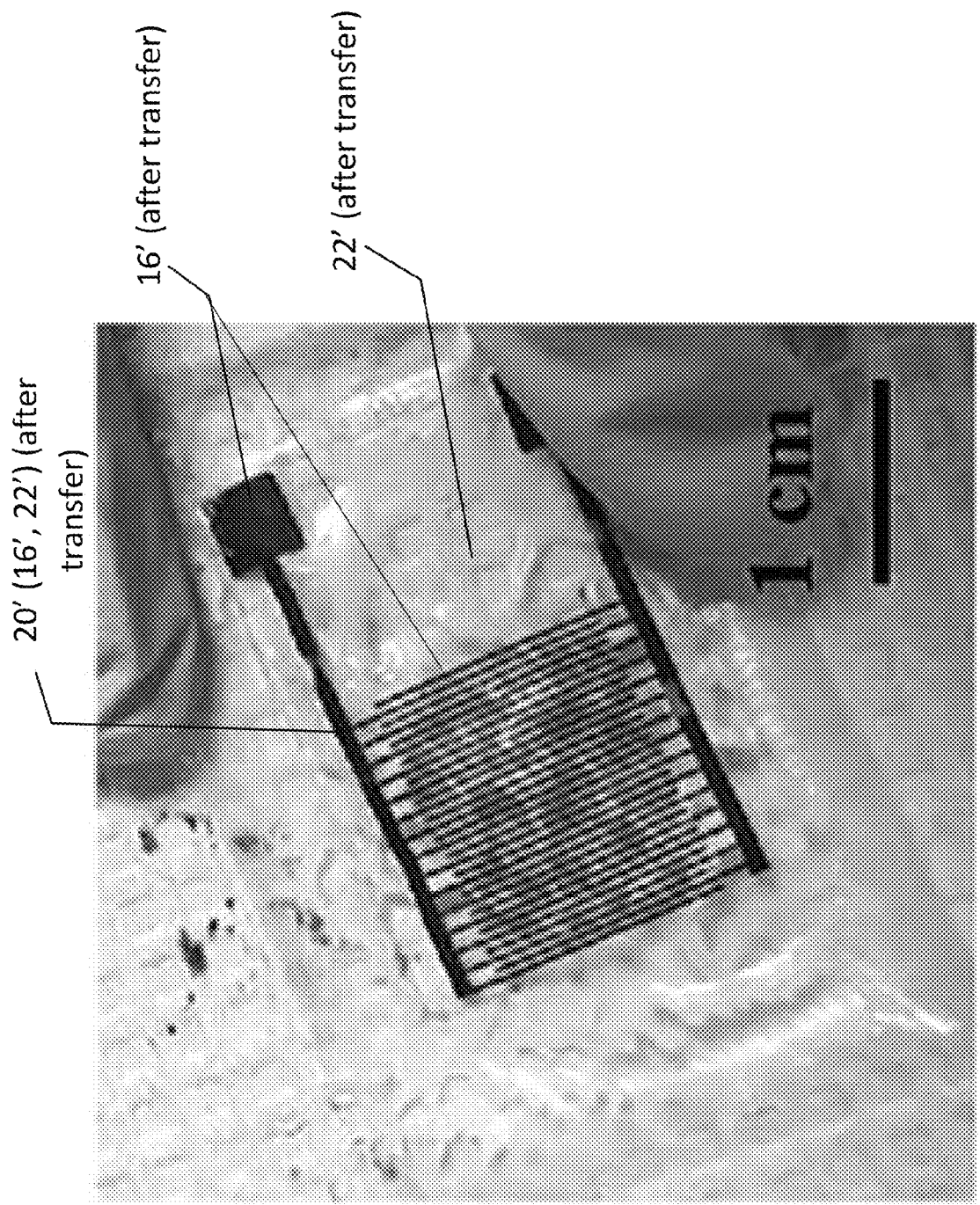
Figure 1G:
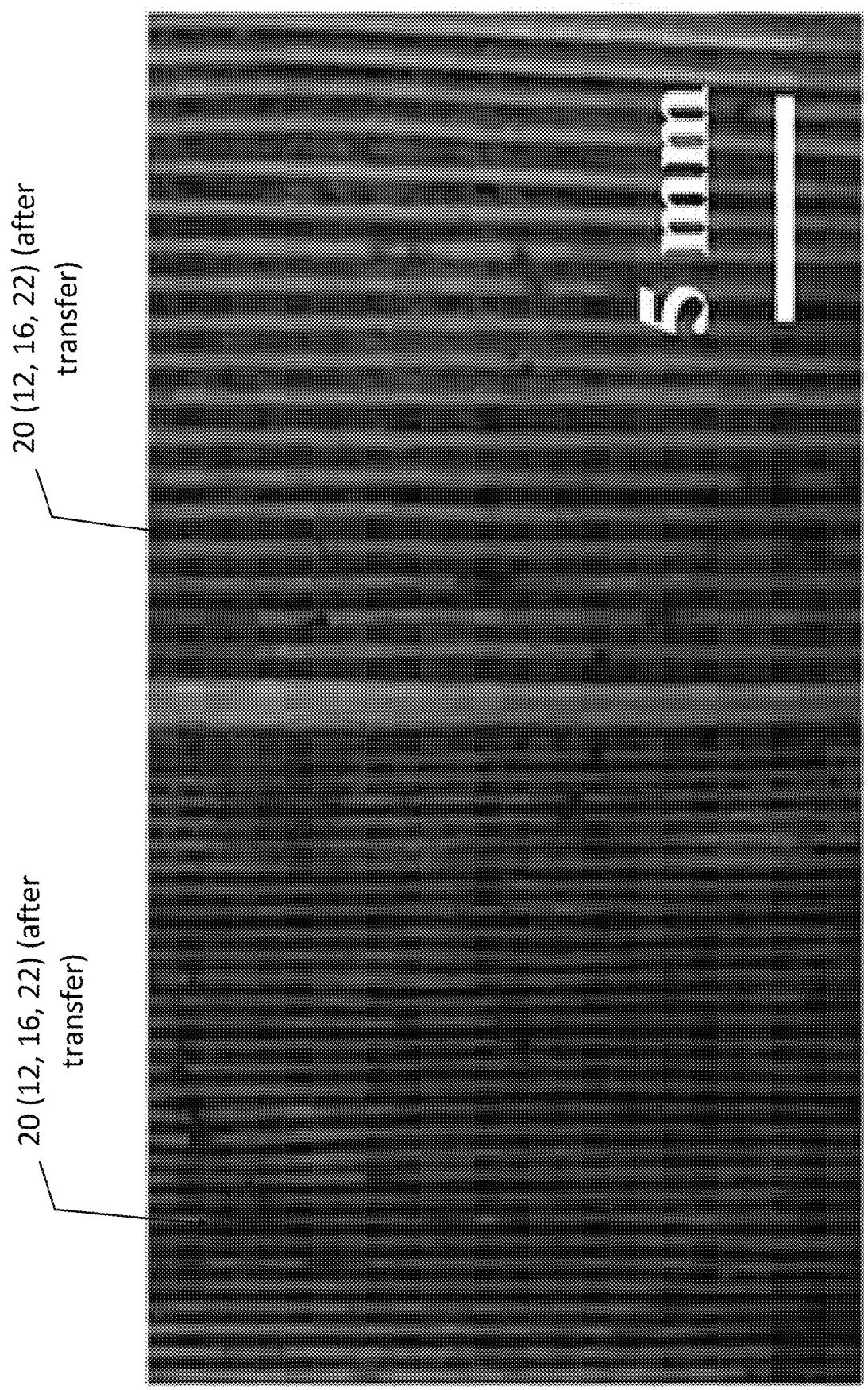
Figure 1H:
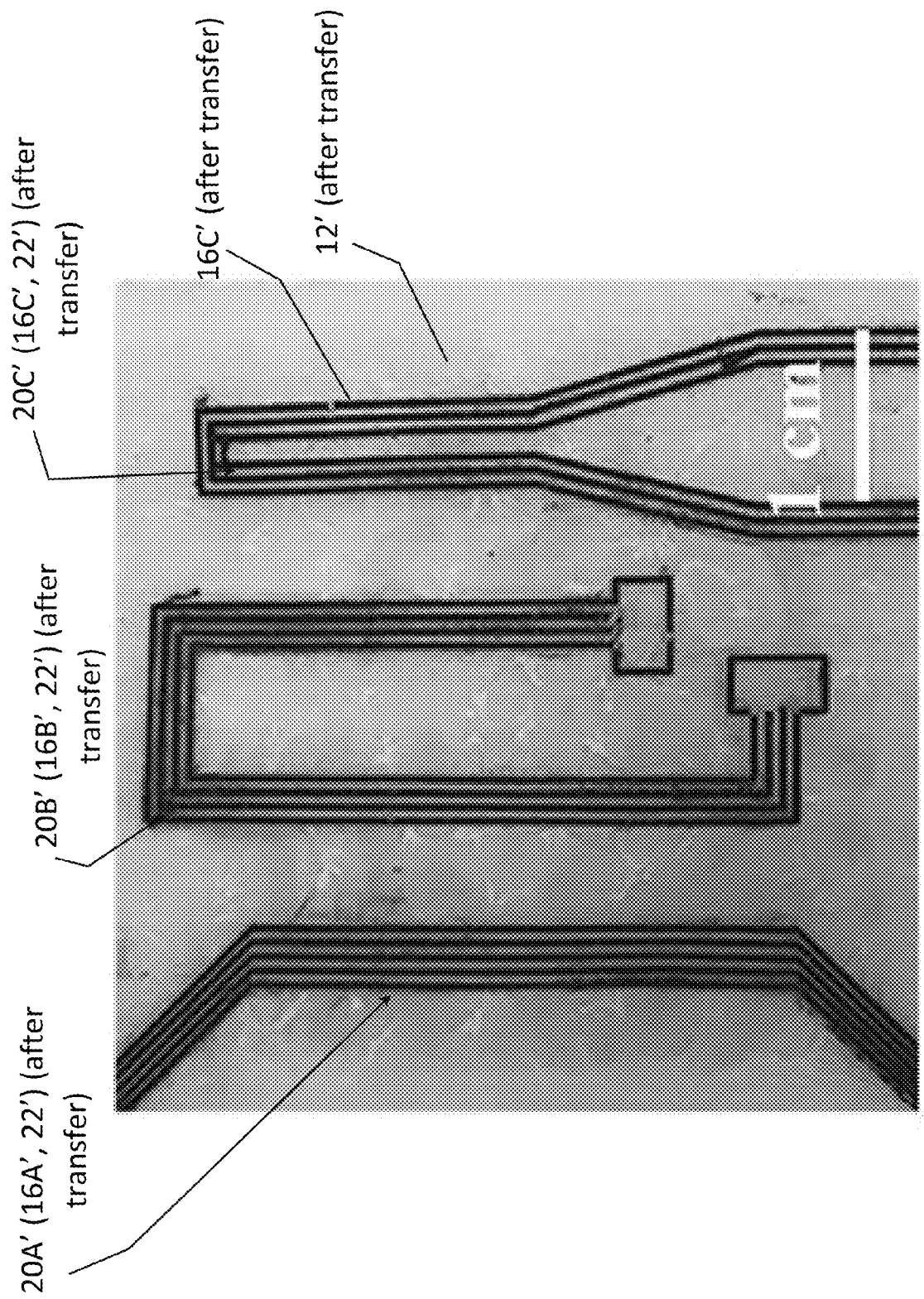
Figure 1I:
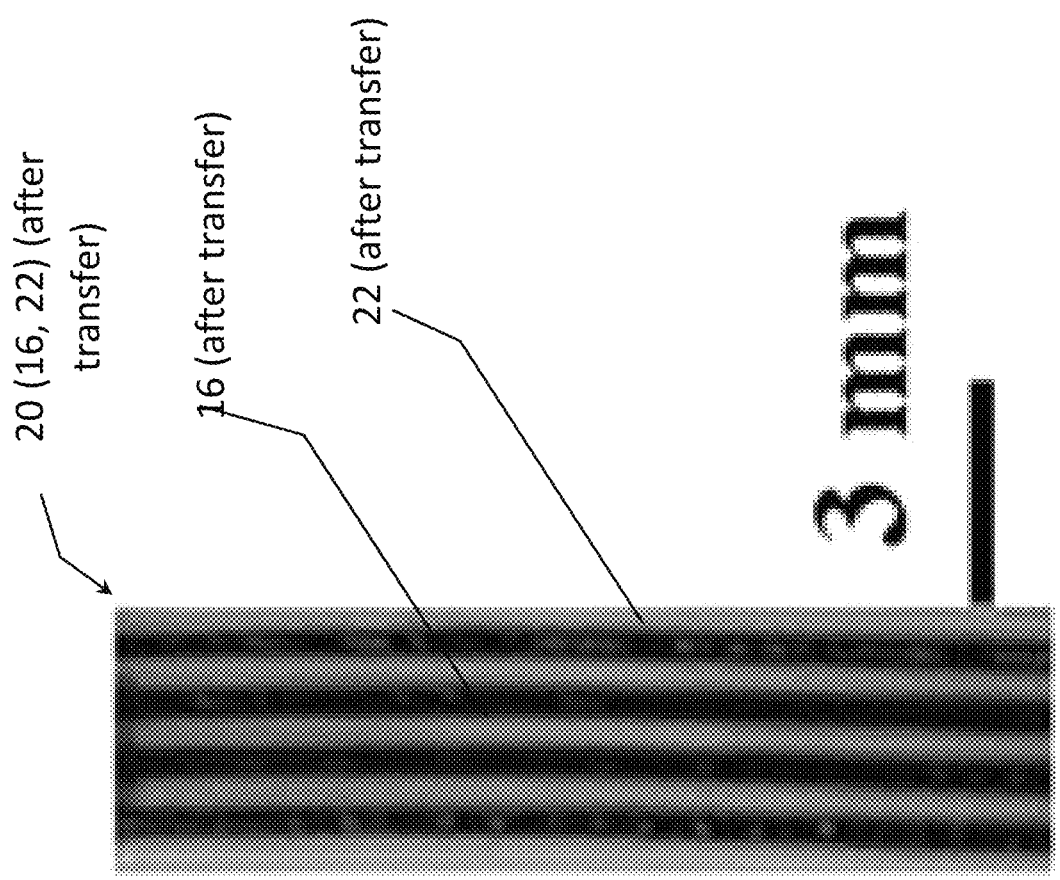
Figure 1J:
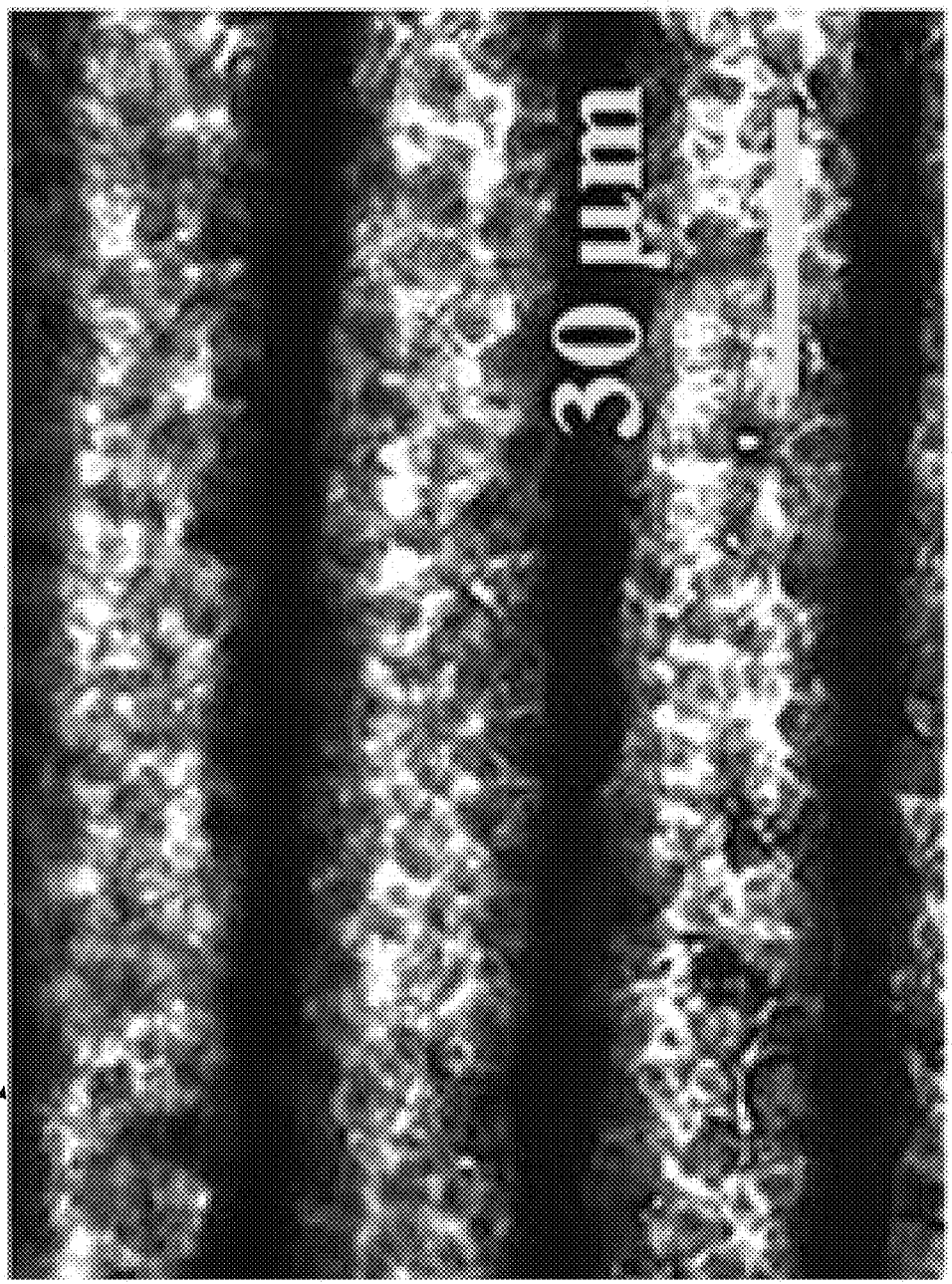

The patent or application file contains at least one drawing executed in color. Copies of this patent or patent application publication with color drawing(s) will be provided by the Office upon request and payment of the necessary fee. Frequent reference will be taken to the appended drawings, which are summarized as follows:

FIGS. 1a-c are graphene circuits fabricated via polymer casting according to one exemplary embodiment of the invention. FIGS. 1(a-c) are highly magnified images showing the steps of graphene transfer from rigid Delrin mold via Poly-L-Lactic Acid (PLLA) casting. FIG. 1(a): Casting of PLLA solution on graphene patterns formed on Delrin surface via microfluidic filling. FIG. 1 (b): Peeling off the PLLA film from the rigid Delrin surface and transfer of graphene upon drying of polymer solution and film formation. FIG. 1(c): PLLA film with graphene patterns on the surface and Delrin substrate after the process. FIG. 1(d-f): Images showing the steps of ink jet printed graphene transfer from flexible polyimide substrate via Cellulose Acetate (CA) casting. FIG. 1(d): Casting of CA solution on graphene patterns printed on flexible polyimide substrate. FIG. 1 (e): Peeling off the CA film from the polyimide substrate and transfer of graphene upon drying of polymer solution and film formation. FIG. 1 (f): CA film with graphene patterns on the surface and polyimide substrate after the process. Graphene pattern of FIG. 1 (g) 400 μm and 200 μm width, 150 μm depth on Gelatin (GEL) film; FIG. 1(h) 300 μm width, 150 μm depth on Poly Lactic-co-Glycolic Acid (PLGA) film; FIG. 1 (i) 400 μm width, 150 μm depth on Whey Protein Isolate (WPI) film; FIG. 1 (j) 15 μm width, 50 μm depth on PLLA film (image take by light microscope).

Figure 2A:
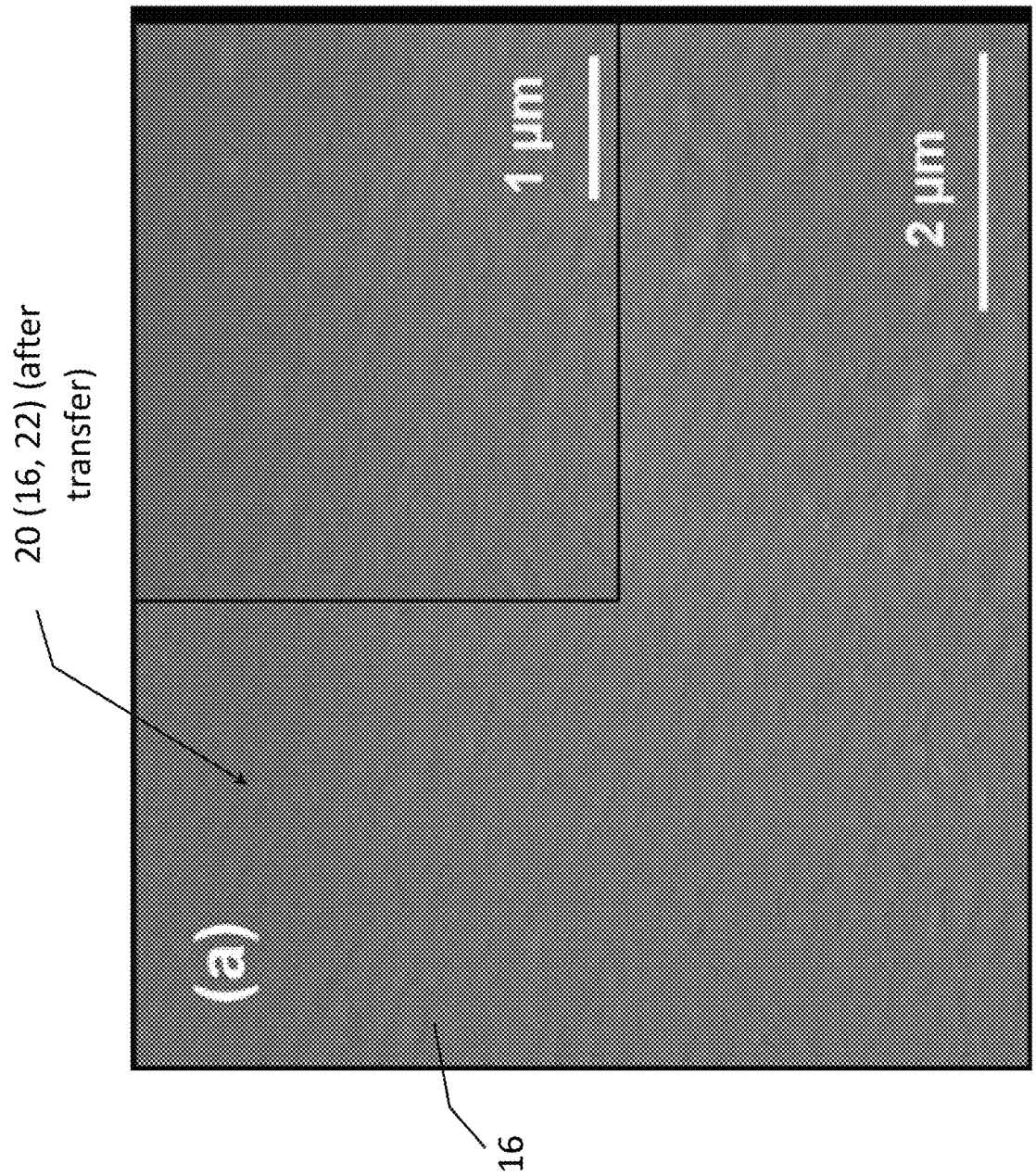
Figure 2B:
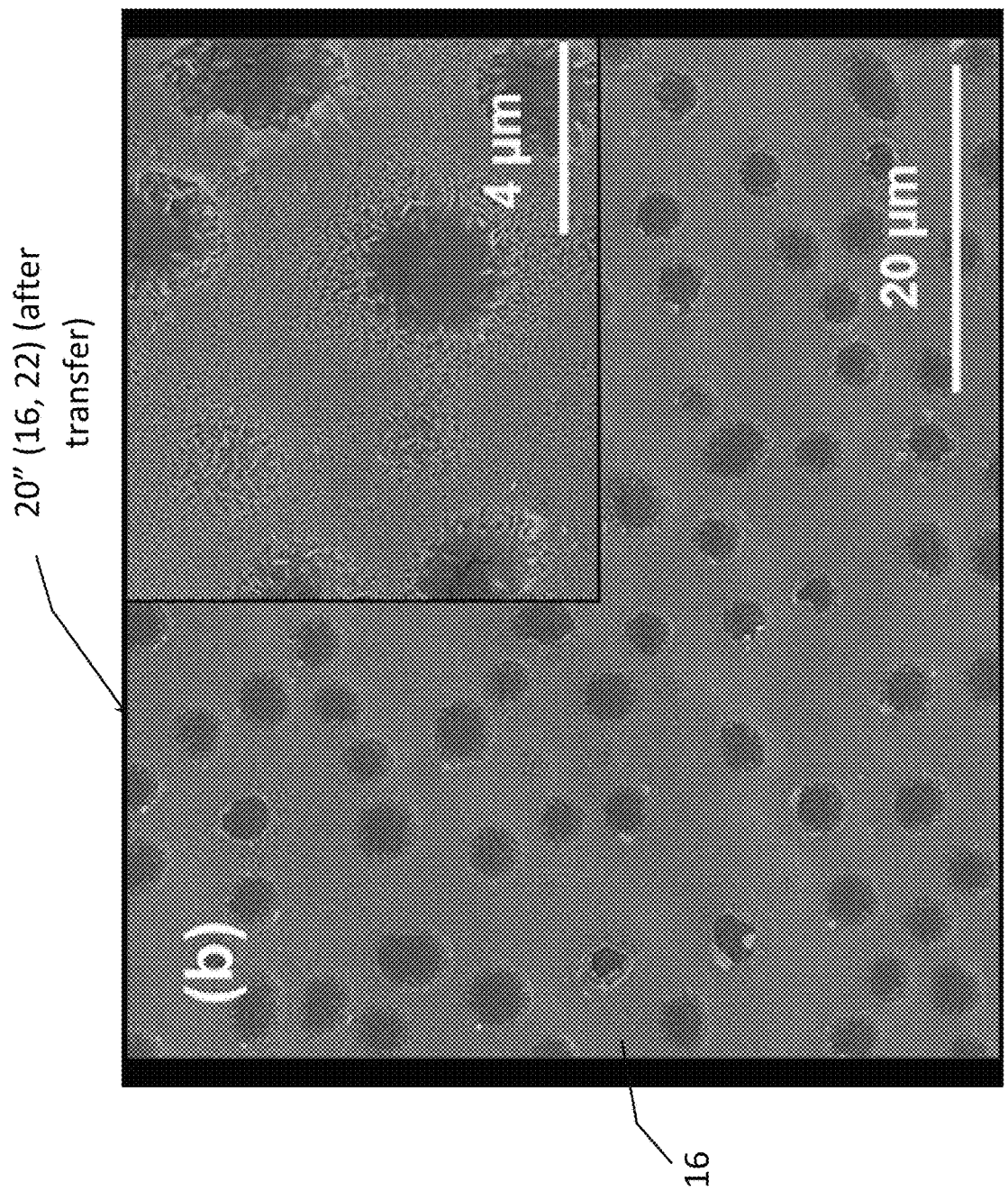
Figure 2C:
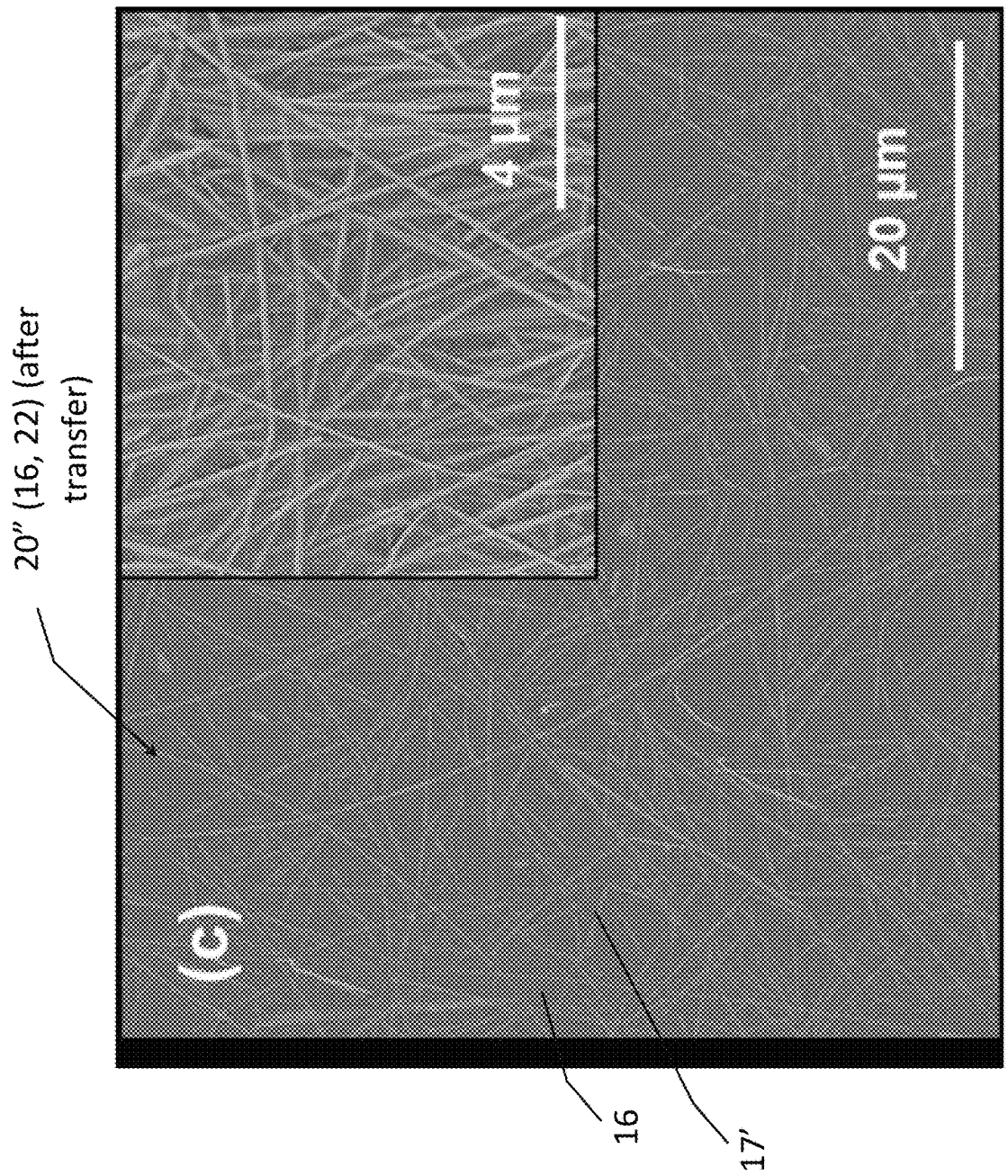

FIGS. 2a-c are highly magnified images of CVD grown graphene film transferred to a PLLA surface from FIG. 2(a) copper foil substrate and FIG. 2(b) quartz substrate according to an exemplary embodiment of the invention. FIG. 2(c) is CVD grown graphene-silver nanowire film transferred to PLLA surface from quartz substrate according to an exemplary embodiment of the invention.

Figure 3A:
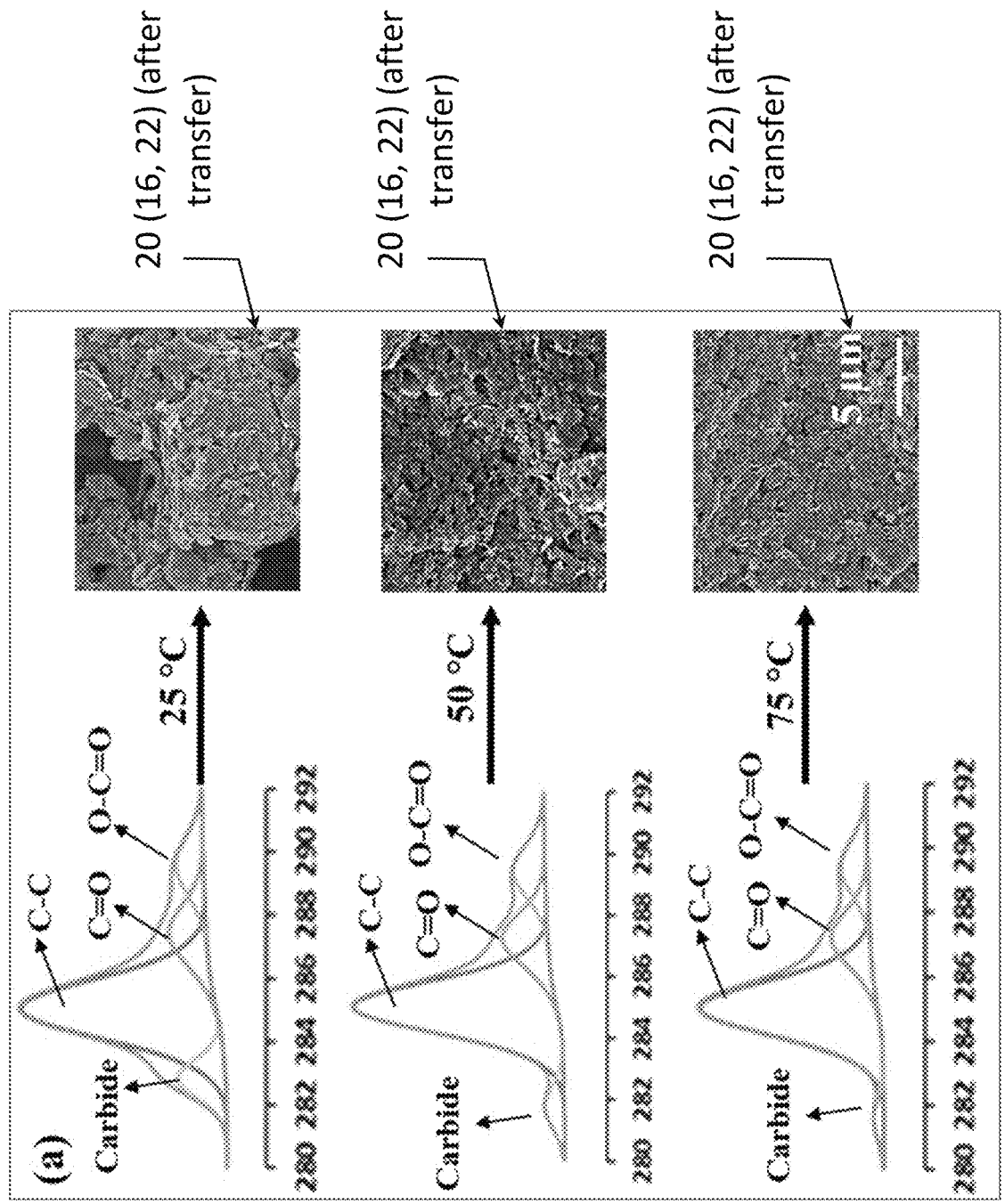
Figure 3B:
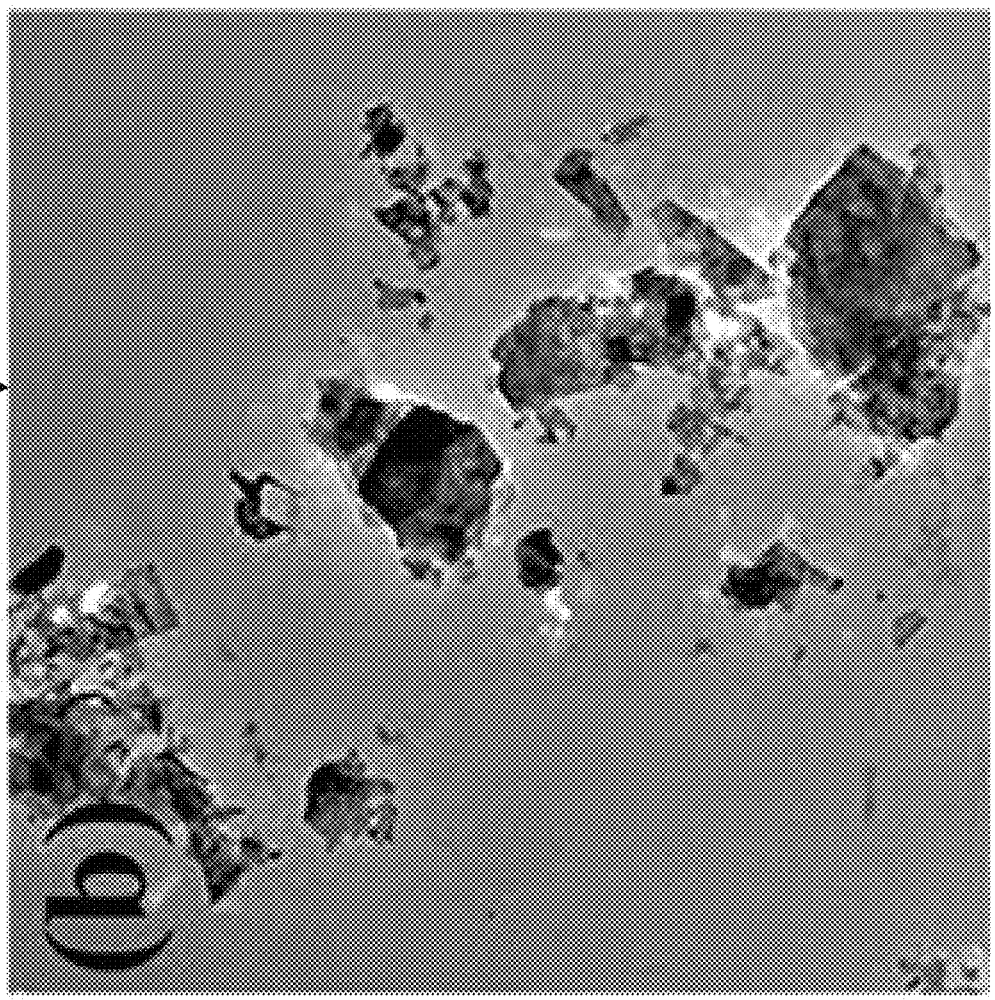
Figure 3C:
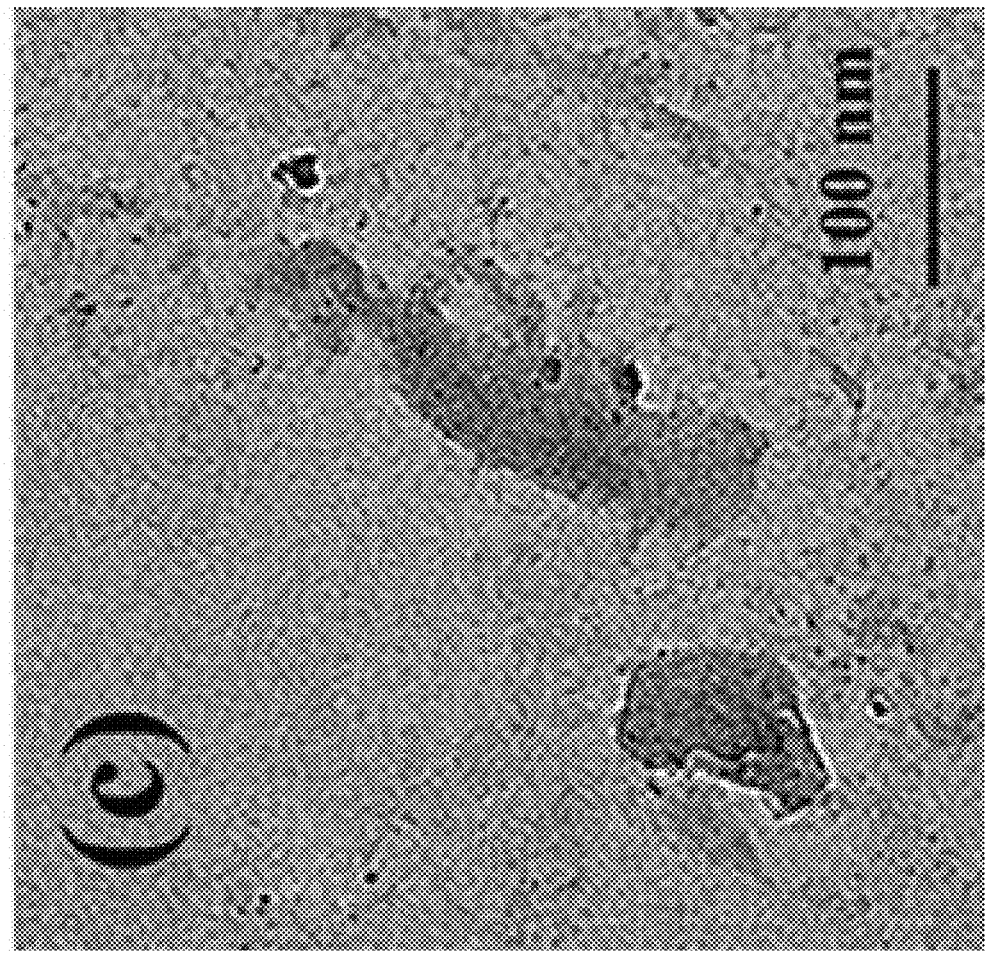
Figure 3D:
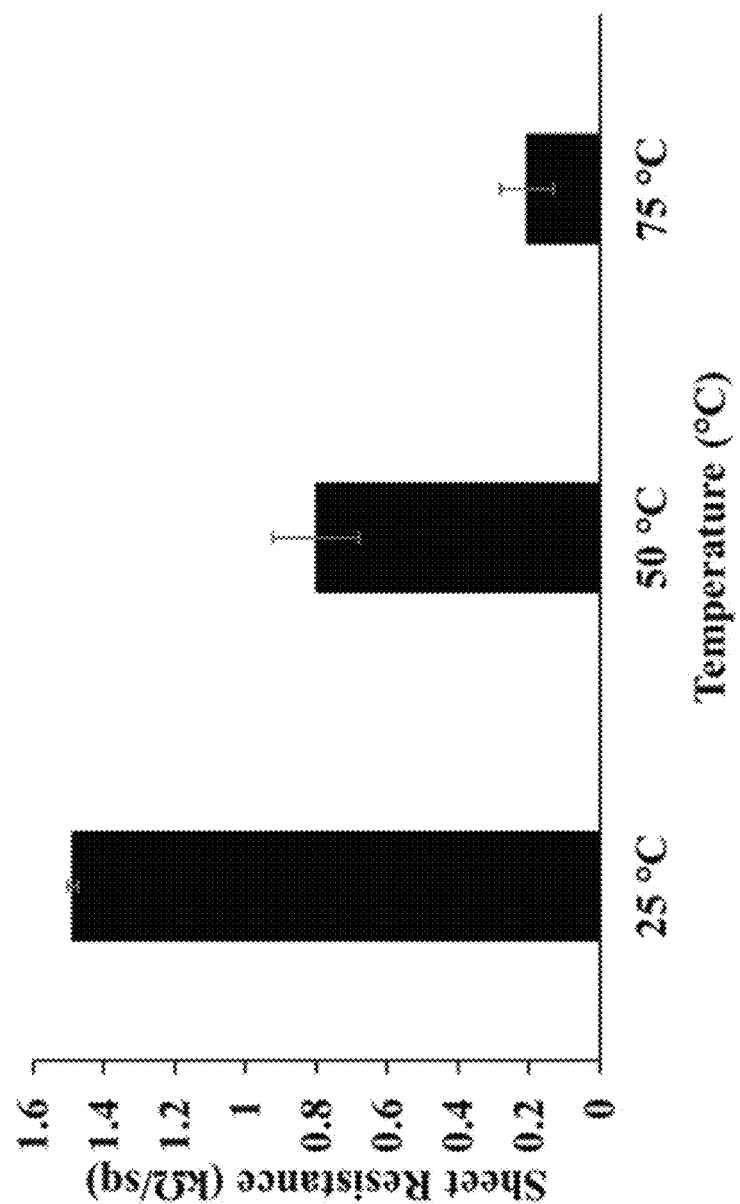

FIGS. 3a-d are illustrations, according to exemplary embodiments of the invention. FIG. 3(a): XPS analysis of PLLA films with graphene surface patterns pre-annealed at 25, 50 and 75° C. and their corresponding structures as SEM images. TEM images of GNPs FIG. 3(b) non-annealed and FIG. 3(c) pre-annealed at 75° C. FIG. 3(d): The change in sheet resistance with respect to pre-annealing temperature. According to the ANOVA analysis by Tukey's method with a 95% confidence interval the p value was found to be smaller than 0.05 showing significant difference between the groups (p<0.05). (n=3, and error bar represents one standard deviation from the average).

Figure 4A:
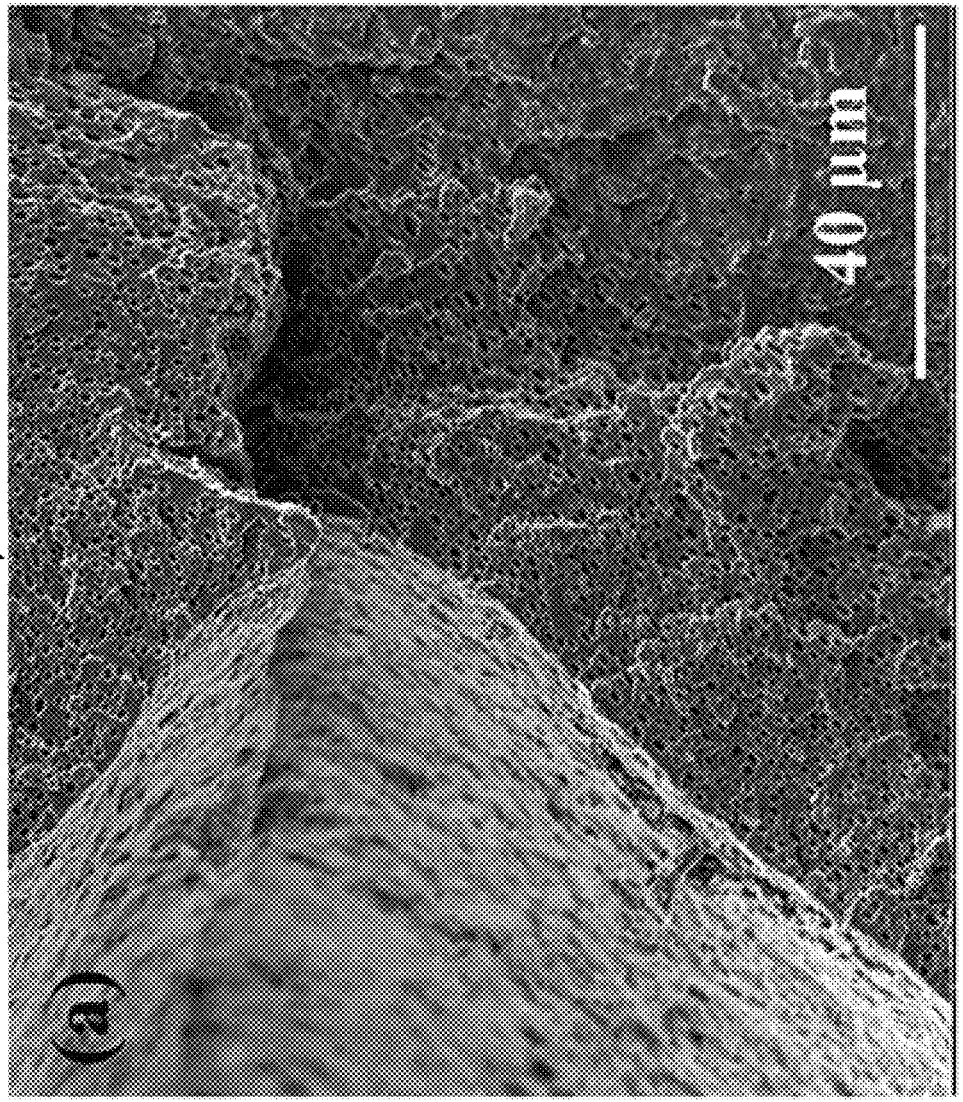
Figure 4B:
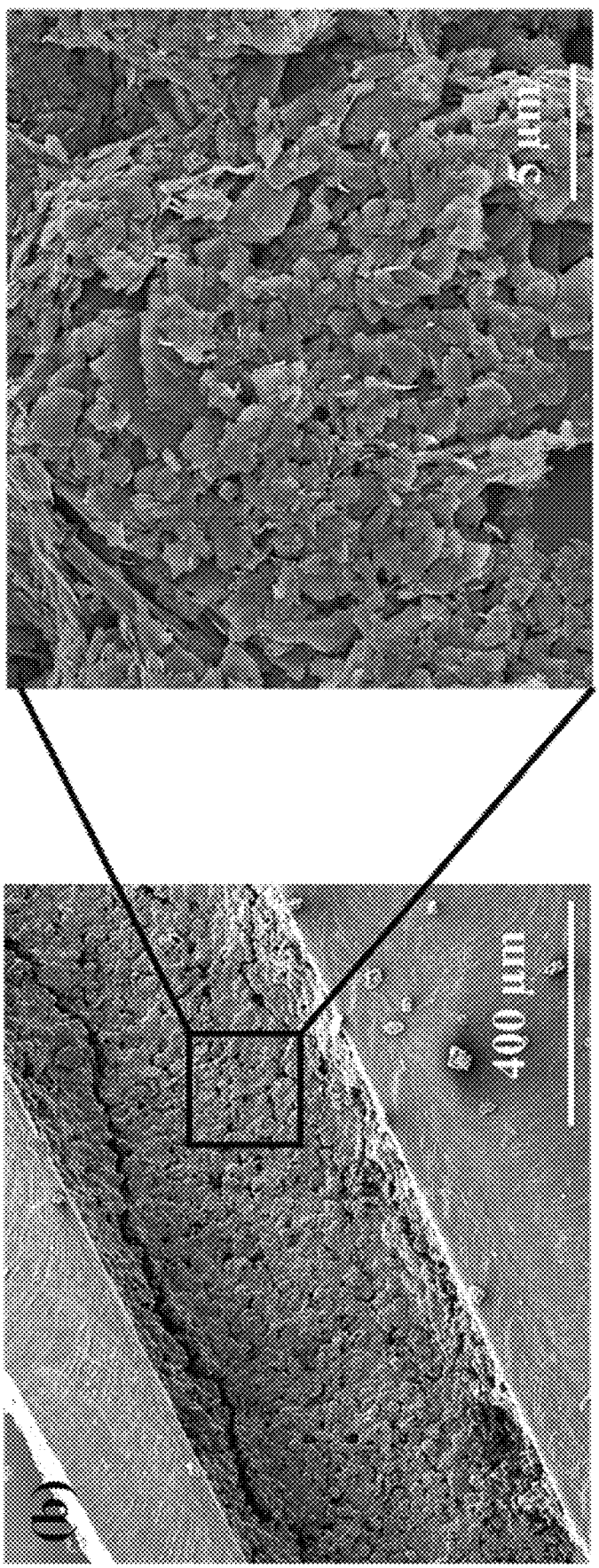
Figure 4C:
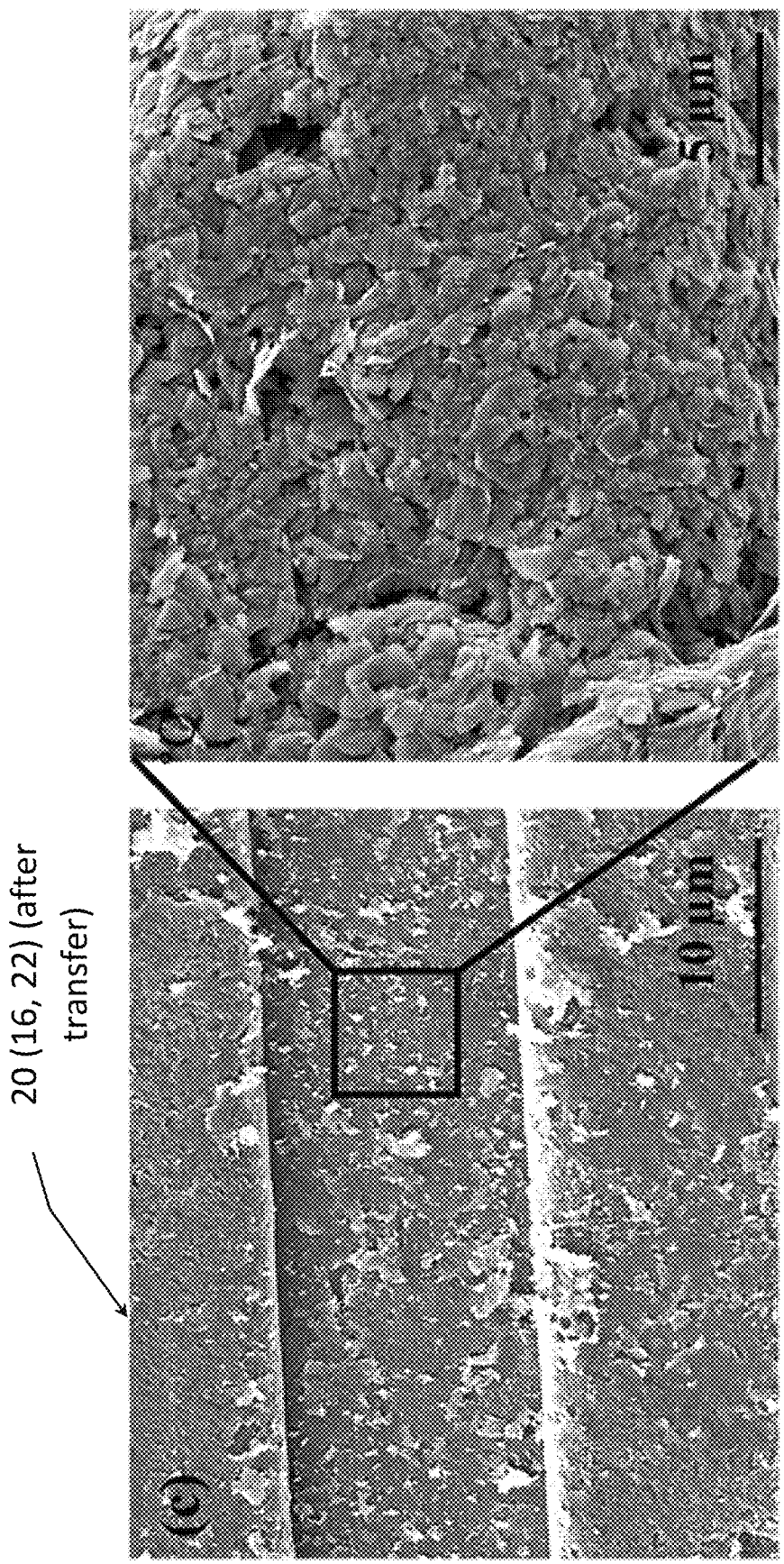
Figure 4D:
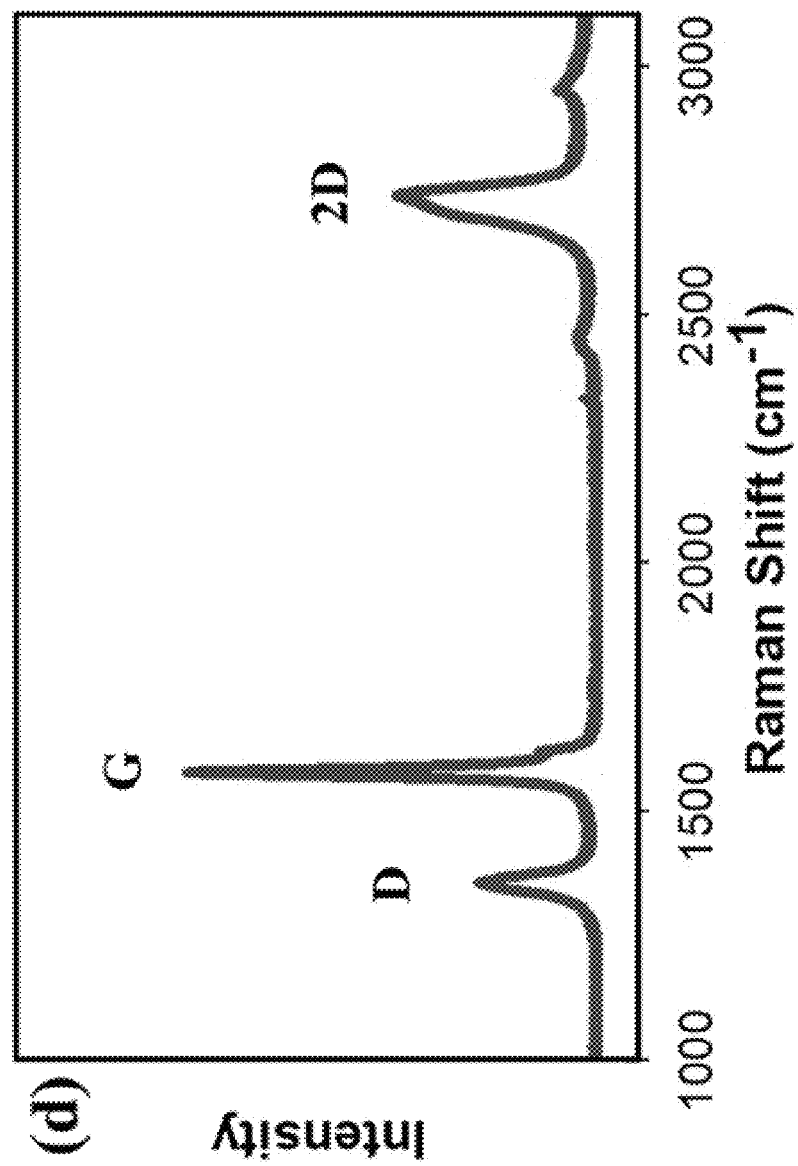

FIGS. 4a-d are SEM images of PLLA films and graphene micropatterns and an illustrative graph according to aspects of the present invention. FIG. 4(a): Cross section image of 3D porous microstructure of PLLA film. FIG. 4(b) Graphene micropatterns (500 μm width and 200 μm depth) on PLLA film surface. FIG. 4(c) Graphene micropatterns (15 μm width and 5 μm depth) on PLLA film surface. FIG. 4(d) Raman spectra of the transferred graphene on PLLA films.

Figure 5A:
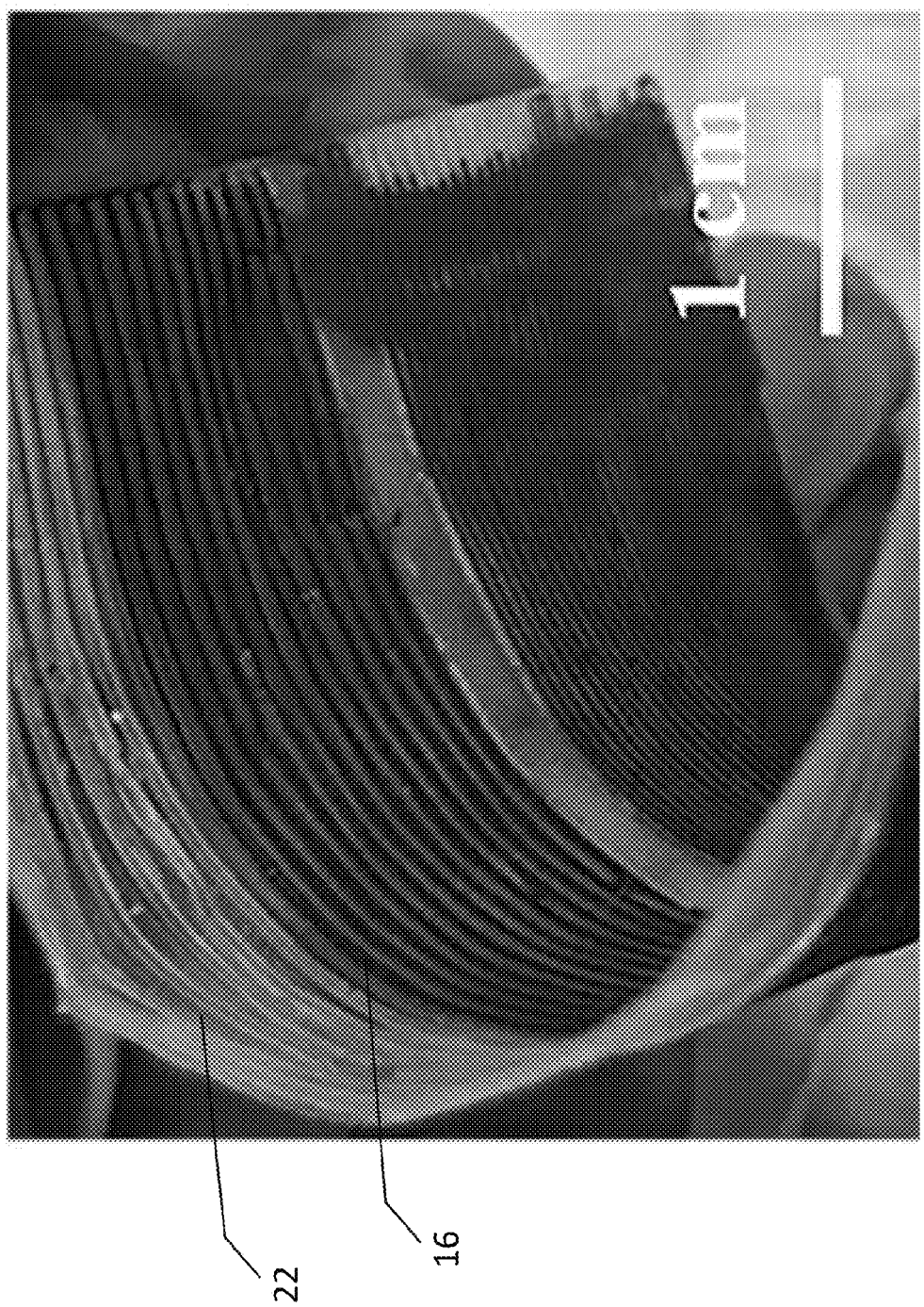
Figure 5B:
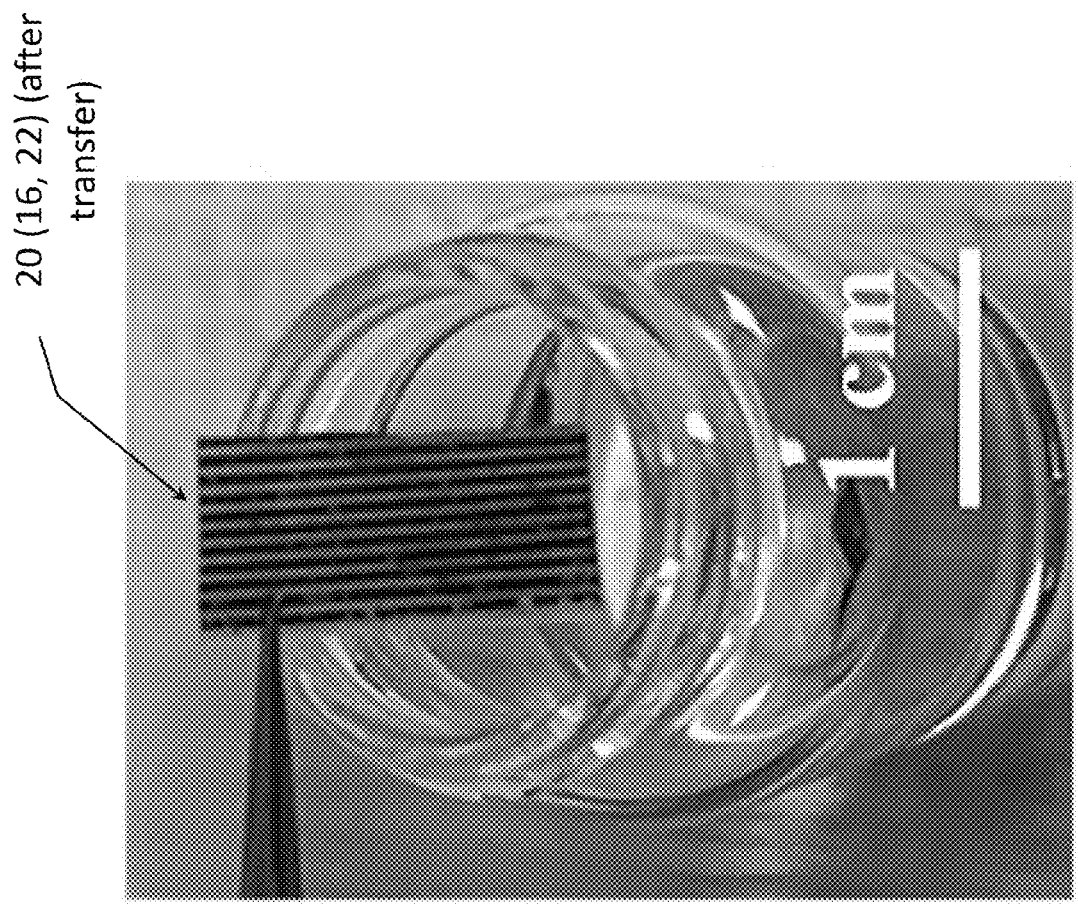
Figure 5C:
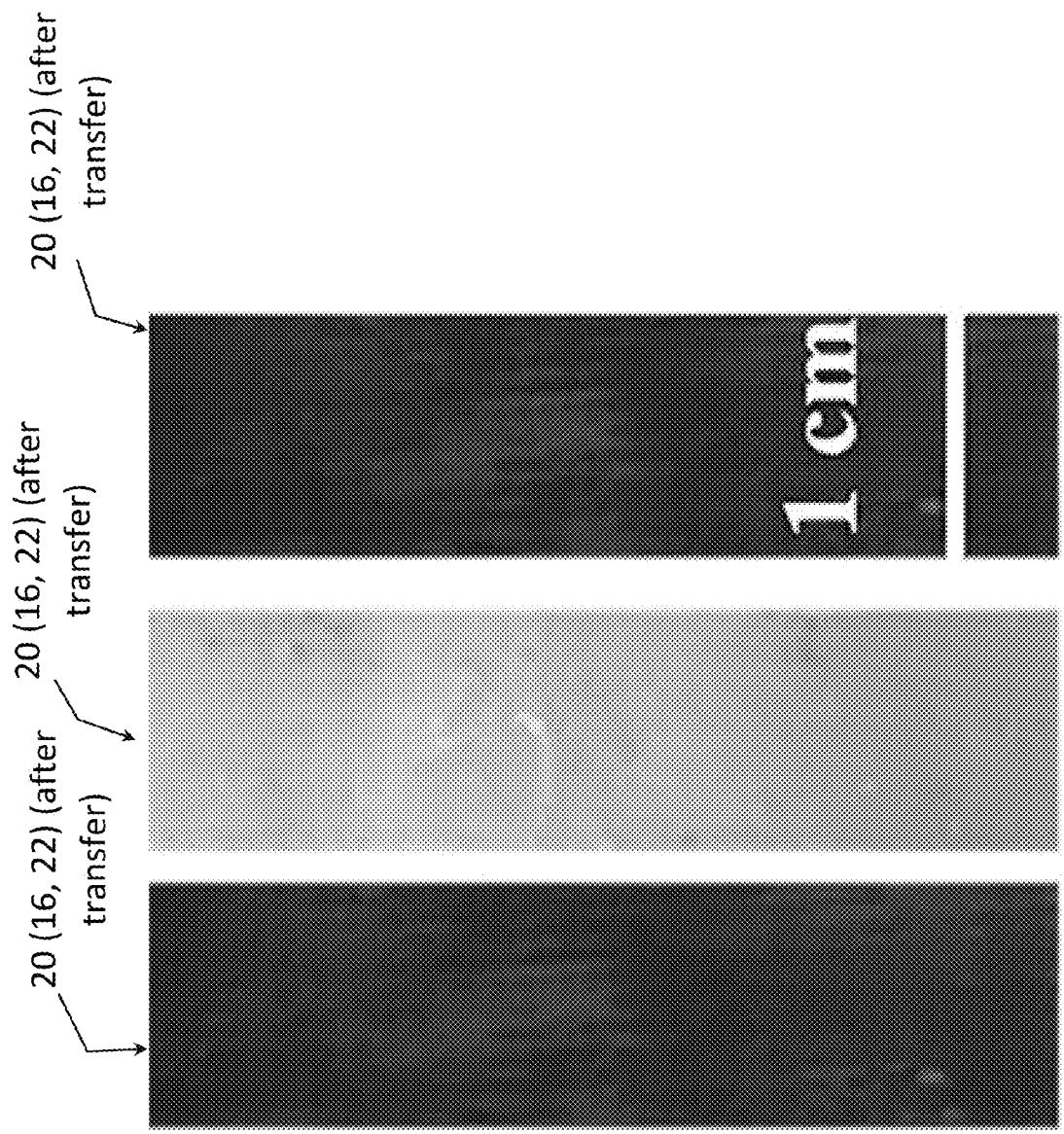
Figure 5D:
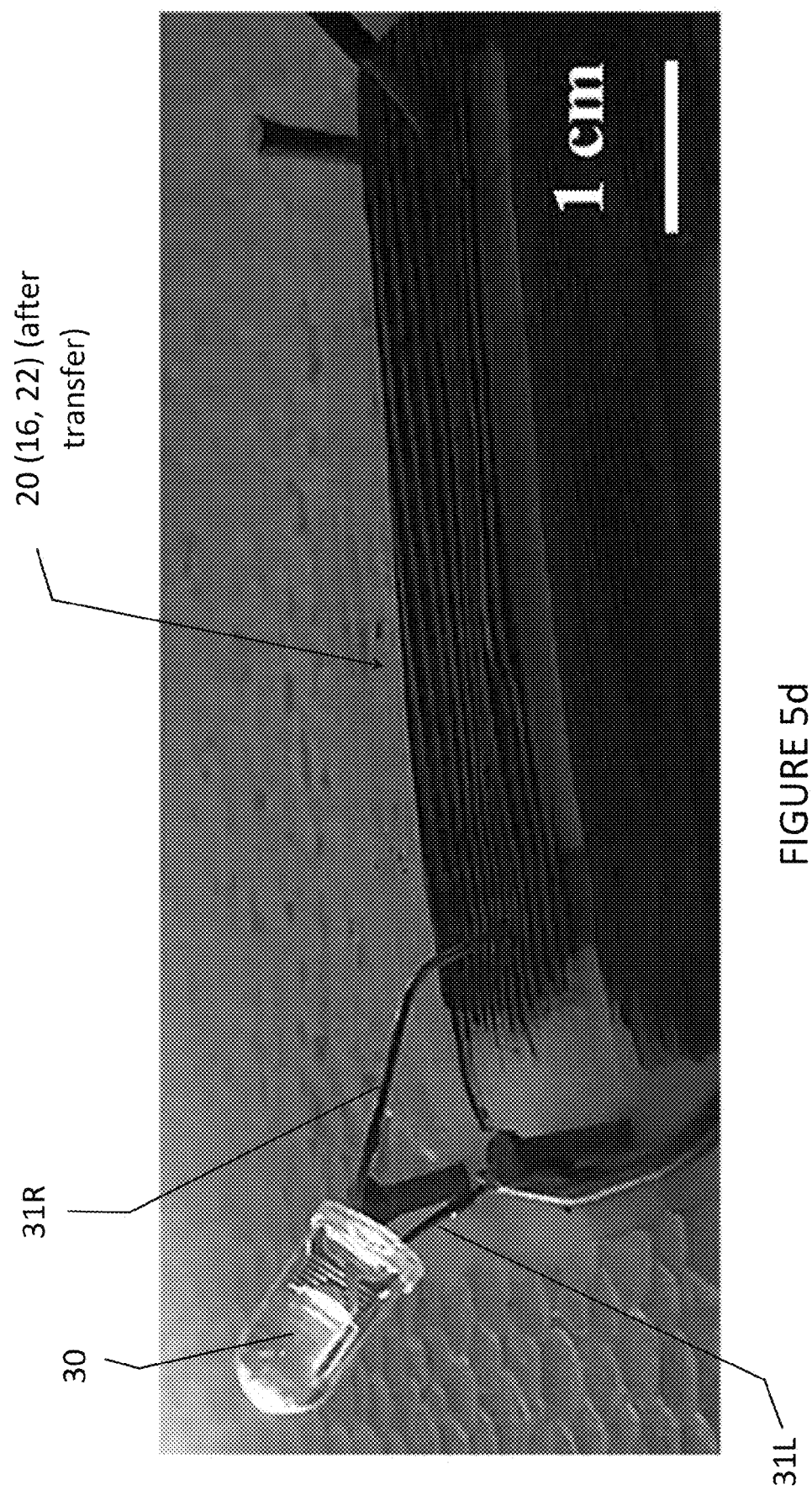
Figure 5E:
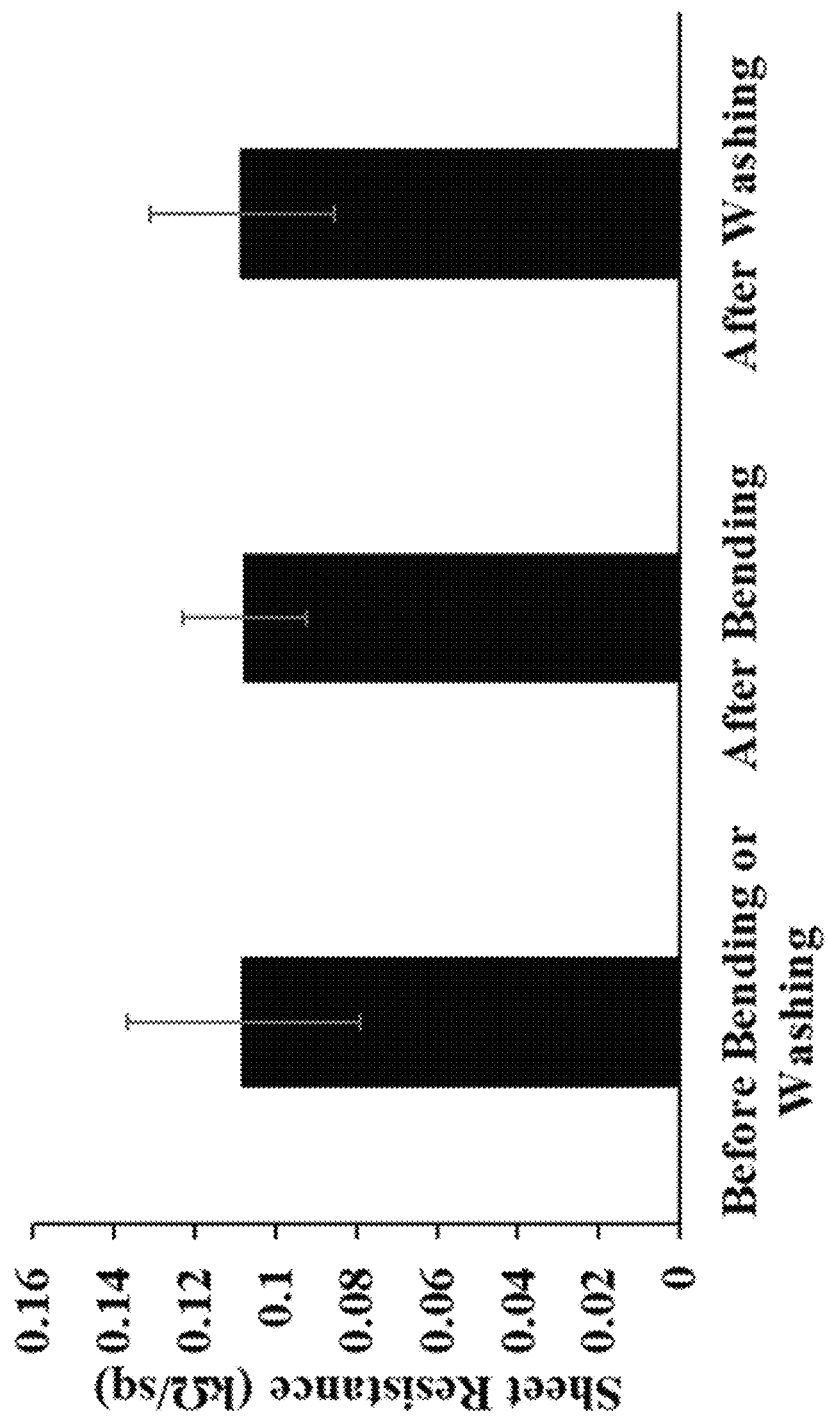

FIGS. 5a-e are images and an illustrative graph of stability and conductivity of the graphene patterns according to exemplary embodiments of the present invention. Graphene patterns are flexible and bendable and keep their mechanical stability after FIG. 5(a) multiple bending (100 times), FIG. 5(b) washing cycles (24 h incubation) and FIG. 5(c) mechanical peeling applied via adhesive tape. FIG. 5(d): Graphene patterns have good conductivity and low resistance to build an active circuit. FIG. 5(e): Sheet resistance did not change after multiple bending and washing cycles. According to the ANOVA analysis by Tukey's method with a 95% confidence interval the p value was found to be higher than 0.05 showing insignificant difference (p>0.05). (n=3, and error bar represents one standard deviation from the average).

Figure 6A:
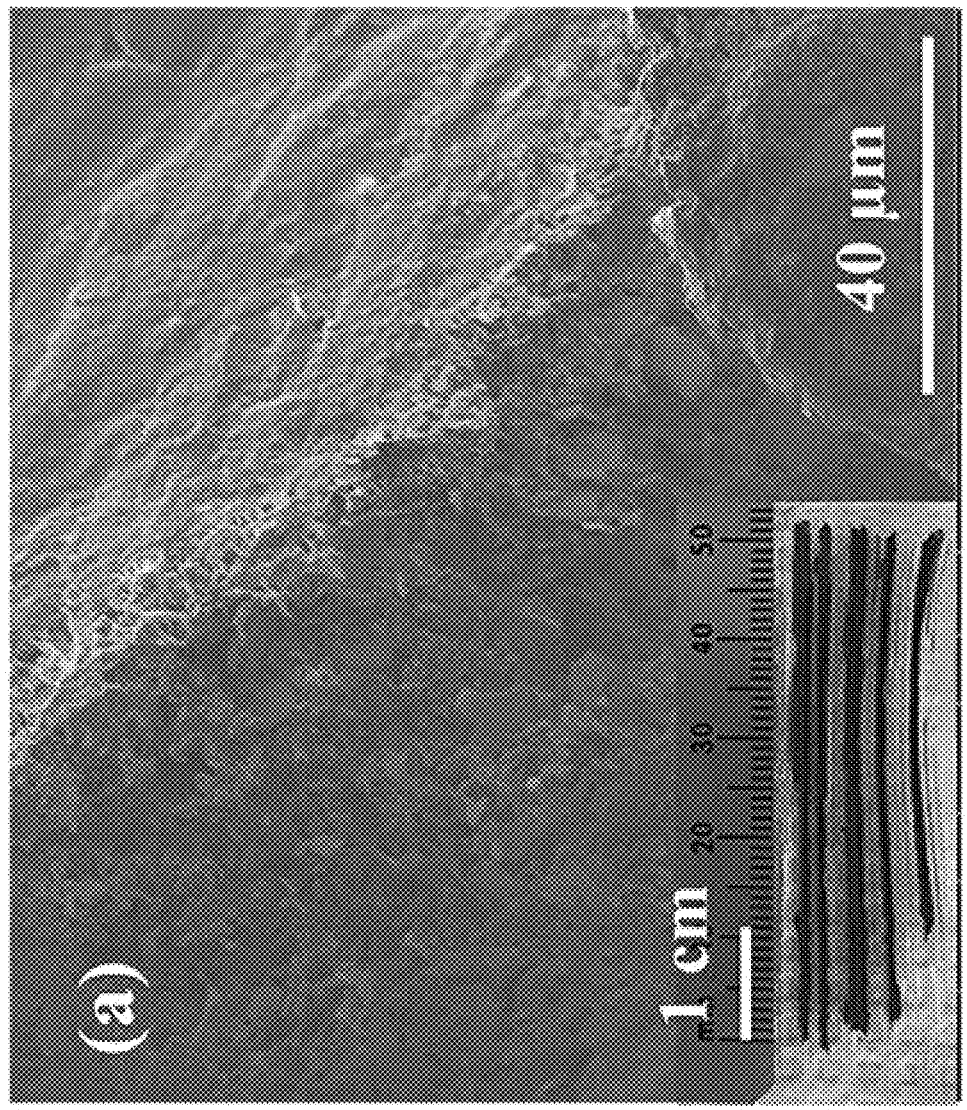
Figure 6B:
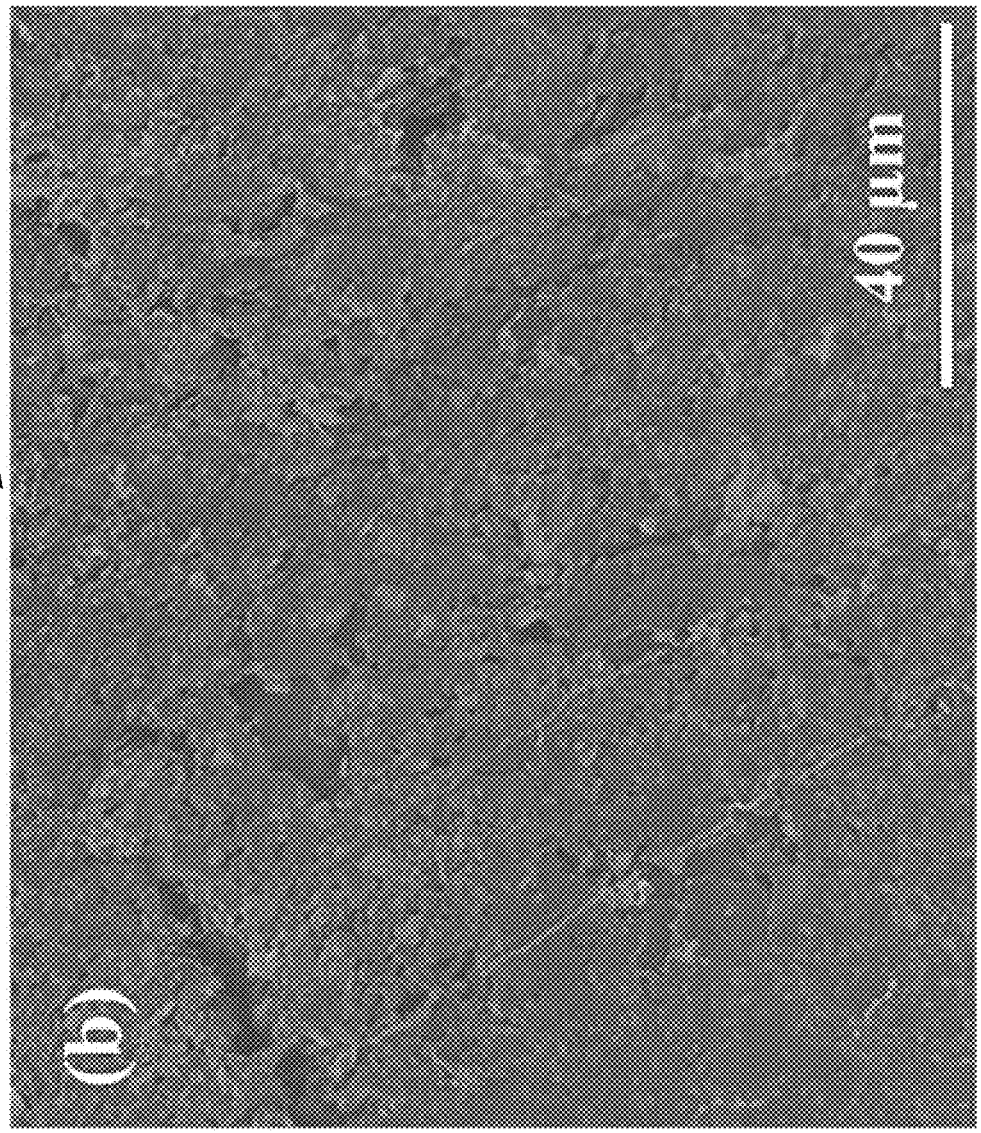
Figure 6C:
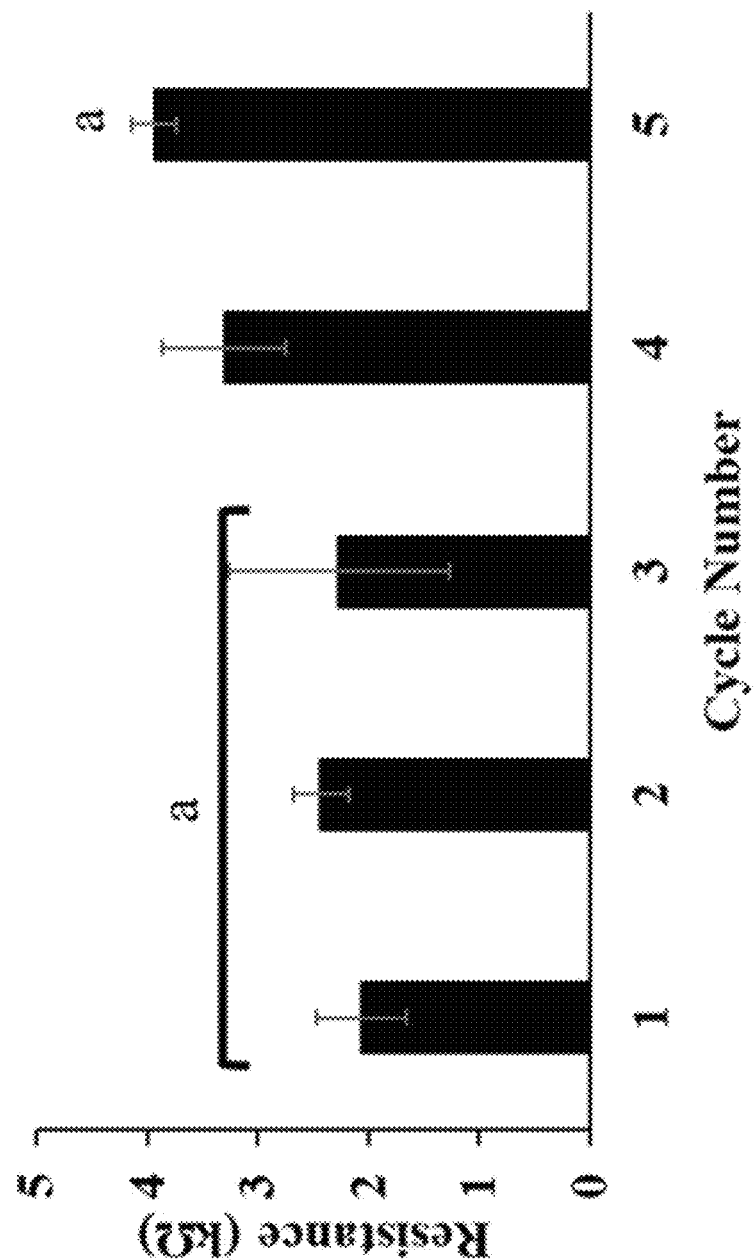
Figure 6D:
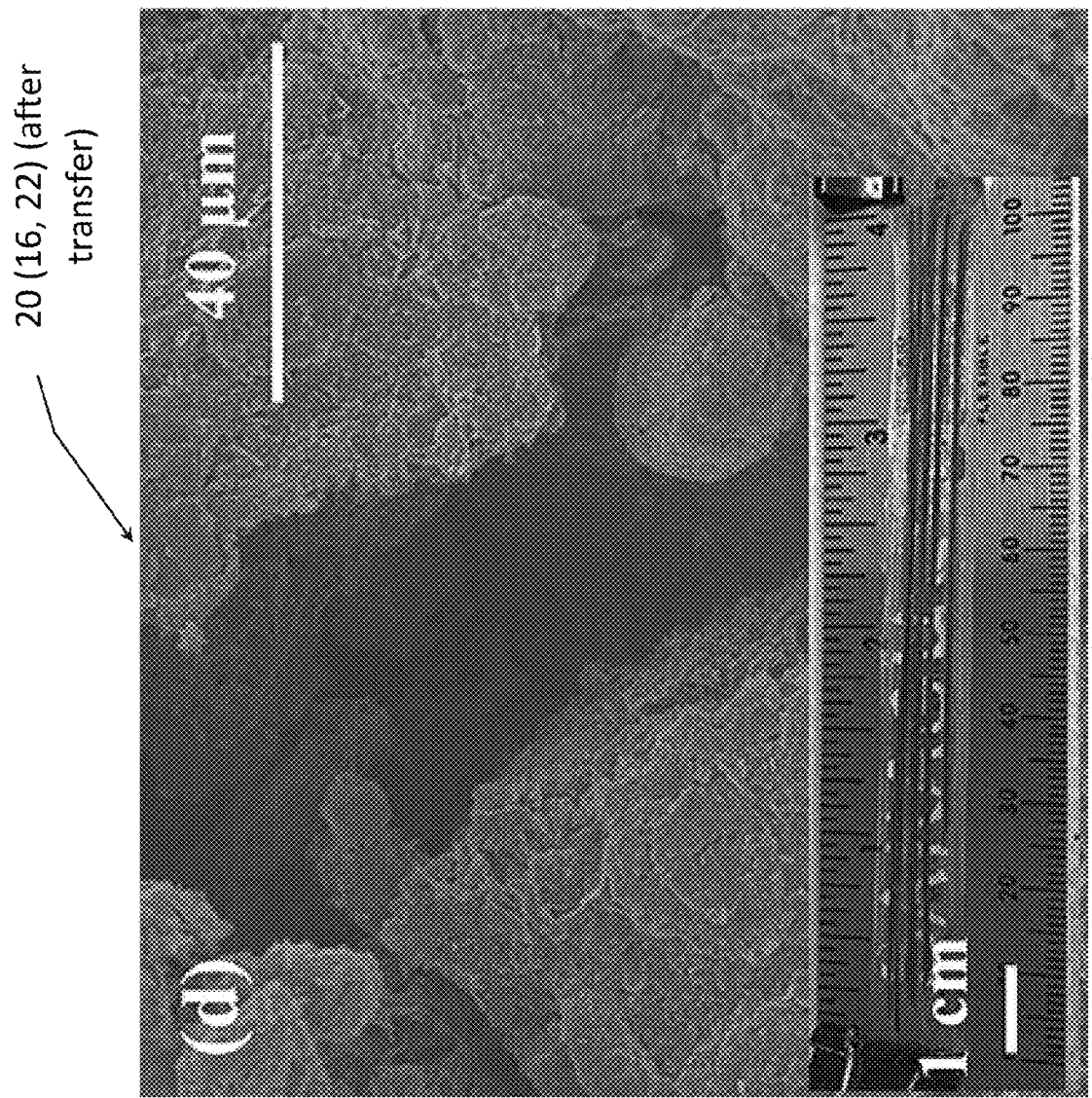
Figure 6E:
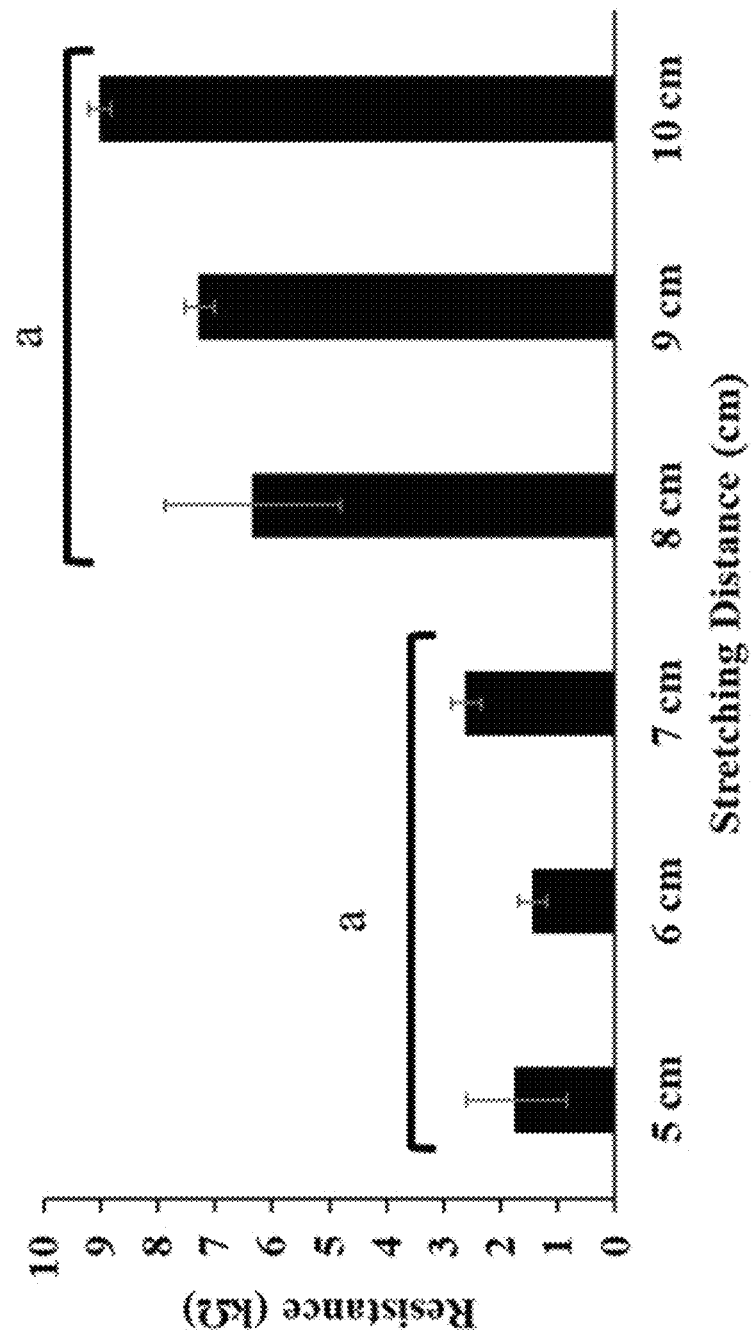

FIGS. 6a-e are SEM images of graphene patterns transferred on WPI films according to exemplary embodiments of the invention; FIG. 6(a) before (5 cm initial length) and FIG. 6(b) after cycles of stretching test (3 times of 2 cm stretching and retraction was applied). FIG. 6(c): Change of the resistance after cyclic stretching test. FIG. 6(d): SEM images of graphene patterns transferred on WPI films after 10 cm of (the final stretched length) stretching. Stretching distance is 5 cm. FIG. 6(e): Change in the resistance as the stretching distance increases to the final distance of 10 cm. For FIG. 6(c,e) ANOVA analysis by Tukey's method with a 95% confidence interval was conducted and the p value was found to be smaller than 0.05 for indicated letter "a" showing significant difference. (n=3, and error bar represents one standard deviation from the average).

Figure 7A:
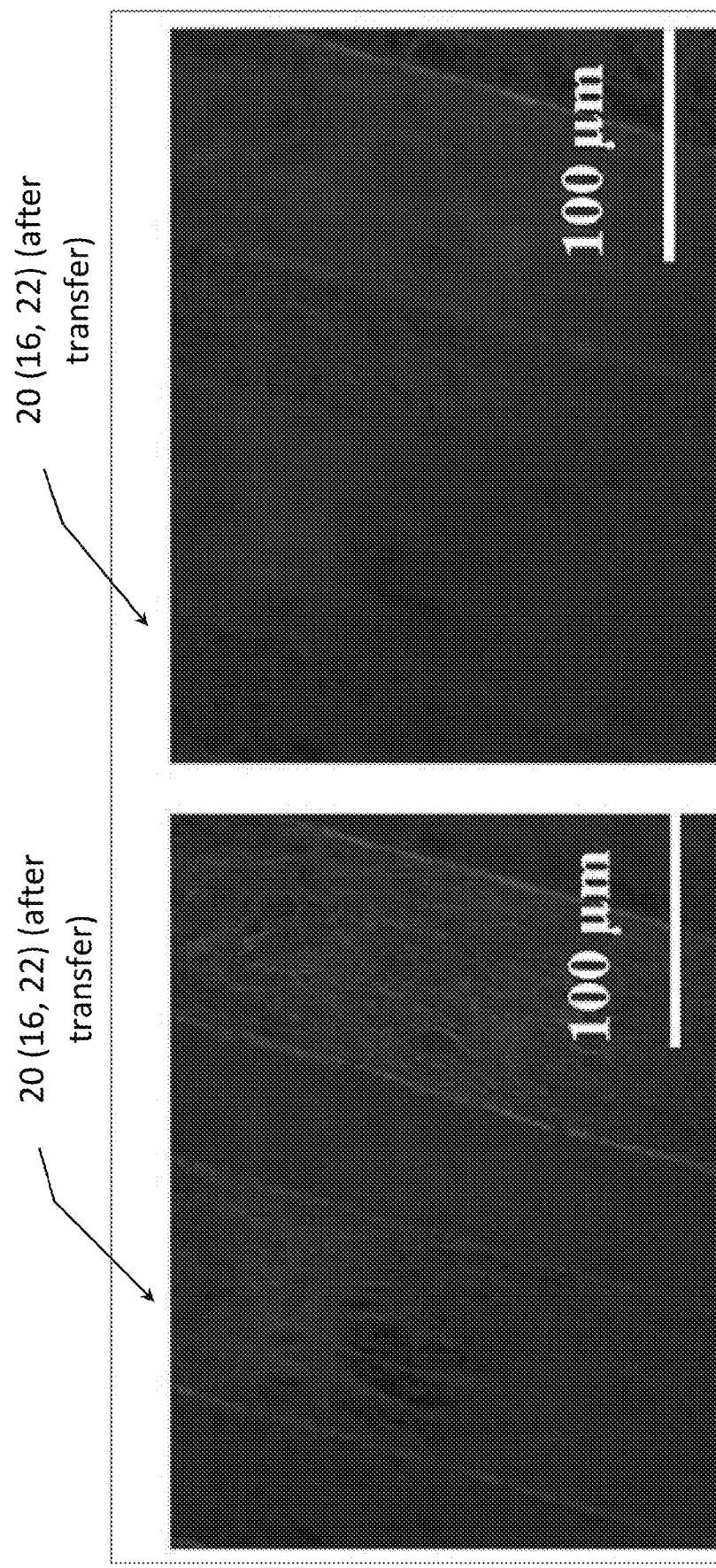
Figure 7B:
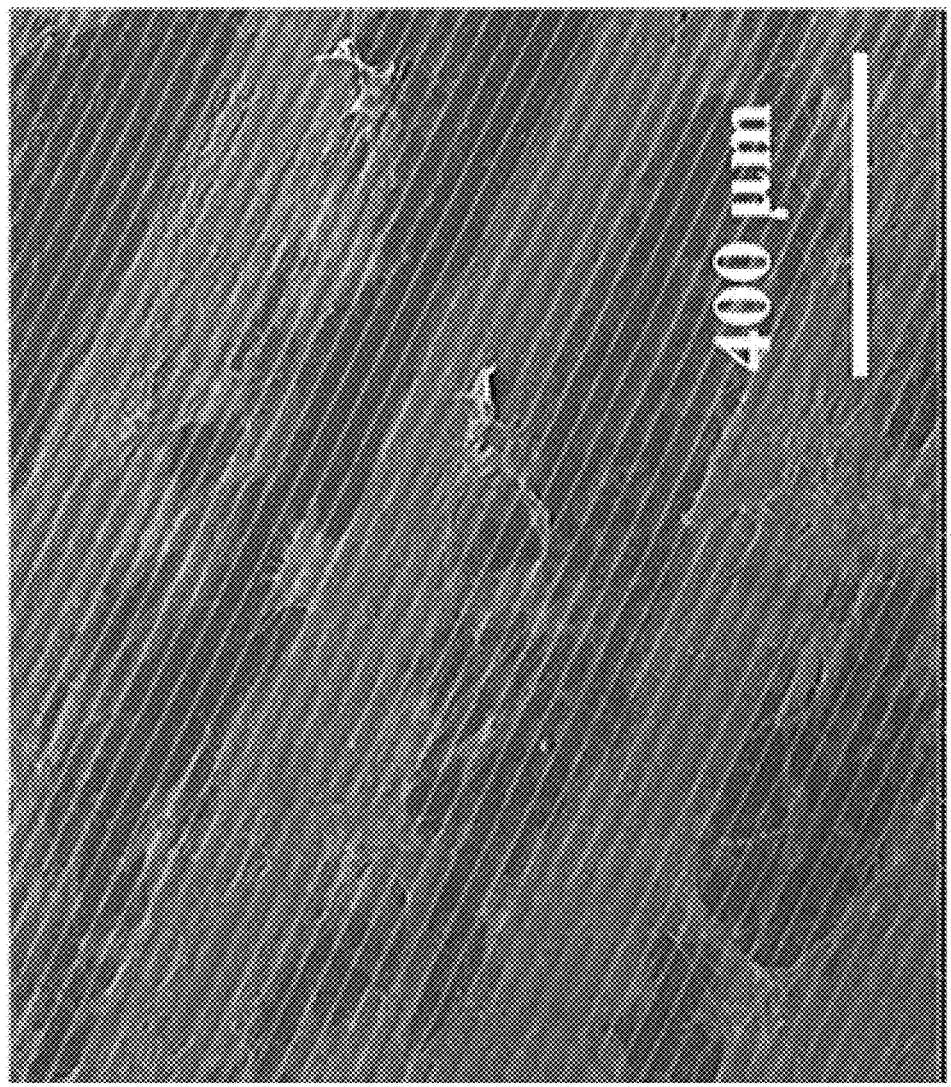
Figure 7C:
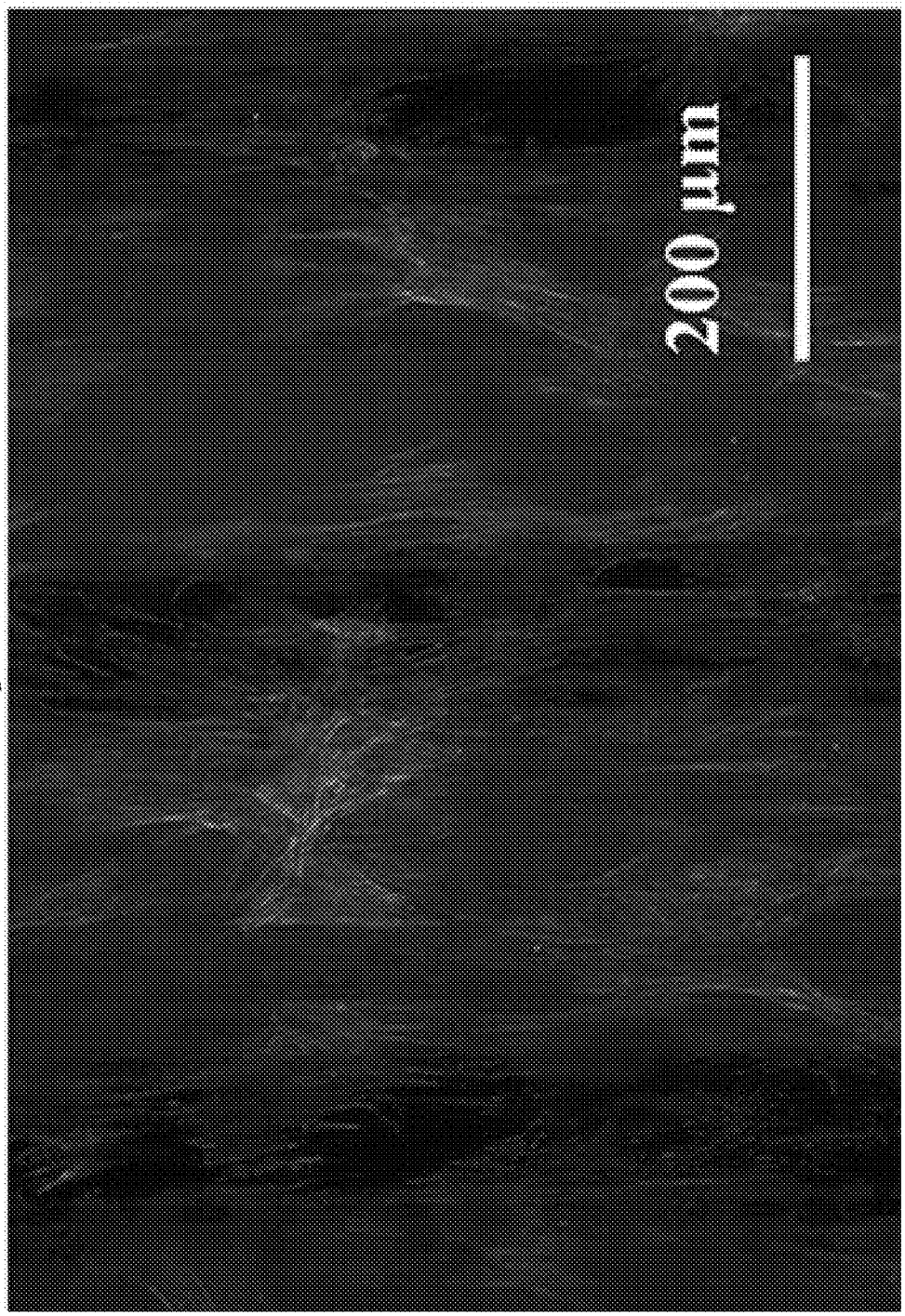
Figure 7D:
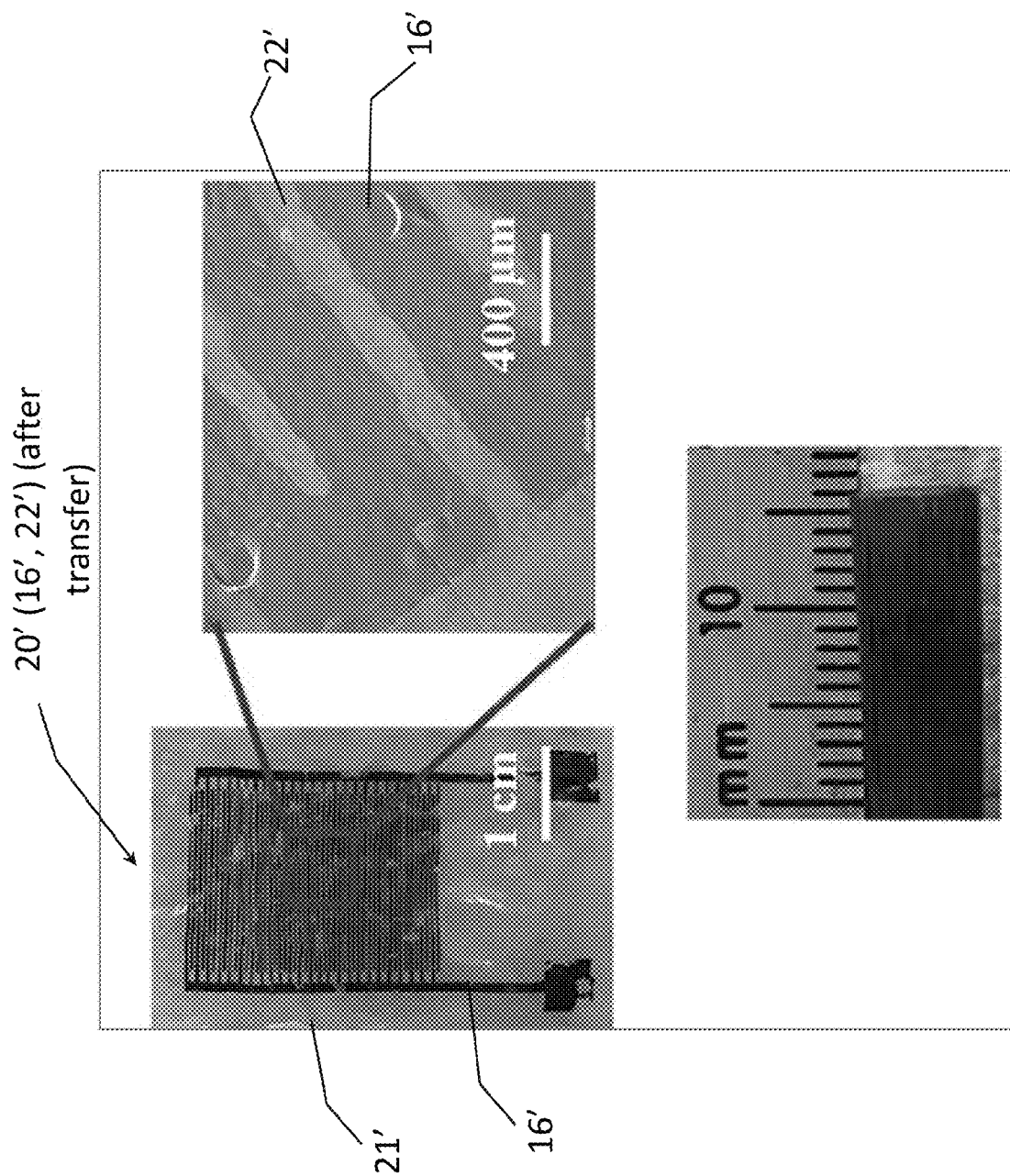
Figure 7E:
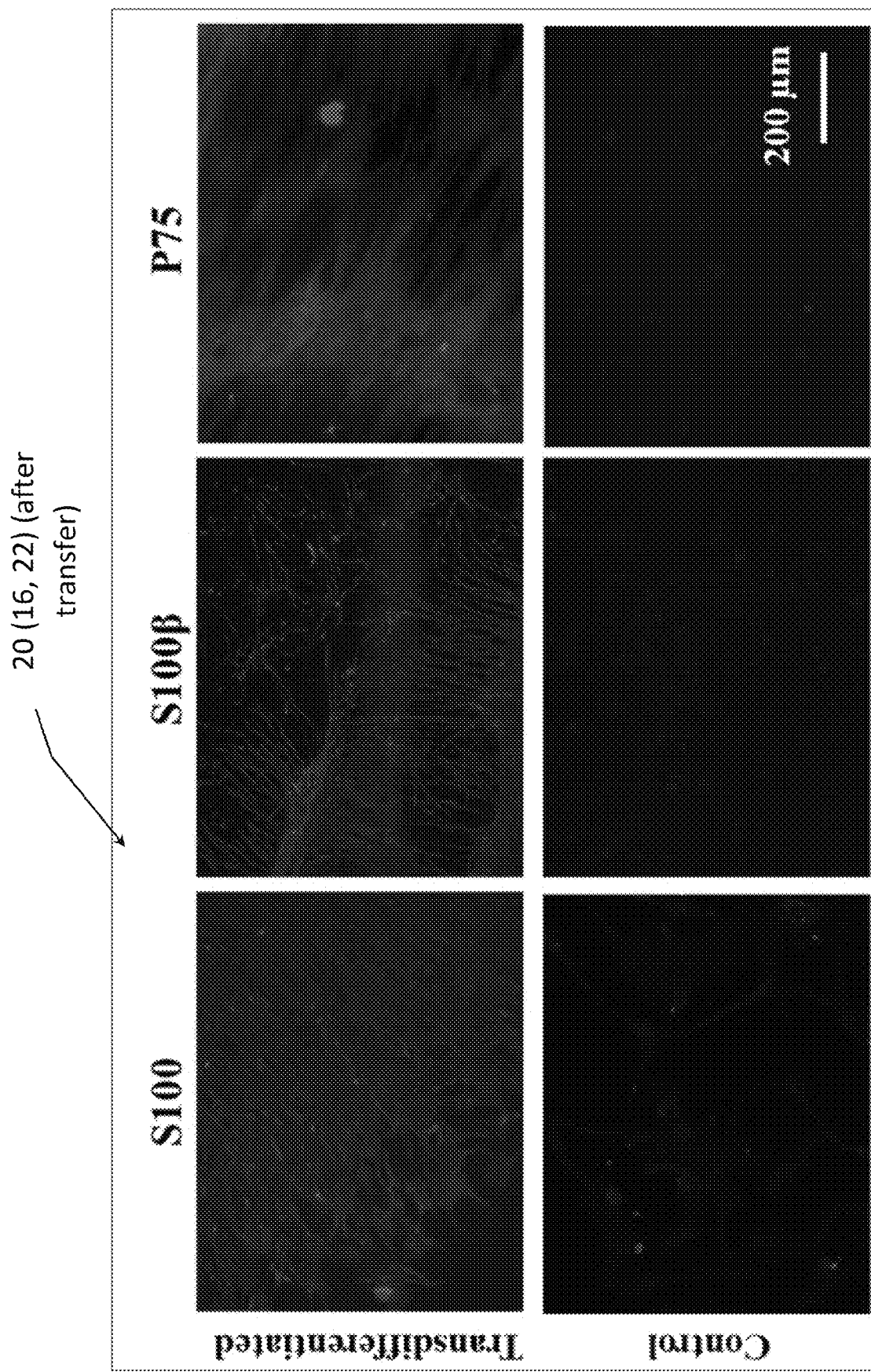

FIGS. 7a-e are highly magnified images of demonstration of using fabricated devices for controlling the transdifferentiation of MSCs into SCs using electrical stimuli according to aspects of the invention. FIG. 7(a): MSCs attaching and growing on the PLLA film and graphene patterns. FIG. 7(b,c): Directed growth of MSCs along the graphene patterns. FIG. 7(d): Graphene and PLLA-based device fabricated using microfluidic approach. FIG. 7(e): Immunocytochemistry staining of transdifferentiated MSCs with selected SCs markers.

Figures 8A, 8B, 8C, 8D, 8E:
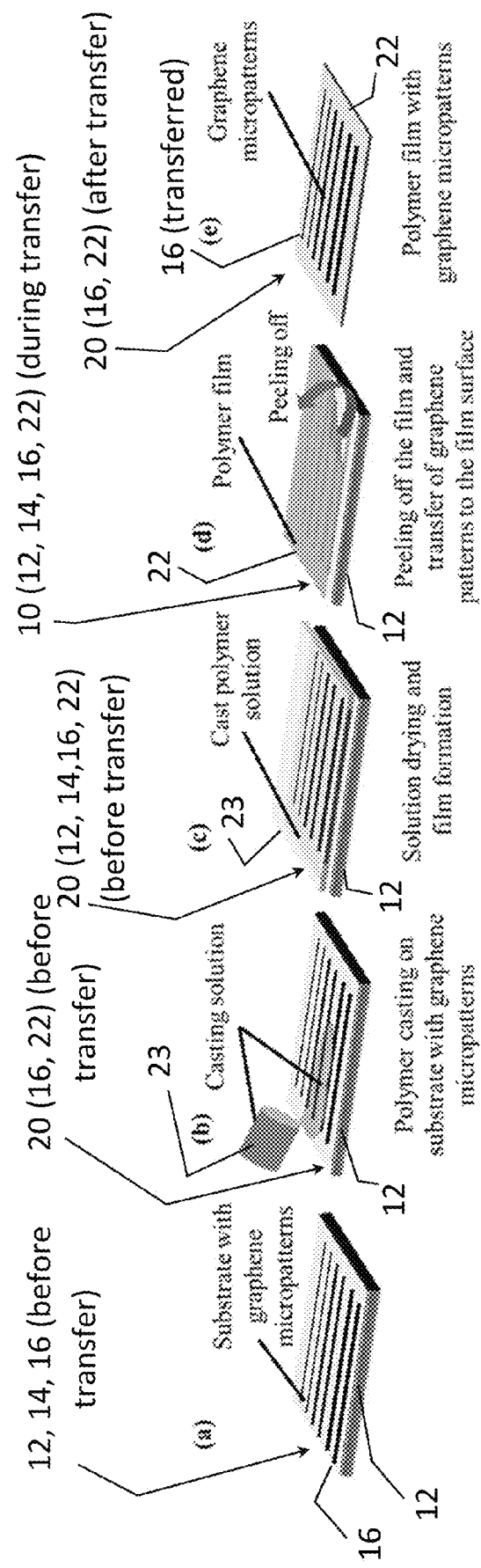

FIGS. 8a-e are diagrammatic illustrations of graphene transfer via polymer casting according to exemplary embodiments of the present invention. FIGS. 8(a-e): Schematic representation of graphene transfer via polymer casting. FIG. 8(a): Substrates with graphene micropatterns. FIG. 8(b): Casting of polymeric film formulation on substrates with graphene-based micro-circuit patterns of various feature sizes. FIG. 8(c): Drying of casting solution and film formation. FIG. 8(d): Peeling off the polymeric films and transfer of graphene-based micropatterns from the rigid or flexible substrate to the film surface. FIG. 8(e): Polymeric film with graphene micropatterns on the surface.

FIGS. 9a-9d are images that illustrate we are able to transfer any negative or positive (graphene) pattern from a rigid mold to the polymer substrate according to aspects of the present invention.

FIGS. 10a-i are images that further illustrate an exemplary method according to aspects of the present invention.

IV. DETAILED DESCRIPTION OF EXEMPLARY EMBODIMENTS OF THE INVENTION

A. Overview

For a better understanding of the invention, several specific examples of forms or embodiments it can take will now be set forth in detail. It is to be understood that these examples are neither inclusive nor exclusive of all forms and embodiment. For example, variations obvious to those skilled in the art will be included within the invention.

Additionally, some of the techniques for individual steps of the examples of the invention are based on techniques known to those skilled in the art. Additional information about them can be found in some of the references listed in the Background of the Invention supra.

Also, some of the method steps according to the invention can be practiced with reference to steps detailed in U.S. Provisional Ser. No. 62/720,693 and its non-provisional U.S. Ser. No. 16/547,239 both to inventors Uz and Mallapragada, and both of which are incorporated by reference herein in their entireties.

B. Generalized Embodiment

The methods, systems, and end products according to aspects of the invention represent a substantive departure from the state-of-the-art by developing polymeric flexible electronics with precise control on 3D microstructural and mechanical properties (such as film porosity, pore size, elasticity etc.) and with high resolutions of graphene patterns (feature dimensions of ~10 μm width/depth). The aspects of the invention can also be broadly applied to various natural or synthetic biodegradable materials with well-defined characteristics including but not limited to gelatin, collagen, chitosan, alginate, whey protein isolate, PLLA, PLGA, PVA etc.

Conventional state-of-the-art flexible electronic films are mostly non-porous, non-biodegradable and inherently planar (2D). Thus, the 3D porous microstructure, mechanical properties, flexibility and biodegradation rate of the films according to the present invention are controlled by using established phase inversion techniques, pore forming agents, plasticizers or cross-linking strategies. Development of such electrically conductive and flexible films via the methods of the invention eliminates the need for any type of expensive equipment, photolithography patterning, post-processing, transferring or stamping process and conventionally used PDMS molding or Cu foil-based transfer. This is a significant advancement over other flexible electrodes, including the metals, that require expensive pre- or post-processing and are inherently planar. The processes according to the invention also enable circuit design on biodegradable polymeric films which is not possible with chemically degrading, lithographic patterning techniques. Therefore, these environmentally-friendly (green) production methods reduce cost, energy and time spent as well as eliminate the problem of mounting electronic waste.

Advantages include at least one or more of:
1) Green production methods reducing cost, energy and time spent as well as eliminating problem of mounting electronic waste.
2) Applicable to various synthetic or natural biodegradable polymers.
3) Allows precise control on film microstructure.
4) Easy control on micropattern design and dimensions.
5) No post-processing, PDMS mold or Cu foil-based transfer, etching or other chemical, temperature or laser-based methods are needed.
6) Provides available microenvironment for such things as material-cell interfaces.
7) Available for surgical implantation.
8) Potentially can be used as microfluidic device for various applications.

This technology enables the development of biocompatible, biodegradable, flexible films with electrically-conductive graphene circuits that can be used in various applications. On a broader scale, this technology has a potential to pave the way for implantable heart sensors/stimulators, implantable brain-computer interfaces, robotics, or for low-cost wearable biosensors, integrated circuits, batteries, displays, thin film transistors and so on. Overall, this technology will open a new route for low-cost, scalable, and green production of graphene-based flexible electronics or sensors on different biodegradable polymeric substrates.

As will be appreciated, both techniques provide at least the following features:
(1) An economical, efficient, and effective formation of a high resolution pattern of conductive material. This allows, for example, quite small-scale patterns (down to 1 µm) with sufficient resolution for such things as effective microelectronics.
(2) A final end product that includes that high resolution functional pattern on any of a variety of substrates, including flexible, biodegradable, and/or biocompatible. This allows, for example, highly beneficial options in design of high resolution conductive patterns for a wide variety of applications.

Some individual steps can be practiced with reference to disclosures in U.S. Provisional Ser. No. 62/720,693 and its non-provisional U.S. Ser. No. 16/547,239 both to inventors Uz and Mallapragada, and both of which are incorporated by reference herein in their entireties.

C. Specific Embodiment(s) and Examples

1. Specific Example 1

The following specific example of practicing aspects according to the invention is taken from Metin Uz, Kyle Jackson, Maxsam S. Donta, Juhyung Jung, Matthew T. Lentner, John A. Hondred, Jonathan C. Claussen, and Surya K. Mallapragada Scientific Reports (2019) 9:10595 https://doi.org/10.1038/s41598-019-46978-z, entitled "Fabrication of High-resolution Graphene-based Flexible electronics via Polymer Casting" and which is incorporated by reference herein in its entirety.

As will be appreciated by those skilled in this technical art, these examples show proof of concept with the specific examples. Variations obvious to those skilled in the art are included in the invention which is defined by the appended claims and not necessarily limited to the specific examples set forth herein.

In these examples, a methods based on the transfer of graphene patterns from a rigid or flexible substrate onto a polymeric film surface via solvent casting was developed. The method involves the creation of predetermined graphene patterns on the substrate, casting a polymer solution, and directly transferring the graphene patterns from the substrate to the surface of the target polymer film via a peeling-off method. The feature sizes of the graphene patterns on the final film can vary from a few micrometers (as low as 5 µm) to few millimeters range. this process, applied at room temperature, eliminates the need for harsh post-processing techniques and enables creation of conductive graphene circuits (sheet resistance: ~0.2 kΩ/sq) with high stability (stable after 100 bending and 24 h washing cycles) on various polymeric flexible substrates. Moreover, this approach allows precise control of the substrate properties such as composition, biodegradability, 3D microstructure, pore size, porosity and mechanical properties using different film formation techniques. This approach can also be used to fabricate flexible biointerfaces to control stem cell behavior, such as differentiation and alignment. Overall, this promising approach provides a facile and low-cost method for the fabrication of flexible and stretchable electronic circuits.

With reference to appended FIGS. 1-8, details regarding non-limiting ways to make, use, and practice aspects of the present invention are set forth, including proof of concept data. Reference numbers will be used in the drawings to point to certain parts or locations of the drawings. In general, the reference numbers refer to the following:

| | |
|---|---|
| 10 | collectively the combination of substrate 12, pattern 14 on substrate 12 (if used), conductive material 16, and polymeric film 22 before transfer of conductive material |
| 12 | first substrate (rigid or flexible) |
| 14 | if used, 3D pattern in substrate 12 |
| 15 | any remnant conductive material on substrate 12 after transfer to film 22 |
| 16 | conductive material (whether patterned, deposited, or grown on substrate 12) |
| 17 | if used, individual nanoparticles in conductive material (e.g. nanotubes) |
| 20 | collectively the end product of polymeric film 22 with transferred conductive material 16. |
| 22 | Polymeric film (after forming in place on substrate 12 from solution) |
| 23 | Polymeric solution |
| 30 | if applicable, electrical or electronic load that can be serviced by end product 20 |

Results and Discussion

The developed method is focused on direct transfer of graphene-based patterns from rigid or flexible substrates to the polymeric flexible films via polymer casting. The method consists of three main steps; (i) Preparation of graphene-based patterns/films 16 via channel filling, ink jet printing or CVD on rigid or flexible substrates/molds 12; (ii) Casting of the target substrate polymer solution 23 on the graphene-based patterns/films 16 formed on substrates/molds 12; (iii) Drying of the solvent in solution 23 and formation of films 22 followed by peeling off the films 22 from the substrate/mold 12, transferring the graphene pattern 16 from substrate/mold 12 surface to the target polymeric film 22 surface. The application steps of the graphene transfer via direct polymer casting on rigid Delrin and ink jet printed flexible polyimide substrate 12 was shown in FIG. 1a-f, respectively. As seen in the figures, a complete transfer of graphene (negligible amount of residue) 16 was obtained for both cases. In addition, this process works for different polymers and their respective solvents (FIG. 1a-f).

The remaining amount after transfer was negligible in terms of efficacy of the transfer for at least most purposes. As will be appreciated by those skilled in this technical field, the remaining amount can change depending on the type of the mold or film material since the adhesive forces between them affects the transfer. For instance, a transfer from Teflon to PLLA resulted in a complete (100%) transfer, while some residues in graphene pattern transferred from an inkjet printed substrate to CA but they are small or negligible in terms of efficacy of the transfer.

FIG. 8 provides a diagrammatic view of steps of one example of a method of fabrication according to the invention. A starting substrate 12 can include a pattern 14 with 3D features, including at resolutions at least down to the scale of approximately 5 µm in width and depth by techniques known to those of skill in this technical art. A conductive material 16 (e.g. graphene or graphene derivative) can be applied in high resolution to pattern by any number of techniques. Thus, a high resolution patterned conductive material on substrate (12/14/16) is formed. A target polymeric solution 23 is pre-engineered and pre-selected to have desired characteristics or properties conducive to a transfer of the patterned conductive material 16 on substrate 12 to a target polymeric film 22 that will be formed in situ on the patterned substrate/conductive material combination 12/14/16. Target solution 23 is cast over combination 12/14/16. This forms combination 10, namely, the collective combination of substrate 12 with pattern 14, conductive material 16 following pattern 14, and cast target polymeric solution 23. Solution 23 forms in situ into a film 22 with adhesion to patterned conductive material 16. Removal (e.g. peel off) of film 22 transfers patterned conductive material 16 from substrate 12 to film 22 retaining resolution of pattern 14 to form end product 20, namely film 22 with transferred conductive patterned material 16.

This method is also versatile and can be applied to many different polymeric materials including but not limited to PLLA, PLGA, CA, GEL and WPI films (FIG. 1g-j). It was noted that almost 100% of the graphene patterns present on the substrates were successfully transferred to the polymeric film surface (FIG. 1). This high transfer efficacy could be mostly attributed to the surface properties, particularly the hydrophobicity of the substrate material 12. The hydrophobic substrates 12, such as Delrin, Teflon or polyimide, make it easy to remove the formed films 22 along with the graphene pattern transfer 16. It was observed that this process does not depend on the polarity or viscosity of the polymer solution 23 since the natural or synthetic polymers dissolved in polar or non-polar solvents. For instance, 10% PLLA dissolves in chloroform, which is a non-polar solvent, while 5% GEL or WPI dissolve in water, which is a polar solvent. For both cases we observed 100% of graphene transfer. Practically, the polymer casting-based graphene patterning and transfer technique utilizes adhesion forces of two contacting materials at the interface and their respective surface energies[22]. The difference in the surface energies between the polymer solution 23 and graphene patterns 16 upon the formation of polymeric films 22 makes it possible to remove the graphene pattern 16 precisely from the solid mold surface 12 and transfer the patterned graphene 16 onto the polymeric film surface 22. The work of adhesion at the graphene-polymer interface is higher than the work of adhesion at the graphene-mold interface, which makes the complete transfer of graphene possible as described in Equation 1[22]

$$W_{A-B} = 4\left( \frac{\gamma_A^d \gamma_B^d}{\gamma_B^d + \gamma_B^d} + \frac{\gamma_A^p \gamma_B^p}{\gamma_B^p + \gamma_B^p} \right) \quad (1)$$

where $\gamma^d$ and $\gamma^p$ correspond to the dispersion and polar components of surface energy ($\gamma = \gamma^d + \gamma^p$). The theoretically calculated work of adhesion between each material interface support the proposed hypothesis. For instance, $^W$Graphene-Delrin (77 mJ/m$^2$)<$^W$Graphene-PLLA (90 mJ/m$^2$); $^W$Graphene-Delrin (77 mJ/m$^2$)<$^W$Graphene-PLGA (88 mJ/m$^2$); and $^W$Graphene-Delrin (77 mJ/m$^2$)<$^W$Graphene-GEL (88 mJ/m$^2$).

This graphene transfer approach can also be used to transfer the graphene patterns 16 from one flexible substrate 12' to another. For instance, we already demonstrated that the graphene patterns 16', ink jet printed (no pattern 14 in flexible substrate 12' is used) and post-processed (laser or thermal annealed), can easily be transferred to 3D microstructured and porous CA-based films 22' using polymer casting approach (FIG. 1d-f). The successful transfer of graphene 16' can also be supported by the calculated work of adhesion at the interface of graphene-polyimide 16'/12' and graphene-CA 16'/22', $W_{Graphene-Polyimide}$ (86 mJ/m$^2$) <$W_{Graphene-CA}$ (94 mJ/m$^2$). Therefore, this fabrication approach allows formation of high-resolution patterns on the surfaces of versatile polymeric films as long as their free surface energies are sufficiently different to enable strong adhesion to one another. Similarly, we also demonstrated the potential of the direct polymer casting and peeling approach for the transfer of CVD grown graphene 16 as illustrated in FIG. 2. The graphene films 16 grown on copper foil ($W_{Graphene-Cu}$=46 mJ/m$^2$) (FIG. 2a) and quartz (FIG. 2b) as well as graphene-silver nanowire 17' grown on quartz ($W_{Graphene-Quartz}$=66 mJ/m$^2$) (FIG. 2c) substrates 12 via CVD approach were successfully transferred to the PLLA polymer surface 22 ($W_{Graphene-PLLA}$=90 mJ/m$^2$) using our direct polymer casting approach. After the transfer, we did not observe a significant change in the resistance of graphene films 20, which indicates the efficiency of the transfer.

Note just a few non-limiting examples of pattern form factors possible (e.g. compare FIGS. 1a-g with the transferred patterns 16A', 16B', 16C' in FIG. 1h.

The conductivity of graphene was enhanced by applying thermal annealing (pre-annealing temperature of 75° C. for 3 h for 60 mg/mL concentration) prior to the application of graphene solution 23 to create the substrate 12 patterns 14 via the channel filling approach. The transferred graphene 16 via polymer casting has the sheet resistance of ~0.2 kΩsq. Similarly, the ink jet printed and laser annealed graphene 16 was also transferred from flexible polyimide substrate 12 to CA substrate 22, which has the sheet resistance of ~0.7 kΩ/sg[59].

It is possible to control the conductivity by changing the pre-annealing temperature along with the amount of graphene used for the filling approach. The effect of pre-annealing temperature on the graphene structure can also be observed via XPS analysis (FIG. 3a). The XPS analysis of graphene pattern on the PLLA film surface revealed the presence of classical C-C(~284.5 eV), C=O (~287.8 eV) and O—C=O (~288.9 eV) graphene peaks[60,61] along with additional peaks around 282.7 eV, which potentially stems from the existence of graphene layers on the sample (FIG. 3a). With the increase in pre-annealing temperature from 25° C. to 75° C., we did not notice a significant change in C-C(~284.5 eV), C=O (~287.8 eV) and O—C=O (~288.9 eV) graphene peaks, whereas a significant decrease in 282.7 eV peak, accompanied by a slight shift toward ~281.5 eV, was also observed, indicating the structural change upon pre-annealing. These peaks formed at binding energies around 282 eV are not classical graphene peaks, which generally can be observed in the range of 284-288 eV[60], but could stem from the car-bides in the structure of graphene[62]. Carbides are also known as excellent semiconductors and simple thermal annealing induces an in situ transformation of silicon carbide films into the graphene matrix[62-65]. Therefore, the decrease in the carbide peak upon temperature annealing could be another reason for enhanced conductivity. In addition, we also observed formation of a dense and compact graphene structure as the pre-annealing temperature increases to 75° C. (FIG. 3a). The reduction in the GNP size and increase in surface area after pre-annealing and probe sonication, observed in TEM images (FIG. 3b,c), could also be another reason for enhanced electrical conductivity due to the continuous and densely packed graphene platelets within the film microchannels.

In FIG. 3b, the GNP structure can be observed (non-annealed), while the structure of graphene was changed from nanoplatelet form to small particulate form upon pre-annealing and sonication (FIG. 3c). The change in the GNP size upon annealing and sonication was also confirmed by dynamic light scattering measurements. The non-annealed GNP size was around ~600 nm while upon annealing and sonication it became ~250 nm. The result of these structural changes is also reflected in the conductivity of the formed patterns. The increase in pre-annealing temperature resulted in a significant decrease in the sheet resistance of graphene patterns (FIG. 3d).

The dense, compact and continuous filling of graphene patterns on the PLLA film surface are shown in FIG. 4. The 3D porous microstructure of substrate material was observed using dry-phase inversion technique on PLLA film (FIG. 4a). Using polymer casting method, it is possible to precisely control the microstructure of variety of substrate material, including but not limited with natural/synthetic or biodegradable/non-biodegradable polymers, which is not possible to obtain with currently available flexible electronic fabrication techniques. This demonstrate the versatility of our approach. FIG. 4b demonstrates the graphene pattern with 500 µm of width and 200 of µm depth along with the structure of graphene on the PLLA film surface. In addition to this, it is also possible to obtain graphene patterns with small feature size. As shown in FIG. 4c, we were able to obtain graphene patterns on PLLA film surface with as low as 15 µm of width and 5 µm of depth. Although we have demonstrated examples mostly based on PLLA, it should be noted that this method is universal and can be applied to any type of polymer. FIG. 4d displays Raman spectra for the transferred graphene on the PLLA film surface. The distinct and classical D, G, and 2D peaks (~1350, 1580, and 2700 $cm^{-1}$, respectively) was observed[59,66]. Samples show a small D peak associated with lattice structure imperfections and edge plane defects in the graphene, as well as large G/2D peaks characteristic of sp2-hybridizated carbon (graphite/graphene structure)[59]. Graphene patterns displayed low ($I_G/I_D$) ratio (0.33±0.01), which demonstrates that the transferred material is most adequately characterized as a multi-layer graphene structure[67-69].

The obtained graphene patterns showed significant stability after multiple bending and washing cycles (FIG. 5a,b). In addition, their assembly on the film surface is mechanically strong, and even after multiple stick and peel cycles using a commercially available adhesive tape, the graphene patterns were stable (FIG. 5c). Therefore, the graphene patterns obtained with polymer casting approach exhibited good stability and conductivity to obtain active circuits (FIG. 5d). These circuits boards were made of graphene patterns of 300 µm width and 100 µm depth connected to a 9V battery through copper wiring to light up an LED 30 (with electrical leads 31 L and R in electrical communication with the transferred graphene pattern 16). In addition, they maintained their conductivity as the sheet resistance did not change after multiple washing and bending cycles (FIG. 5e).

As an alternative to the flexible electronics, this novel method can also be used to fabricate stretchable electronics. For this purpose, we fabricated flexible and stretchable WPI films with conductive graphene patterns using polymer casting method. The initial length of WPI film with graphene patters was 5 cm (FIG. 6a). A cyclic stretching test (5 cycles: 3 times of 2 cm stretching and retraction) was applied to detect the changes in the graphene pattern structure and resistance (FIG. 6b,c). FIG. 6b indicated that after cyclic stretching test there was no significant change in the graphene structure, which also resulted in the observation of stable resistance in the graphene patterns as illustrated in FIG. 6c. Then, the WPI film was stretched gradually (1 cm each time) up to 10 cm (FIG. 6d). FIG. 6d,e show that after 5 cm of stretching, the graphene structure started to break its continuity due to the effect of extension, which in turn resulted in increased resistance and decreased conductivity (FIG. 6e). The patterns were able to maintain their resistance around 2 kΩ up to 2 cm stretching (final extension till 7 cm) after which the resistance increased up to 9 kΩ when the stretching reached to 5 cm (final extension till 10 cm). This is clearly due to the discontinuity of the graphene patterns upon stretching as indicated in SEM images. Nevertheless, this experiment indicated that it is possible to fabricate stretchable electronic circuits with polymer casting method.

These results clearly demonstrate that it is easy, fast, green and cost effective to fabricate graphene-based flexible and stretchable electronic devices on various biodegradable and biocompatible polymeric flexible substrates with proper 3D microstructural properties, small feature sizes and high-resolutions via the mentioned method. Therefore, the fabricated devices can be used in various biomedical and healthcare applications. Considering this, we conducted additional experiments to demonstrate the potential use of the developed devices with polymer casting method for controlling the stem cell differentiation.

In our previous studies, we showed precise control of the transdifferentiation of stem cells using mechanical, physical, topographical, chemical and electrical cues for peripheral nerve regeneration purposes[70-73]. Very recently, we have demonstrated the successful transdifferentiation of mesenchymal stem cells (MSCs) into Schwann cells (SCs) using electrical stimuli through ink jet printed and laser annealed graphene circuits on flexible polyimide substrates[70]. Although the transdifferentiation was successful, the non-biodegradable and non-porous nature of polyimide substrate limits the potential translation of this strategy for surgical implantation and clinical applications related to nerve regeneration. Therefore, the fabrication of such graphene-based circuit on biodegradable, 3D microstructured and porous substrates could make the surgical and clinical application of this strategy possible[74]. Therefore, the in situ-in vivo precise control on MSCs differentiation, migration and fate commitment upon the surgical implantation could be possible[75]. Considering this, we developed the same device (graphene circuit ink jet printed and laser annealed on polyimide substrate) on biodegradable, 3D microstructured and porous PLLA films using our graphene transfer via polymer casting approach as described above.

We first investigated the attachment, growth and alignment of MSCs on the graphene patterns on the PLLA films. As demonstrated in FIG. 7a, MSCs grew both on the PLLA surface and graphene micropatterns. In addition, FIG. 7b,c also demonstrated the directed alignment of the MSCs along with the graphene patterns suggesting potential control on directional growth. FIG. 7d shows the graphene circuit design on PLLA films fabricated using graphene transfer method. FIG. 7d also illustrates that these circuits can be rolled into conduits as implants for specific peripheral nerve regeneration surgeries implying that they can potentially be used for other surgical or clinical applications. Following the attachment and growth of the MSCs on the devices, a specific electrical stimulus (100 mV at 50 Hz for 10 min per day for 10 days) was applied to the MSCs based on our previous study in order to differentiate them into SC-like phenotypes[70]. Our results showed that almost ~90% of the cells got immunolabelled with the selected SC markers suggesting the successful transdifferentiation (FIG. 7e). These results are in accordance with our previously published findings[70] demonstrating the potential of the device and our new fabrication method. These results also confirm the use of this technology to control MSCs differentiation and further enables its potential application for surgical and clinical translation by developing biodegradable and biocompatible devices with our new polymer casting approach.

CONCLUSIONS

This novel method enables the fabrication of flexible electronics based on graphene and various polymeric substrates with precise control of 3D microstructural and mechanical properties (such as film porosity, pore size, elasticity etc.). The flexibility in the polymeric material selection along with precise control on substrate properties, enables the potential use of the developed devices in biomedical applications or implantations. In addition, with this approach it is possible to obtain graphene patterns with high resolution, low feature size (as low as 5 µm; 15 µm width and 5 µm depth), high conductivity (sheet resistance of ~0.2 kΩ/sq) and high stability (maintains sheet resistance after 100 bending and 24 h washing cycles). Moreover, this is a novel, facile, versatile, scalable and cost-effective manufacturing approach that eliminates the need for expensive equipment (except for initial lithography to create small microchannel patterning for the molds), physical or chemical post-processing or complex transferring/stamping processes. Furthermore, this is an alternative approach to the conventionally used PDMS molding or Cu foil-based transfer methods. Overall, this promising method has the potential to pave the way for flexible and stretchable electronics fabrication, particularly for the biomedical applications including but not limited to brain-computer interfaces, robotics or lab/organ-on-a-chip.

Methods

Preparation of substrates with graphene patterns/films. The Teflon or Delrin substrates with small feature size micropatterns were prepared using computer numerical control (CNC) machine while the silicon wafer molds with small pattern features were prepared using photolithography only once. The pattern dimensions were varied between 5 to 400 µm in width and dept. Graphene nanoplatelet (Sigma Aldrich) solution, sonicated and thermally annealed (at 75° C.) prior to application (pre-annealing), was used to fill the micropatterns. The excess graphene on the substrate was removed and cleaned by sticking and peeling a commercially available scotch tape, which leaves the graphene in the patterns[46]. In another approach, a graphene pattern was ink jet printed on a rigid or flexible polyimide substrate and thermally or laser annealed (to enhance the conductivity) to create graphene substrates[59,70,76]. In addition, graphene and silver nanowire films were grown on quartz and Cu foil substrates via conventional CVD method[23,77].

Polymer casting, film formation and transfer of graphene. Following formation of graphene patterns on the substrates using the techniques mentioned above, the polymer casting solutions were prepared at desired formulations and concentrations. The polymer solution (could be Poly-L-Lactic Acid (PLLA), Cellulose Acetate (CA), Gelatin (GEL), Poly Lactic-co-Glycolic Acid (PLGA) or Whey Protein Isolate (WPI)) was then cast on the substrate with graphene patterns/films and left for drying. The 3D microstructure, mechanical properties, porosity and pore size of the films can be adjusted via well-established phase inversion techniques or use of pore forming or plasticizer agents. Upon the film formation, the film was peeled off and graphene patterns were transferred from the substrates to flexible film surface (FIG. 8a-e). This polymer casting approach can be applied for both rigid and flexible graphene substrates.

Characterization of the prepared devices. The stability of the graphene patterns on the polymer devices was tested through multiple washing, bending and peeling-off cycles. The conductivity of the devices was determined by building up a circuit and measuring resistance. The microstructure of graphene patterns and devices were characterized through scanning electron microscopy (SEM) (FEI Quanta 250 FE-SEM), x-ray photoelectron spectroscopy (XPS) (Amicus XPS) and Raman spectroscopy (Bruker FT-Raman Spectrometer) analysis. SEM samples were sputter coated with 2 nm iridium before the analysis and images were taken using secondary electron mode. Monochromatic Al Kα X-ray source (1486.6 eV) was used in XPS analysis with an electron take-off angle 45° from a normal sampling surface. Survey scans were collected from 10 eV to 1100 eV with a pass energy of 187.85 eV. Raman spectra were collected with a backscattering geometry, 1064 nm Nd:YAG laser and a spot size of about 1 mm.

Use of graphene devices as biointerfaces. We investigated the potential use of the fabricated devices as bio-interfaces to control the stem cell behavior. We used Brown Norway rat mesenchymal stem cell (MSCs), which were provided by Dr. Donald S. Sakaguchi in Genetics, Development and Cell Biology Department at Iowa State University.

The MSCs isolation procedure from Brown Norway rats was conducted in accordance with the NIH Guide for the Care and Use of Laboratory Animals guidelines and the principles in the "Guidelines for the Use of Animals in Neuroscience Research" presented by the Society for Neuroscience. All animal procedures had the approval of the Iowa State University Institutional Animal Care and Use Committee and were performed in accordance with committee guidelines.

MSCs were plated in T75 flasks in maintenance media (MM), consisting of a minimum essential medium (αMEM, Gibco BRL), 20% fetal bovine serum (FBS; Atlanta Biologicals), 4 mM 1-glutamine (Gibco), and antibiotic-antimycotic (Invitrogen) and incubated at 37° C. and 5% $CO_2$. MSCs were sub-cultured when they reached 80% confluency approximately every 2-3 days.

The ink jet printed graphene patterns with finger dimensions of 400 µm finger width and 250 µm finger-to-finger spacing were transferred to the surface of PLLA film by applying polymer casting method and the obtained devices were used for electrical transdifferentiation of MSCs. $2 \times 10^5$ cells were seeded on devices and electrical transdifferentiation into Schwan cell-like phenotypes (SCs) was conducted exactly as described in our previous work[70]. At the end of transdifferentiation, immunocytochemical analysis was performed on MSCs possessing SC-like phenotypes seeded on the device using selected SC markers, s100, s1001β and p75 as described previously[70].

REFERENCES FOR SPECIFIC EXAMPLE 1

1. Jang, H. et al. Graphene-Based Flexible and Stretchable Electronics. *Advanced Materials* 28, 4184-202, https://doi.org/10.1002/adma.201504245 (2016).
2. Lee, C., Wei, X., Kysar, J. W. & Hone, J. Measurement of the Elastic Properties and Intrinsic Strength of Monolayer Graphene. *Science* 321, 385 (2008).
3. Xu, K. et al. The positive piezoconductive effect in graphene. *Nature Communications* 6, 8119, https://doi.org/10.1038/ncomms9119, https://www.nature.com/articles/ncomms9119 #supplementary-information (2015).
4. Jo, J. W., Lee, J. U. & Jo, W. H. Graphene-based electrodes for flexible electronics. *Polymer International* 64, 1676-1684, https://doi. org/10.1002/pi.4981 (2015).
5. Kizil, H., Pehlivaner, M. O. & Trabzon, L. Surface Plasma Characterization of Polyimide Films for Flexible. *Electronics. Advanced Materials Research* 970, 132-135, https://doi.org/10.4028/www.scientific.net/AMR.970.132 (2014).
6. Madaria, A. R., Kumar, A., Ishikawa, F. N. & Zhou, C. Uniform, highly conductive, and patterned transparent films of a percolating silver nanowire network on rigid and flexible substrates using a dry transfer technique. *Nano Research* 3, 564-573, https://doi. org/10.1007/s12274-010-0017-5 (2010).
7. Schwartz, G. et al. Flexible polymer transistors with high pressure sensitivity for application in electronic skin and health monitoring. *Nature Communications* 4, 1859, https://doi.org/10.1038/ncomms2832, https://www.nature.com/articles/ncomms2832 #supplementary-information (2013).
8. Wang, C. et al. Extremely Bendable, High-Performance Integrated Circuits Using Semiconducting Carbon Nanotube Networks for Digital, Analog, and Radio-Frequency Applications. *Nano Letters* 12, 1527-1533, https://doi.org/10.1021/nl2043375 (2012).
9. Wang, Y. et al. Super-Elastic Graphene Ripples for Flexible Strain Sensors. *ACS Nano* 5, 3645-3650, https://doi.org/10.1021/nn103523t (2011).
10. Wiria, F. E. et al. Improving surface quality of polyethylene terephthalate film for large area flexible electronic applications. *Journal of Solid State Electrochemistry* 20, 1895 https://doi.org/10.1007/s10008-015-3021-6 (2016).
11. Ishikawa, F. N. et al. Transparent Electronics Based on Transfer Printed Aligned Carbon Nanotubes on Rigid and Flexible Substrates. *ACS Nano* 3, 73-79, https://doi.org/10.1021/nn800434d (2009).
12. Lee, Y.-H. et al. Wearable Textile Battery Rechargeable by Solar Energy. *Nano Letters* 13, 5753-5761, https://doi.org/10.1021/n 1403860k (2013).
13. Pu, X. et al. A Self-Charging Power Unit by Integration of a Textile Triboelectric Nanogenerator and a Flexible Lithium-Ion Battery for Wearable Electronics. *Advanced Materials* 27, 2472-2478, https://doi.org/10.1002/adma.201500311 (2015).
14. Zheng, Y., He, Z., Gao, Y. & Liu, J. Direct Desktop Printed-Circuits-on-Paper Flexible. *Electronics. Scientific Reports* 3, 1786, https://doi.org/10.1038/srep01786 (2013).
15. Amjadi, M., Kyung, K.-U., Park, I. & Sitti, M. Stretchable, Skin-Mountable, and Wearable Strain Sensors and Their Potential Applications: A Review. *Advanced Functional Materials* 26, 1678-1698, https://doi.org/10.1002/adfm.201504755 (2016).
16. Ho Dong, H. et al. Stretchable and Multimodal All Graphene Electronic Skin. *Advanced Materials* 28, 2601-2608, https://doi.org/10.1002/adma.201505739 (2016).
17. Hou, C., Wang, H., Zhang, Q., Li, Y. & Zhu, M. Highly Conductive, Flexible, and Compressible All-Graphene Passive Electronic Skin for Sensing Human Touch. *Advanced Materials* 26, 5018-5024, https://doi.org/10.1002/adma.201401367 (2014).
18. Jiao, Y. et al. Wearable Graphene Sensors With Microfluidic Liquid Metal Wiring for Structural Health Monitoring and Human Body Motion Sensing. *IEEE Sensors Journal* 16, 7870-7875, https://doi.org/10.1109/JSEN.2016.2608330 (2016).
19. Mannoor, M. S. et al. Graphene-based wireless bacteria detection on tooth enamel. *Nature Communications* 3, 763, https://doi.org/10.1038/ncomms1767, https://www.nature.com/articles/ncomms1767#supplementary-information (2012).
20. Tung, T. T., Castro, M., Kim, T. Y., Suh, K. S. & Feller, J.-F. Graphene quantum resistive sensing skin for the detection of alteration biomarkers. *Journal of Materials Chemistry* 22, 21754-21766, https://doi.org/10.1039/C2JM34806C (2012).
21. Wu, C. et al. Large-area graphene realizing ultrasensitive photothermal actuator with high transparency: new prototype robotic motions under infrared-light stimuli. *Journal of Materials Chemistry* 21, 18584-18591,https://doi.org/10.1039/C1JM13311J(2011).
22. Oren, S., Ceylan, H., Schnable Patrick, S. & Dong, L. High-Resolution Patterning and Transferring of Graphene-Based Nanomaterials onto Tape toward Roll-to-Roll Production of Tape-Based Wearable Sensors. *Advanced Materials Technologies* 2, 1700223, https://doi.org/10.1002/admt.201700223 (2017).
23. Chen, M., Haddon, R. C., Yan, R. & Bekyarova, E. Advances in transferring chemical vapour deposition graphene: a review. *Materials Horizons* 4, 1054-1063, https://doi.org/10.1039/C7MH00485K (2017).
24. Chen, S., Jiang, K., Lou, Z., Chen, D. & Shen, G. Z. Recent Developments in Graphene-Based Tactile Sensors and E-Skins. *Advanced Materials Technologies* 3, https://doi.org/10.1002/admt.201700248 (2018).
25. Hofmann, M., Hsieh, Y.-P., Hsu, A. L. & Kong, J. Scalable, flexible and high resolution patterning of CVD graphene. *Nanoscale* 6, 289-292, https://doi.org/10.1039/C3NR04968J (2014).
26. Li, X. et al. Large-Area Synthesis of High-Quality and Uniform Graphene Films on Copper Foils. *Science* 324, 1312 (2009).
27. Yong, K., Ashraf, A., Kang, P. & Nam, S. Rapid Stencil Mask Fabrication Enabled One-Step Polymer-Free Graphene Patterning and Direct Transfer for Flexible Graphene Devices. *Scientific Reports* 6, 24890, https://doi.org/10.1038/srep24890, https://www.nature.com/articles/srep24890 #supplementary-information (2016).
28. Ma, Y. & Zhi, L. Graphene-Based Transparent Conductive Films: Material Systems, Preparation and Applications. *Small Methods* 3, 1800199, https://doi.org/10.1002/smtd.201800199 (2019).
29. Li, D. D., Lai, W. Y., Zhang, Y. Z. & Huang, W. Printable Transparent Conductive Films for Flexible Electronics. *Advanced Materials* 30, https://doi.org/10.1002/adma.201704738 (2018).
30. Li, Q. L. et al. Review of Printed Electrodes for Flexible Devices. *Frontiers in Materials* 5, https://doi.org/10.3389/fmats.2018.00077 (2019).
31. Novoselov, K. S. et al. Electric field effect in atomically thin carbon films. *Science* 306, 666-669, https://doi.org/10.1126/science. 1102896 (2004).
32. Wang, L. et al. Simple and Large-Scale Strategy to Prepare Flexible Graphene Tape Electrode. *ACS Applied Materials & Interfaces* 9, 9089-9095, https://doi.org/10.1021/acsami.6b14624 (2017).
33. Lee Joong, S. et al. Wafer-Scale Patterning of Reduced Graphene Oxide Electrodes by Transfer-and-Reverse Stamping for High Performance OFETs. *Small* 9, 2817-2825, https://doi.org/10.1002/sml1.201300538 (2013).
34. He, Q. et al. Centimeter-Long and Large-Scale Micropatterns of Reduced Graphene Oxide Films: Fabrication and Sensing Applications. *ACS Nano* 4, 3201-3208, https://doi.org/10.1021/nn100780v (2010).
35. Song, D. et al. High-Resolution Transfer Printing of Graphene Lines for Fully Printed, Flexible Electronics. *ACS Nano* 11, 7431-7439, https://doi.org/10.1021/acsnano.7b03795 (2017).
36. Zhou, H. et al. Transfer Printing and its Applications in Flexible Electronic Devices. *Nanomaterials (Basel)* 9, 283, https://doi. org/10.3390/nano9020283 (2019).
37. Abhilash, T. S., De Alba, R., Zhelev, N., Craighead, H. G. & Parpia, J. M. Transfer printing of CVD graphene 38. Lee, J. S. et al. Wafer-Scale Patterning of Reduced Graphene Oxide Electrodes by Transfer-and-Reverse Stamping for High Performance OFETs. *Small* 9, 2817-2825, https://doi.org/10.1002/smll.201300538 (2013).
39. Seo, J. et al. Direct Graphene Transfer and Its Application to Transfer Printing Using Mechanically Controlled, Large Area Graphene/Copper Freestanding Layer. *Advanced Functional Materials* 28, 1707102, https://doi.org/10.1002/adfm.201707102 (2018).
40. Jeong, S. et al. Graphene electrodes transfer-printed with a surface energy-mediated wet PDMS stamp: impact of Au doped-graphene for high performance soluble oxide thin-film transistors. *Journal of Materials Chemistry C* 1, 5632-5637, https://doi. org/10.1039/C3TC31292E (2013).
41. Hong, J.-Y. & Jang, J. Micropatterning of graphene sheets: recent advances in techniques and applications. *Journal of Materials Chemistry* 22, 8179-8191, https://doi.org/10.1039/C2JM00102K (2012).
42. Kamyshny, A. & Magdassi, S. Conductive nanomaterials for 2D and 3D printed flexible electronics. *Chemical Society Reviews* 48, 1712-1740, https://doi.org/10.1039/c8cs00738a (2019).
43. Kang, K., Cho, Y. & Yu, K. J. Novel Nano-Materials and Nano-Fabrication Techniques for Flexible Electronic Systems. *Micromachines* 9, https://doi.org/10.3390/mi9060263 (2018).
44. Zardetto, V., Brown, T. M., Reale, A. & Di Carlo, A. Substrates for flexible electronics: A practical investigation on the electrical, film flexibility, optical. *temperature, and solvent resistance properties. Journal of Polymer Science Part B: Polymer Physics* 49, 638-648, https://doi.org/10.1002/polb.22227 (2011).
45. Bettinger, C. J. Recent advances in materials and flexible electronics for peripheral nerve interfaces. *Bioelectronic Medicine* 4, 6, https://doi.org/10.1186/s42234-018-0007-6 (2018).
46. Oren, S., Ceylon, H., Schnable, P. S. & Dong, L. High-Resolution Patterning and Transferring of Graphene-Based Nanomaterials onto Tape toward Roll-to-Roll Production of Tape-Based Wearable Sensors. *Advanced Materials Technologies* 2, https://doi. org/10.1002/admt.201700223 (2017).
47. Lee, J., Lee, S. & Yu, K. H. Contamination-Free Graphene Transfer from Cu-Foil and Cu-Thin-Film/Sapphire. *Coatings* 7, https://doi. org/10.3390/coatings7120218 (2017).
48. Wagner, S. et al. Graphene transfer methods for the fabrication of membrane-based HEMS devices. *Microelectronic Engineering* 159, 108-113, https://doi.org/10.1016/j.mee.2016.02.065 (2016).
49. Leong, W. S. et al. Paraffin-enabled graphene transfer. *Nature Communications* 10, 867, https://doi.org/10.1038/s41467-019-08813-x (2019).
50. Chandrashekar, B. N. et al. A Universal Stamping Method of Graphene Transfer for Conducting Flexible and Transparent Polymers. *Scientific Reports* 9, 3999, https://doi.org/10.1038/s41598-019-40408-w (2019).
51. Sun, J. et al. Electrochemical Bubbling Transfer of Graphene Using a Polymer Support with Encapsulated Air Gap as Permeation Stopping Layer. *Journal of Nanomaterials* 2016, 7, https://doi.org/10.1155/2016/7024246 (2016).
52. Song, D., Secor, E. B., Wang, Y., Hersam, M. C. & Frisbie, C. D. Transfer Printing of Sub-5 µm Graphene Electrodes for Flexible Microsupercapacitors. *ACS Applied Materials & Interfaces* 10, 22303-22310, https://doi.org/10.1021/acsami.8b06235 (2018).
53. Comanescu, F. C. et al. In 2017 *International Semiconductor Conference International Semiconductor Conference* 55-58 (2017).
54. Ko, P. J. et al. Simple method to transfer graphene from metallic catalytic substrates to flexible surfaces without chemical etching. *Journal of Physics: Conference Series* 433, 012002, https://doi.org/10.1088/1742-6596/433/1/012002 (2013).
55. Tang, L. et al. Printable Metal-Polymer Conductors for Highly Stretchable Bio-Devices. *iScience* 4, 302-311, https://doi. org/10.1016/j.isci.2018.05.013 (2018).
56. Gao, W. et al. Fully integrated wearable sensor arrays for multiplexed in situ perspiration analysis. *Nature* 529, 509-514, https://doi. org/10.1038/nature16521 (2016).
57. Tan, D. & Nijholt, A. In *Brain-Computer Interfaces: Applying our Minds to Human-Computer Interaction* (eds Desney S. Tan & Anton Nijholt) 3-19 (Springer London, 2010).
58. Viventi, J. et al. A Conformal, Bio-interfaced Class of Silicon Electronics for Mapping Cardiac Electrophysiology. *Science translational medicine* 2, 24ra22-24ra22, https://doi.org/10.1126/scitranslmed.3000738 (2010).
59. Das, S. R. et al. 3D nanostructured inkjet printed graphene via UV-pulsed laser irradiation enables paper-based electronics and electrochemical devices. *Nanoscale* 8, 15870-15879 (2016).
60. Gao, G. et al. Heat-Initiated Chemical Functionalization of Graphene. *Scientific Reports* 6, 20034, https://doi.org/10.1038/srep20034, https://www.nature.com/articles/srep20034#supplementary-information (2016).
61. Han, F. et al. Surface plasmon enhanced photoluminescence of ZnO nanorods by capping reduced graphene oxide sheets. *Optics express* 22, 11436-11445, https://doi.org/10.1364/oe.22.011436 (2014).
62. Nygren, K., Andersson, A. M., Eklund, P. & Jansson, U. Passive films on nanocomposite carbide coatings for electrical contact applications. *Journal of Materials Science* 52, 8231-8246, https://doi.org/10.1007/s10853-017-1039-0 (2017).
63. Yu, X., Zhang, Z., Liu, F. & Ren, Y. Synthesis of transfer-free graphene on cemented carbide surface. *Scientific Reports* 8, 4759, https://doi.org/10.1038/s41598-018-23206-8 (2018).
64. Bonaccorso, F. et al. Production and processing of graphene and 2d crystals. *Materials Today* 15, 564-589, https://doi.org/10.1016/S1369-7021(13)70014-2 (2012).
65. Ivan, S., Volodymyr, K. & Rositsa, Y. Combining graphene with silicon carbide: synthesis and properties—a review. *Semiconductor Science and Technology* 31, 113004 (2016).
66. Hernandez, Y. et al. High-yield production of graphene by liquid-phase exfoliation of graphite. *Nat Nanotechnol* 3, 563 (2008).
67. Wong, F. R., Ali, A. A., Yasui, K. & Hashim, A. M. Seed/Catalyst-Free Growth of Gallium-Based Compound Materials on Graphene on Insulator by Electrochemical Deposition at Room Temperature. *Nanoscale Res Lett* 10, 233 (2015).
68. Hondred, J. A., Medintz, I. & Claussen, J. C. Enhanced Electrochemical Biosensor and Supercapacitor with 3D Porous Architectured Graphene via Salt Impregnated Inkjet Maskless Lithography. *Nanoscale Horizons* (2019).
69. He, Q. et al. Enabling Inkjet Printed Graphene for Ion Selective Electrodes with Postprint Thermal Annealing.

ACS Applied Materials & Interfaces 9, 12719-12727, https://doi.org/10.1021/acsami.7b00092 (2017).
70. Das, S. R. et al. Electrical Differentiation of Mesenchymal Stem Cells into Schwann-Cell-Like Phenotypes Using Inkjet-Printed Graphene Circuits. *Advanced Healthcare Materials* 6, https://doi.org/10.1002/adhm.201601087 (2017).
71. Sharma, A. D. et al. Proteomic analysis of mesenchymal to Schwann cell transdifferentiation. *Journal of Proteomics* 165, 93-101, https://doi.org/10.1016/j.jprot.2017.06.011 (2017).
72. Sharma, A. D. et al. Oriented growth and transdifferentiation of mesenchymal stem cells towards a Schwann cell fate on micropatterned substrates. *Journal of bioscience and bioengineering* 121, 325-335, https://doi.org/10.1016/j.jbiosc.2015.07.006 (2016).
73. Uz, M. et al. Gelatin-based 3D conduits for transdifferentiation of mesenchymal stem cells into Schwann cell-like phenotypes. *Acta Biomaterialia* 53, 293-306, https://doi.org/10.1016/j.actbio.2017.02.018 (2017).
74. Uz, M., Sharma, A. D., Adhikari, P., Sakaguchi, D. S. & Mallapragada, S. K. Development of multifunctional films for peripheral nerve regeneration. *Acta Biomater*, https://doi.org/10.1016/j.actbio.2016.09.039 (2016).
75. Uz, M. et al. Advances in Controlling Differentiation of Adult Stem Cells for Peripheral Nerve Regeneration. *Advanced Healthcare Materials* 7, 1701046, https://doi.org/10.1002/adhm.201701046 (2018).
76. Das, S. R. et al. Superhydrophobic inkjet printed flexible graphene circuits via direct-pulsed laser writing. *Nanoscale* 9, 19058-19065, https://doi.org/10.1039/C7NR06213C (2017).
77. Zhao, C. et al. Large-area chemical vapor deposition-grown monolayer graphene-wrapped silver nanowires for broad-spectrum and robust antimicrobial coating. *Nano Research* 9, 963-973, https://doi.org/10.1007/s12274-016-0984-2 (2016).

D. Specific Example 2

Additional examples of ways to make, use, and practice aspects of the invention are set forth below with particular reference to appended FIGS. 9a-d.

1. Method of Creating High Resolution Starting Pattern

As will be appreciated by those skilled in this technical field, a simple, versatile, high-resolution, and scalable patterning of a starting substrate can be achieved in a variety of ways. One example is on polymeric films (including biodegradable polymer films) by the formation of polymeric films with different surface micropatterns via solvent casting on micropatterned molds.

Procedure: The polymer solutions are cast on Teflon molds (5×5 cm), with different patterns and dimensions (width: from 10 to 500 µm and depth: from 10 to 300 µm) and left for overnight drying. Preparation of super-hydrophobic Teflon molds with different patterns is easy, fast, cheap and they can be reused multiple times. Therefore, they can be a promising alternative to PDMS based molds. Following the overnight drying, the films are peeled off, where the patterns on the molds are transferred to the films' surface.

Details about specific formulations of polymeric solutions or graphene-based solutions for use in this embodiment are set forth above.

The illustrations of FIGS. 9a-d assist in an understanding of this example:

FIG. 9a: Shows (see scale ruler) a starting substrate (e.g. Teflon) with formed micropatterns (e.g. high resolution parallel channels of 3D controlled structure). Note how this example shows different 3D structure of different sections of the mold (thinner versus thicker parallel ridges in the mold). It is possible to have different depths and between ridges and even along ridges.

FIG. 9b: Shows a polymer-based solution coated over the micropatterned starting substrate.

FIG. 9c: Shows how the micropattern in starting substrate is transferred to the polymer-based film by drying the polymer-based solution in place on the starting substrate and then removing or peeling the dried polymer film away. Importantly, by control of the solution and the drying, the original high resolution micropattern is effectively transferred to the polymer film keeping on the order of resolution of the starting micropattern but now in the polymer film.

Figure 9D:
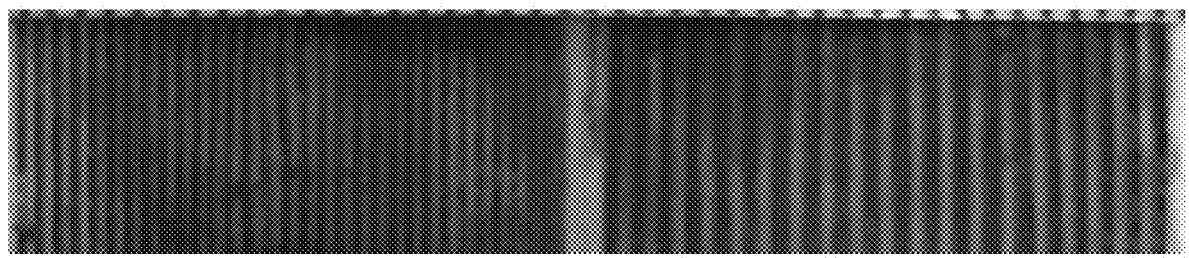

FIG. 9d: Shows several examples of the final end product of polymer film with graphene in the micropatterns.

As described earlier, the polymer solutions and the conductive-particle-based solutions can be pre-configured to effectuate the end product, including some pre-processing of the conductive-particle-based solution, while in solution (e.g. annealing), to control physical, electrical, and other characteristics. As can be appreciated by the foregoing, the original high resolution mold can be produced in a number of ways on the first substrate. The structural features of the mold can be made to be 2D or 3D with such high resolution. Because the mold does not have to be the final polymer-based thin film, a variety of techniques that are relatively economical can produce such 2D or 3D high resolution structures. Then, the high resolution mold can be relatively economically, quickly, effectively used to transfer the micropattern to a thin film polymer-based layer. As is appreciated by those skilled in the art, such thin polymer-based films have mechanical, temperature, and other characteristics that could negatively influence any attempt to create such high resolution 2D or 3D patterns into such material. As discussed above, the transferred micropattern in polymer-based film is then at least partially filled with material such as conductive-particle-based (e.g. graphene). It assumes the 2D or 3D structural features of the micropattern, adheres to the polymer-based film, and, thus, is an economical, effective combination of high resolution conductive micropattern on/in thin polymer-based film. Also, pre-processing of the conductive-particle-based material (e.g. heating) can be done apart from the polymer-based thin film, again protecting the polymer-based thin film from damage, deformation, or other changes that would materially affect the high resolution.

2. Alternative Example of Starting Pattern and Solvent Casting Method

With reference to FIGS. 10a-i, an alternative similar to Specific Example 1 is set forth.

Method: This method is focused on direct transfer of graphene-based patterns from different solid or flexible substrates to the polymeric flexible films via solvent casting. The method consists of three main steps; (i) preparation of graphene-based patterns via microfluidic approach on patterned solid substrates (Teflon, glass or Silicon wafer) (ii) casting of the polymer solution on the graphene-based patterns formed on solid substrates (iii) drying of the solvent and formation of films followed by peeling off the films from the substrate, transferring the graphene pattern to the polymeric film surface.

Procedure: Teflon, glass or silicon wafer-based substrates with different patterns and dimensions (width: from 10 to 500 μm and depth: from 10 to 300 μm) are prepared using CNC machine or lithography. Then, the graphene nanoflake solution (concentrations varying from 20 to 100 mg/mL in 70% ethanol and thermally annealed at ~75° C. or higher for more than 3 hours) is pumped through the microchannels at certain volume and flow rate using a syringe pump set up. Alternatively, ink jet printing of graphene patterns on flexible polyimide substrates or any other substrate can also be used for graphene-based pattern formation. After the formation of graphene-based patterns, the polymer solution is cast on the patterned substrates at certain volume via direct pouring or spin casting. After the solvent drying, the formed films are peeled off from the substrate surface and the graphene patters are transferred to the biodegradable polymer-based flexible film surface.

Details about specific formulations of polymeric solutions or graphene-based solutions for use in this embodiment are set forth above.

Figure 10A:
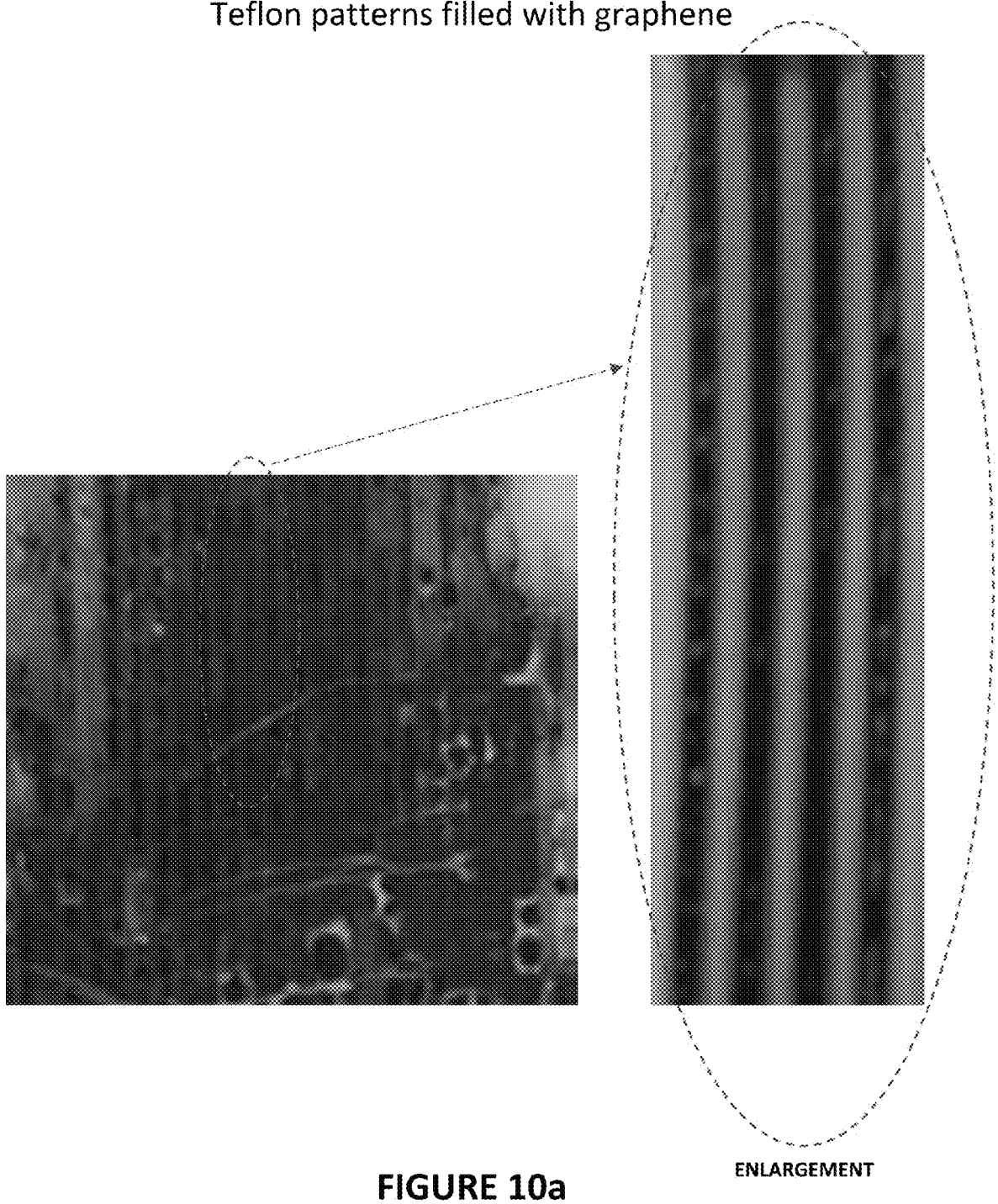

The illustrations of FIGS. 10a-h assist in an understanding of this example:

FIG. 10a: Shows (on small general scale as FIG. 9a) a starting substrate (e.g. Teflon) with either (a) formed micropatterns (e.g. high resolution parallel channels of 3D controlled structure) with those channels filled with a conductive-particle-based material (e.g. graphene) to controllable height, or (b) a graphene pattern of 2D or 3D form factors along each of its portions on the substrate (e.g. by inkjet printing directly on a substrate surface). Thus, a high resolution graphene micropattern/Teflon substrate combination is presented.

Figure 10B:
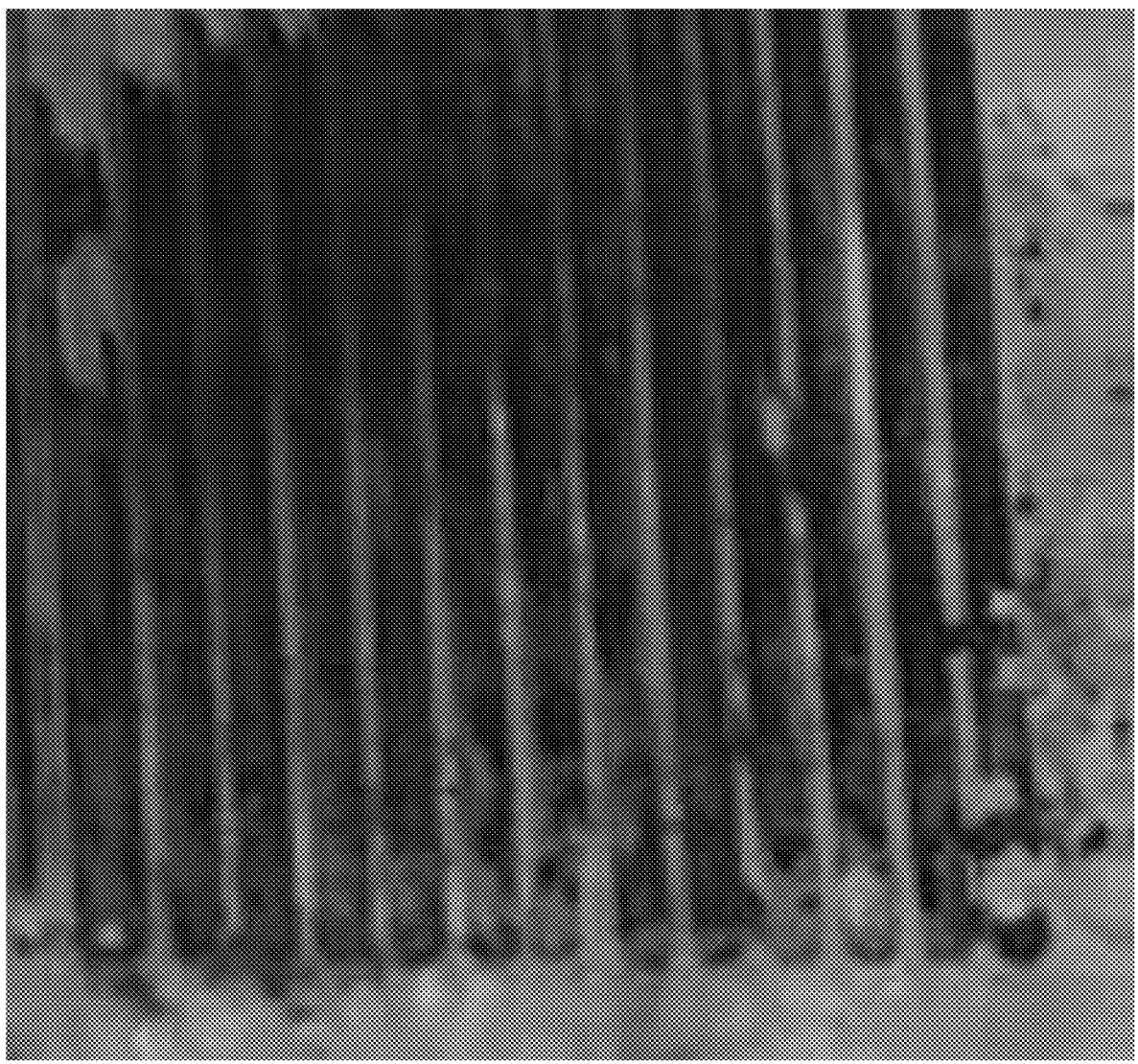

FIG. 10b: Shows polymer-based solution coated over the graphene micropatterned starting substrate. Note how the polymer-based solution in this example is transparent enough that the underlying graphene-filled micropatterned starting substrate can be seen in this image. Once the polymer-based solution is dried in place, it is peeled off.

Figure 10C:
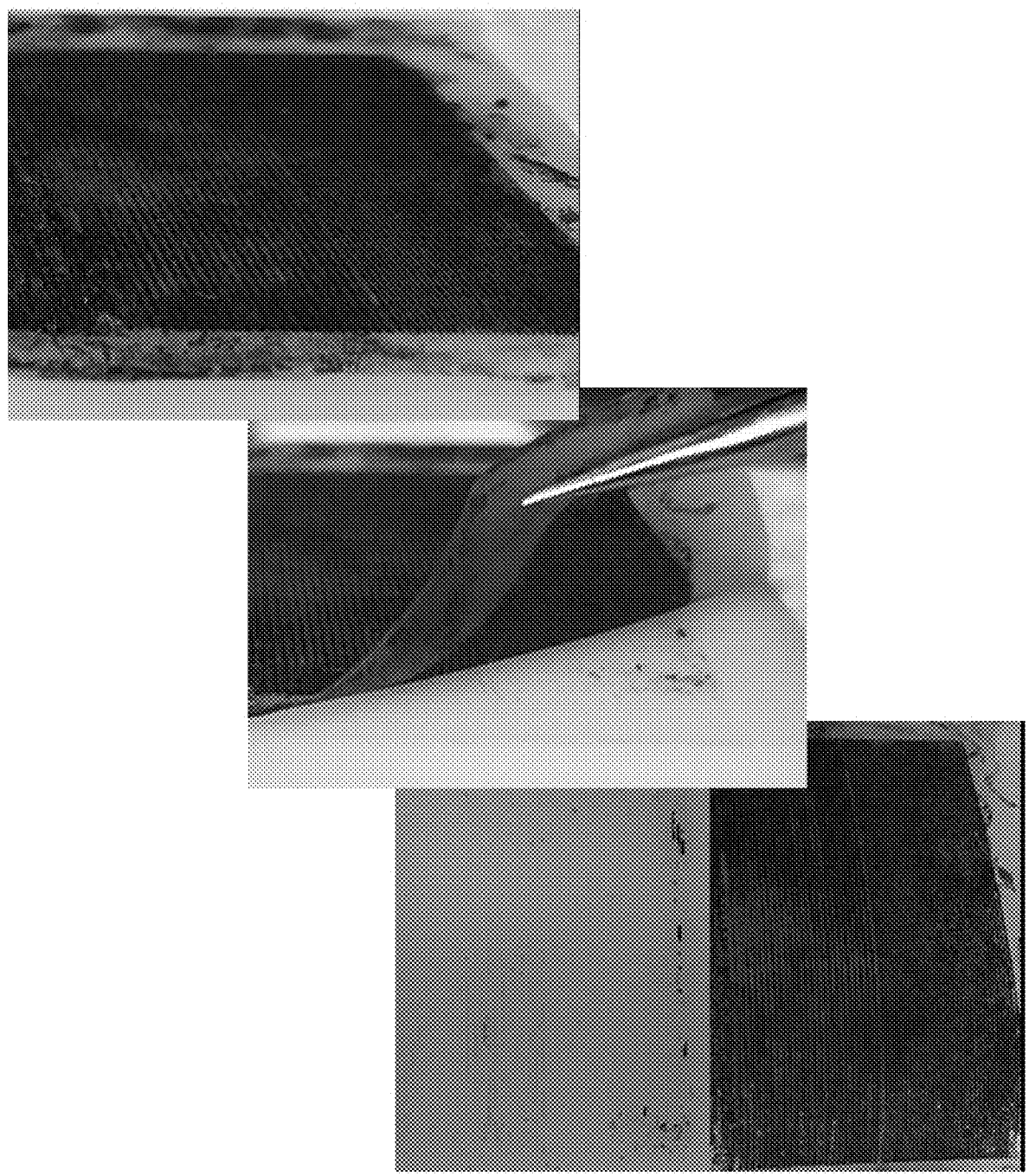

FIG. 10c: Shows how micropattern in starting Teflon substrate is now devoid of most of the graphene after the polymer layer is peeled off, because the graphene adheres more strongly to the dried polymer than the Teflon.

FIGS. 10d-h (including multiple frames): Shows steps of the process, here an ink jet printed graphene micropattern on polyimide substrate transferred to cellulose acetate film by selected frames from movie.

Frame at T1 shows an inkjet printed graphene micropattern on polyimide starting substrate (yellow or top film) to which a cellulose acetate (clear layer) has been coated. Frame at T1 shows combination inverted so that cellulose acetate (clear) layer is on bottom and polyimide starting substrate (yellow) is on top so that tweezers grips one edge of polyimide and begins peel off of the polyimide starting substrate (yellow). Not how a substantial replica, with on the order of the same high resolution, of the original inkjet printed graphene pattern on the yellow polyimide adheres to, and thus is transferred to, the clear cellulose acetate layer.

Frame at T2 shows further peeling away of the yellow polyimide layer, the starting substrate, from the clear end product cellulose acetate layer, including how replica of micropatterned graphene of starting substrate is transferred to the cellulose acetate film.

Frame at T3 shows the yellow polyimide film completely separated by peeling away from the clear cellulose acetate layer and the transferred graphene micropattern.

Frame at T4 shows how the high resolution of the micropattern of the starting yellow substrate is effectively transferred to the second substrate (clear). Noe how a slight residual remnant of graphene stays with the yellow starting substrate but that the bulk of graphene is transferred, with resolution intact, to the clear cellulose acetate second substrate.

Frame at T5 shows flexible nature of both the thin polyimide starting substrate and the thin film cellulose acetate with transferred micropattern of graphene.

Figure 10I:
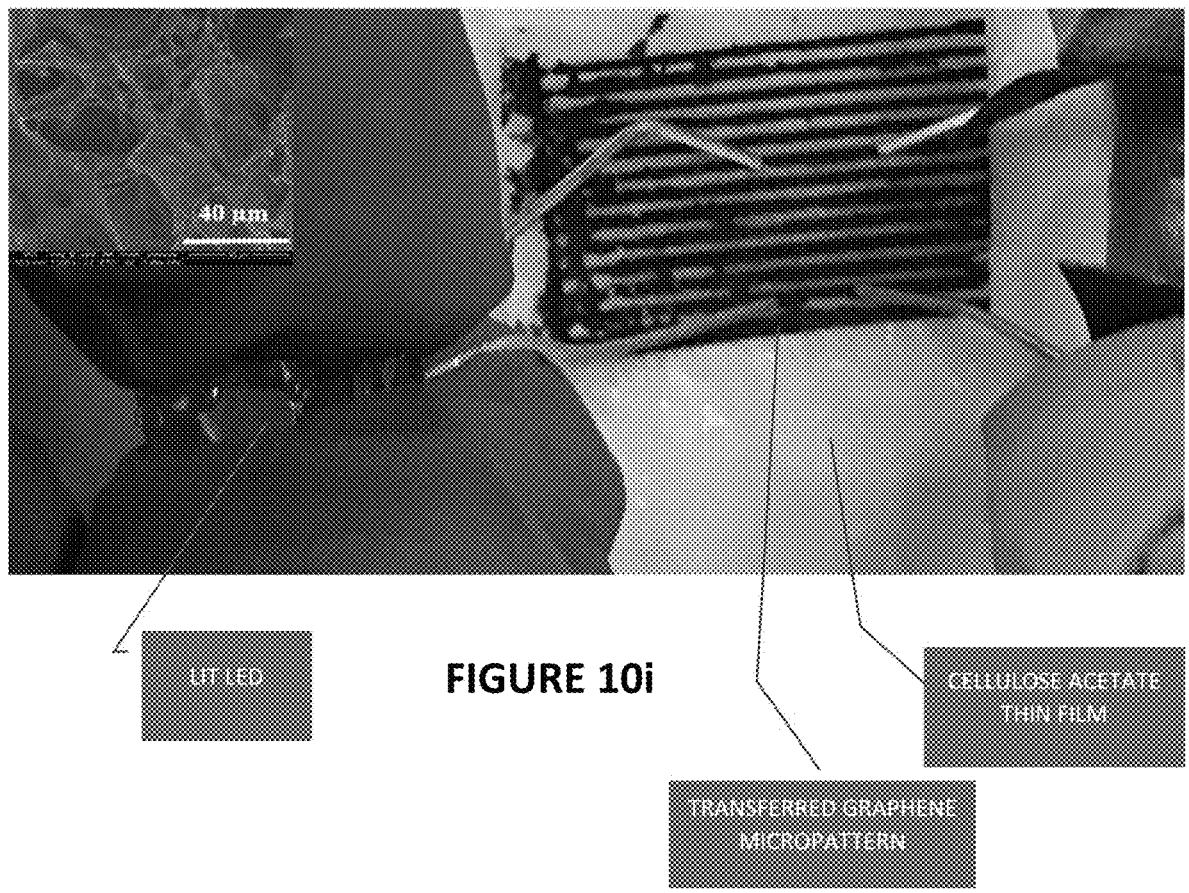

FIG. 10i: Shows how a transferred micropattern of graphene on polymer-based film (such as with the technique of FIGS. 10a-h, has sufficient high resolution, continuity, and 3D structure to function as high resolution electrical circuit to both connect to electrical power and conduct electrical power for electrical/electronic circuit applications (here showing power to two spaced apart graphene traces (two right side wires) to power up a blue LED (two left side wires). The inset in upper left corner illustrates the integrity of the transferred graphene at high magnification.

As described earlier, the polymer solutions and the conductive-particle-based solutions can be pre-configured to effectuate the end product, including some pre-processing of the conductive-particle-based solution, while in solution (e.g. annealing), to control physical, electrical, and other characteristics.

As can be appreciated by the foregoing, the original high resolution micropattern of material (e.g. graphene or other conductive particles or material) can be produced in a number of ways directly on the first substrate. One example is by direct inkjet printing to that first substrate. The structural features of that pattern can be made to be 2D or 3D with high resolution by control of the printing. Note that, in this example, the starting substrate is itself a thin film and a polymer (e.g. polyimide). But a variety of techniques that are relatively economical can produce such 2D or 3D high resolution structures. Then, the high resolution micropattern on the starting substrate can be relatively economically, quickly, effectively transferred to another thin film polymer-based layer (e.g. cellulose acetate). As is appreciated by those skilled in the art, polyimide has mechanical, temperature, and other characteristics that could negatively influence any attempt to create such high resolution 2D or 3D patterns by some techniques but is sufficient to effectively receive inkjet printed material (e.g. can have relatively high heat-resistance and is relatively rugged) even in film form. As discussed above, the micropattern of material on the starting polyimide substrate is then at least substantially transferred, including its 2D or 3D structural features, from the starting substrate by peeling away from the second polymer-based thin film substrate, and, thus, is an economical, effective final combination of high resolution conductive micropattern on/in thin polymer-based film.

E. Options and Alternatives

As indicated above, the examples in this detailed description are for purposes of better understanding of the invention but not as limitations to the invention. Some examples of options and alternatives are set forth above. Variations obvious to those skilled in this technical art are also included.

The invention claimed is:

1. A method of fabrication of high resolution conductive patterns on polymeric substrates comprising:
   a. forming a high resolution pattern with 3D features in a starting substrate;
   b. forming an end product comprising a combination of a high-resolution conductive pattern based on the high resolution pattern on a polymeric substrate by:
      (1) creating a high resolution pattern on the starting substrate filled with a conductive material, coating the patterned conductive material on the starting substrate with a polymeric solution, drying the polymeric solution in a manner effective to promote adherence of the patterned conductive material to the dried polymeric layer, and peeling the dried polymeric layer and adhered conductive material from the starting substrate to transfer the dried conductive material in the high resolution pattern from the starting substrate to the dried polymeric layer.

2. The method of claim 1 wherein the high-resolution pattern is made by a micropatterning technique with 3D channel features in the approximate ranges of 5 to 500 um in width and 5 to 300 um in depth.

3. The method of claim 1 wherein the combination of the high-resolution conductive pattern on the polymeric substrate is used in an application comprising one of:
   a. microelectronics including but not limited to;
      i. robotics;
      ii. wearable biosensors;
      iii. ICs;
      iv. batteries;
      v. displays;
      vi. thin film transistors;
      vii. RFID/NFC tools;
      viii. pressure sensors;
   b. micro environments for material-cell interface;
   c. surgical implantation including but not limited to one of:
      i. heart sensors/stimulators;
      ii. brain-computer interfaces; or
   d. microfluidic device uses.

4. The method of claim 1 wherein the conductive material on the starting substrate comprises:
   a. forming a conductive solution of graphene nano-flakes in concentrations in the range of 20 to 100 mg/mL in 70% alcohol;
   b. thermally annealing the conductive solution at ~75 degrees C. or higher for more than three hours;
   c. filling the annealed conductive solution on the Teflon, glass, or silicon-wafer based substrate with pattern; and
   d. drying in place the filled annealed conductive solution on the patterned substrate.

5. The method of claim 1 wherein the coating with polymeric solution comprises:
   a. casting by direct pouring or spin casting a polymer solution on the combined dried conductive material and patterned starting substrate; and
   b. drying the polymer solution in place to a thin film effective to create an adhesion between conductive material and polymeric thin film that is stronger than any adhesion between conductive material and the starting substrate.

6. The method of claim 1 wherein the starting substrate comprises a polymer-based material including but not limited to polyimide or any other rigid substrate to which inkjet printing can be applied.

7. The method of claim 1 wherein the micropattern is inkjet printed onto the starting substrate.

8. The method of claim 1 wherein the polymeric layer comprises cellulose acetate.

9. The method of claim 1 wherein the peeling of the dried thin target polymer film comprises:
   a. peeling the target polymer film effective to overcome any adhesive force between conductive material and the starting substrate; but
   b. keeping intact the high resolution pattern of the conductive material and the thin polymer film to effectively transfer the high resolution pattern of conductive material from the starting substrate to the polymer film substrate.

10. A method of fabrication of high resolution conductive patterns on polymeric substrates comprising:
    a. forming a high resolution pattern with 3D features in a starting substrate;
    b. forming an end product comprising a combination of a high-resolution conductive pattern based on the high resolution pattern on a polymeric substrate by:
       (1) creating a high resolution pattern on the starting substrate filled with a conductive material, coating the patterned conductive material on the starting substrate with a polymeric solution, drying the polymeric solution in a manner effective to promote adherence of the patterned conductive material to the dried polymeric layer, and peeling the dried polymeric layer and adhered conductive material from the starting substrate to transfer the dried conductive material in the high resolution pattern from the starting substrate to the dried polymeric layer;
       (2) wherein the conductive material on the starting substrate comprises:
          (i) forming a conductive solution of graphene nano-flakes in concentrations in the range of 20 to 100 mg/mL in 70% alcohol;
          (ii) thermally annealing the conductive solution at ~75 degrees C. or higher for more than three hours;
          (iii) filling the annealed conductive solution on the Teflon, glass, or silicon-wafer based substrate with pattern; and
          (iv) drying in place the filled annealed conductive solution on the patterned substrate.

11. A method of fabrication of high resolution conductive patterns on polymeric substrates comprising:
    a. forming a high resolution pattern with 3D features in a starting substrate;
    b. forming an end product comprising a combination of a high-resolution conductive pattern based on the high resolution pattern on a polymeric substrate by:
       (1) creating a high resolution pattern on the starting substrate filled with a conductive material, coating the patterned conductive material on the starting substrate with a polymeric solution, drying the polymeric solution in a manner effective to promote adherence of the patterned conductive material to the dried polymeric layer, and peeling the dried polymeric layer and adhered conductive material from the starting substrate to transfer the dried conductive material in the high resolution pattern from the starting substrate to the dried polymeric layer;

(2) wherein the peeling of the dried thin target polymer film comprises:
  (i) peeling the target polymer film effective to overcome any adhesive force between conductive material and the starting substrate; but
  (ii) keeping intact the high resolution pattern of the conductive material and the thin polymer film to effectively transfer the high resolution pattern of conductive material from the starting substrate to the polymer film substrate.

* * * * *